US010930895B2

(12) United States Patent
Shin et al.

(10) Patent No.: US 10,930,895 B2
(45) Date of Patent: Feb. 23, 2021

(54) DISPLAY DEVICE AND METHOD FOR MANUFACTURING THE SAME

(71) Applicant: SAMSUNG DISPLAY CO., LTD., Yongin-si (KR)

(72) Inventors: Hee Kyun Shin, Yongin-si (KR); Seung Jun Moon, Yongin-si (KR); Byung Hoon Kang, Yongin-si (KR); Min Woo Lee, Yongin-si (KR); Woo Jin Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/967,750

(22) Filed: May 1, 2018

(65) Prior Publication Data
US 2019/0140216 A1    May 9, 2019

(30) Foreign Application Priority Data

Nov. 9, 2017  (KR) .......................... 10-2017-0148541

(51) Int. Cl.
| | | |
|---|---|---|
| *H01L 51/56* | (2006.01) | |
| *B32B 7/12* | (2006.01) | |
| *B32B 5/16* | (2006.01) | |
| *H01L 51/00* | (2006.01) | |

(Continued)

(52) U.S. Cl.
CPC .............. *H01L 51/56* (2013.01); *B32B 5/16* (2013.01); *B32B 7/12* (2013.01); *H01L 51/003* (2013.01); *H01L 51/0097* (2013.01); *B32B 2264/102* (2013.01); *B32B 2457/206* (2013.01); *H01L 27/3244* (2013.01); *H01L 51/5256* (2013.01);

(Continued)

(58) Field of Classification Search
CPC ... H01L 51/56; H01L 51/003; H01L 51/0097; H01L 2251/5338; H01L 27/3244; H01L 2227/323; H01L 51/5256; B32B 5/16; B32B 7/12
See application file for complete search history.

(56) References Cited

U.S. PATENT DOCUMENTS

2006/0273005 A1* 12/2006 Love ................... B01D 39/2034
                                                    210/510.1
2013/0149513 A1*  6/2013 Nagayama .......... H01L 51/5256
                                                    428/212

(Continued)

FOREIGN PATENT DOCUMENTS

GB         2522626  A  *  8/2015  ......... H01L 51/5253
GB         2522626  A      8/2015

(Continued)

OTHER PUBLICATIONS

Extended European Search Report dated Feb. 22, 2019 for corresponding EP18185382.1.

*Primary Examiner* — Charles D Garber
*Assistant Examiner* — S M Sohel Imtiaz
(74) *Attorney, Agent, or Firm* — Kile Park Reed & Houtteman PLLC

(57) ABSTRACT

A display device includes a base, a light emitting device on a first surface of the base, and a plate-like inorganic layer on a second surface of the base, the plate-like inorganic layer including a first plate-like inorganic particle with a first size and a second plate-like inorganic particle with a second size different from the first size.

16 Claims, 51 Drawing Sheets

(51) Int. Cl.
 *H01L 51/52* (2006.01)
 *H01L 27/32* (2006.01)
(52) U.S. Cl.
 CPC .. *H01L 2227/323* (2013.01); *H01L 2227/326* (2013.01); *H01L 2251/5338* (2013.01)

(56) References Cited

U.S. PATENT DOCUMENTS

| | | | |
|---|---|---|---|
| 2013/0281575 A1* | 10/2013 | Ji | C08K 5/057 523/455 |
| 2014/0256206 A1 | 9/2014 | Kim | |
| 2014/0312314 A1* | 10/2014 | Khachatryan | H01L 51/003 257/40 |
| 2015/0021631 A1 | 1/2015 | Huh et al. | |
| 2015/0195915 A1* | 7/2015 | Namkung | B32B 37/26 361/750 |

FOREIGN PATENT DOCUMENTS

| | | |
|---|---|---|
| KR | 10-2015-0009289 A | 1/2015 |
| KR | 10-2015-0029045 A | 3/2015 |
| KR | 10-1530378 B1 | 6/2015 |
| WO | WO 2008/057045 A1 | 5/2008 |

\* cited by examiner

DISPLAY DEVICE AND METHOD FOR MANUFACTURING THE SAME

Korean Patent Application No. 10-2017-0148541, filed on Nov. 9, 2017, in the Korean Intellectual Property Office, and entitled: "Display Device and Method for Manufacturing the Same," is incorporated by reference herein in its entirety.

BACKGROUND

1. Field

The present disclosure relates to a display device and a method of manufacturing the same.

2. Description of the Related Art

Along with the development of multimedia, display devices are increasing in importance. In response to this, various display devices, e.g., liquid crystal displays (LCD) and organic light emitting diode (OLED) displays, have been developed.

For example, an OLED display may include a base and an organic light emitting diode, i.e., an organic light emitting device, disposed on the base. An organic light emitting device may include two opposing electrodes and an organic light emitting layer disposed therebetween. An electron and a hole provided from the two electrodes may be recombined with each other in the organic light emitting layer to generate an exciton, and the generated exciton may change from an excited state to a ground state to emit light.

Display devices may include flexible display devices. In order for a display device to have flexibility, a base that supports a light emitting device should also have flexibility.

SUMMARY

According to an exemplary embodiment, there is provided a display device. The display device includes a base, a light emitting device disposed on one surface of the base, and a plate-like inorganic layer disposed on the other surface of the base, wherein the plate-like inorganic layer includes a first plate-like inorganic particle with a first size and a second plate-like inorganic particle with a second size different from the first size.

In an exemplary embodiment, the first plate-like inorganic particle and the second plate-like inorganic particle may be positioned in the same layer, and wherein the second size may be greater than or equal to six times the first size.

In an exemplary embodiment, the first size may be less than or equal to 8.0 µm, and the second size may range from 20.0 µm to 50.0 µm.

In an exemplary embodiment, the plate-like inorganic layer may include a first plate-like inorganic layer directly disposed on the other surface of the base and including the first plate-like inorganic particle, and a second plate-like inorganic layer directly disposed on the first plate-like inorganic layer and including the second plate-like inorganic particle.

In an exemplary embodiment, the first plate-like inorganic particle may be a plate-like inorganic particle that contains carbon atoms, hydrogen atoms, and oxygen atoms and does not contain nitrogen atoms, and the second plate-like inorganic particle may be a graphene oxide particle that contains carbon atoms and hydrogen atoms and further contains nitrogen atoms.

In an exemplary embodiment, the carbon atoms, hydrogen atoms, and oxygen atoms of the first plate-like inorganic particle may form one or more of a hydroxyl group, a carboxyl group, and an epoxy group, and the carbon atoms, hydrogen atoms, and nitrogen atoms of the second plate-like inorganic particle may form an amine group.

In an exemplary embodiment, the first plate-like inorganic layer may further include a third plate-like inorganic particle that contains carbon atoms, hydrogen atoms, and oxygen atoms and does not contain nitrogen atoms and that has a third size different from the first size.

In an exemplary embodiment, the second plate-like inorganic layer may further include a fourth plate-like inorganic particle that contains carbon atoms and hydrogen atoms and further contains nitrogen atoms and that has a fourth size different from the second size.

In an exemplary embodiment, the third size may be greater than or equal to six times the first size, and the second size may be greater than or equal to six times the fourth size.

In an exemplary embodiment, the plate-like inorganic layer may include a first plate-like inorganic layer directly disposed on the other surface of the base and including a first plate-like inorganic particle, a second plate-like inorganic layer directly disposed on the first plate-like inorganic layer and including a second plate-like inorganic particle with a different type from that of the first plate-like inorganic particle, a third plate-like inorganic layer directly disposed on the second plate-like inorganic layer and including a third plate-like inorganic particle with the substantially same type as that of the first plate-like inorganic particle, and a fourth plate-like inorganic layer directly disposed on the third plate-like inorganic layer and including a fourth plate-like inorganic particle with the substantially same type as that of the second plate-like inorganic particle.

In an exemplary embodiment, the display device may further include an adhesive layer directly disposed on the plate-like inorganic layer, wherein the plate-like inorganic layer may be only partially disposed on the other surface of the base to partially expose the other surface of the base, and wherein the adhesive layer may be in contact with the other surface of the base.

In an exemplary embodiment, the display device may further include an encapsulation layer disposed on the light emitting device and including one or more inorganic layers and one or more organic layers that are alternately stacked, and a functional sheet disposed on the adhesive layer, wherein the functional sheet may include one or more of a shading sheet, a cushion sheet, and a metal sheet.

In an exemplary embodiment, a display region where an image is displayed and a non-display region where an image is not displayed and that surrounds the display region may be defined in the display device, and wherein the plate-like inorganic layer may be positioned in the display region and the non-display region.

According to another exemplary embodiment, there is provided a display device. The display device includes a base, a light emitting device disposed on one surface of the base, and a plate-like inorganic layer disposed on the other surface of the base and including a first graphene oxide particle that contains carbon atoms, hydrogen atoms, and nitrogen atoms.

In an exemplary embodiment, the plate-like inorganic layer may further include a second graphene oxide particle that contains carbon atoms, hydrogen atoms, and oxygen atoms and does not contain nitrogen atoms.

In an exemplary embodiment, the first graphene oxide particle and the second graphene oxide particle may have the substantially same size.

In an exemplary embodiment, the plate-like inorganic layer may further include a plate-like silicate particle.

According to an exemplary embodiment, there is provided a method of manufacturing a display device. The method includes forming a first temporary adhesive layer including a first plate-like inorganic particle on a carrier substrate and having a first charge, forming a second temporary adhesive layer including a second plate-like inorganic particle on the first temporary adhesive layer and having a second charge opposite to the first charge, forming a base on the second temporary adhesive layer, and forming a light emitting device on the base.

In an exemplary embodiment, the first temporary adhesive layer may further include a third plate-like inorganic particle having a greater size than the first plate-like inorganic particle, and wherein the size of the third plate-like inorganic particle may be greater than or equal to six times the size of the first plate-like inorganic particle.

In an exemplary embodiment, the second plate-like inorganic particle may have a greater size than the first plate-like inorganic particle.

In an exemplary embodiment, the first plate-like inorganic particle may be a graphene oxide particle that contains carbon atoms, hydrogen atoms, and nitrogen atoms.

In an exemplary embodiment, the second plate-like inorganic particle may be either a graphene oxide particle that contains carbon atoms, hydrogen atoms, and oxygen atoms and does not contain nitrogen atoms or a plate-like silicate particle.

In an exemplary embodiment, the method may further include heat-treating the first temporary adhesive layer and the second temporary adhesive layer after the formation of a second temporary adhesive layer and before the formation of a base, wherein in the formation of a base, each of the first temporary adhesive layer and the second temporary adhesive layer may be unpolarized.

In an exemplary embodiment, in the formation of a base, the base may be formed to be in contact with the carrier substrate to cover side surfaces of the first temporary adhesive layer and the second temporary adhesive layer.

In an exemplary embodiment, the method may further include forming an encapsulation layer on the light emitting device, and lifting off the carrier substrate after forming the encapsulation layer.

In an exemplary embodiment, the formation of the carrier substrate may include partially cutting an edge of the base to partially expose the first temporary adhesive layer and the second adhesive layer, and mechanically lifting off the carrier substrate after exposing the first temporary adhesive layer and the second temporary adhesive layer.

In an exemplary embodiment, after the first temporary adhesive layer and the second temporary adhesive layer are exposed, an adhesive force between the carrier substrate and the base may be less than or equal to 5.0 gf/in.

In an exemplary embodiment, the base may be directly formed on the second temporary adhesive layer, and wherein an extent to which the first plate-like inorganic particle and the second plate-like inorganic particle covers the base overlapping with the first temporary adhesive layer and the second temporary adhesive layer may be greater than or equal to 95.0%.

In an exemplary embodiment, the method may further include forming a driving element layer between the base and the light emitting device after the formation of a base and before the formation of a light emitting device, wherein the formation of a driving element layer may include performing heat treatment at or over a temperature of 450° C.

In an exemplary embodiment, the method may further include, after mechanically lifting off the carrier substrate: partially removing the first temporary adhesive layer or the second temporary adhesive layer to partially expose the base, and interposing an adhesive layer to position a functional sheet on the base.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
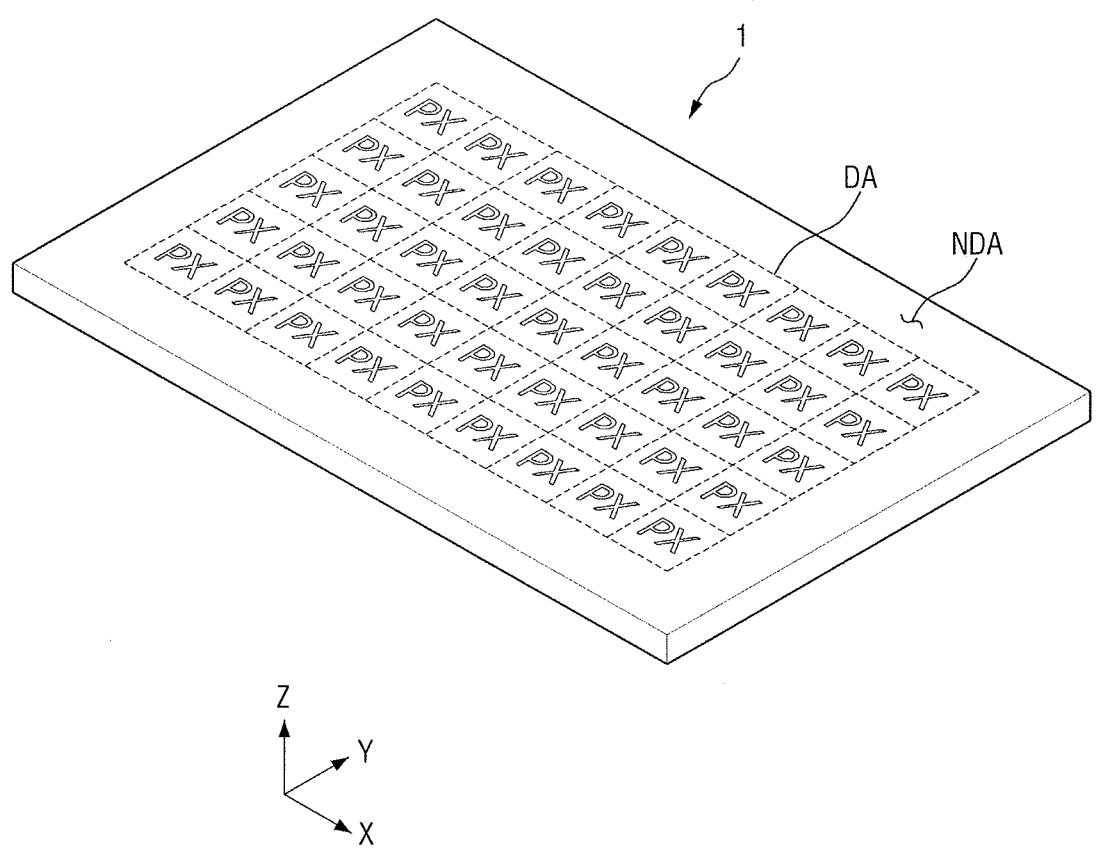
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element or layer is referred to as being "on," "connected to" or "coupled to" another element or layer, the element or layer can be directly on, connected or coupled to another element or layer, or intervening elements or layers may be present. In contrast, when an element is referred to as being "directly on," "directly connected to," or "directly coupled to" another element or layer, there are no intervening elements or layers present. As used herein, connected may refer to elements being physically, electrically and/or fluidly connected to each other. In addition, it will also be understood that when a layer is referred to as being "between" two layers, it can be the only layer between the two layers, or one or more intervening layers may also be present.

Like reference numerals refer to like elements throughout. As used herein, the term "and/or" includes any and all combinations of one or more of the associated listed items.

It will also be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the embodiments.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

In this description, a first direction X is any one direction in a plane, a second direction Y is a direction intersecting the first direction X in the plane, and a third direction Z is a direction perpendicular to the plane.

Hereinafter, embodiments of the present disclosure will be described with reference to the accompanying drawings.

FIG. 1 is a perspective view of a display device according to an embodiment of the present disclosure.

Referring to FIG. 1, a display device 1 according to this embodiment may include a display area DA and a non-display area NDA. The display area DA may be an area that includes a plurality of pixels PX and contributes to actual image display. In this description, pixels are areas that are defined by partitioning the display area DA in order to display colors in the viewing plane, and a single pixel is a single area that is a minimum unit for representing a color, independently of other pixels. That is, each pixel PX may uniquely display one of predetermined primary colors in order to implement color display. Examples of the primary colors may be red, green, and blue, but the present disclosure is not limited thereto. A plurality of pixels PX may be arranged in the first direction X and the second direction Y and arranged substantially in the shape of a matrix when viewed from the top. In this description, the term "plane" refers to a plane to which the first direction X and the second direction Y belong, unless defined otherwise.

The display area DA may be surrounded by the non-display area NDA when viewed from the top, e.g., the non-display area NDA may completely surround a perimeter of the display area DA. Elements necessary for driving the display device 1 may be positioned in the non-display area NDA. For example, a plurality of pads may be positioned in the non-display area NDA. The pads may be electrically connected with external driving circuit elements, e.g., a printed circuit board, a chip-on-film package, or the like. The pads and the driving circuit elements may be electrically connected with each other by interposing an anisotropic conductive film, an anisotropic conductive adhesive, or an anisotropic conductive paste therebetween. In some embodiments, a portion of the non-display area NDA, e.g., at least a portion of the non-display area NDA in which the pads are positioned, may be bent.

Figure 2:
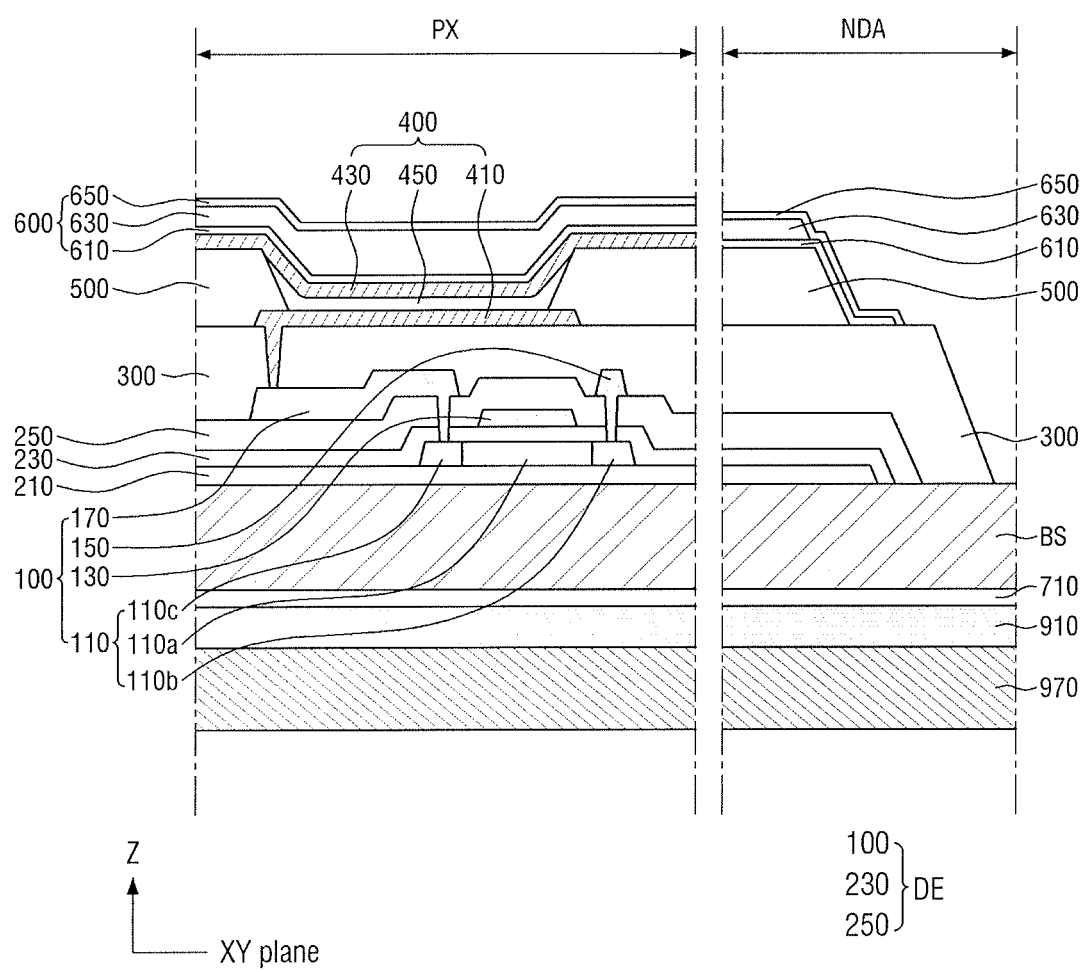
FIG. 2 illustrates a sectional view of a display area and a non-display area of the display device of FIG. 1.

The display device 1 according to this embodiment will be further described below with reference to FIG. 2. FIG. 2 is a sectional view showing the display area DA (i.e., a pixel PX) and the non-display area NDA of the display device 1 of FIG. 1.

Referring to FIGS. 1 and 2, the display device 1 may be an organic light emitting diode (OLED) display device including a light emitting device 400 disposed in each pixel PX, e.g., the light emitting device 400 may be an organic light emitting diode (OLED). A case in which the display device 1 is an OLED display device will be described below as an example, but the present disclosure is not limited thereto. For example, the display device 1 may be a liquid crystal display device, an electrophoretic display, or the like.

In an example embodiment, the display device 1 may include a base BS, a driving element layer DE, and the light emitting device 400. The display device 1 may further include a plate-like inorganic layer 710.

In detail, the base BS may be a transparent or opaque insulating substrate or an insulating film, e.g., the base BS may be a flexible substrate supporting the driving element layer DE and the light emitting device 400. For example, the base BS may be made of a glass material, a quartz material, or the like, or may contain a flexible polymeric material, e.g., polyimide, polycarbonate, polyethylene terephthalate, or polyacrylate.

A buffer layer 210 may be disposed on a first surface (an upper surface in FIG. 2) of the base BS. The buffer layer 210 may protect the base BS and prevent impurities such as moisture or air from penetrating and damaging the light emitting device 400. Also, the buffer layer 210 may prevent the base BS from being damaged while an active layer 110 to be described below is manufactured. The buffer layer 210 may be made of an inorganic material, e.g., silicon nitride ($SiN_x$), silicon oxide ($SiO_x$), silicon nitride oxide ($SiN_xO_y$), or silicon oxynitride ($SiO_xN_y$). In some embodiments, the buffer layer 210 may be disposed over the display area DA and the non-display area NDA. In this description, the meaning of "being disposed over a plurality of areas" is to be disposed over a space provided by the plurality of areas. According to another embodiment, the buffer layer 210 may be omitted.

For example, the driving element layer DE including a thin-film transistor 100, auxiliary electrodes, wires, and a plurality of insulating layers 230 and 250 may be disposed on the buffer layer 210. In another example, the driving element layer DE may be disposed directly on the base BS.

The thin-film transistor 100 may be a driving transistor configured to control the amount of current flowing through a channel region 110a in the active layer 110 according to a signal applied to a control terminal in order to control the amount of light emitted by the light emitting device 400 in a specific pixel. For example, the thin-film transistor 100 may include a gate electrode 130, which is the control terminal, a drain electrode 150, which is an input terminal, a source electrode 170, which is an output terminal, and the active layer 110, which forms a channel. FIG. 2 illustrates a top-gate-type thin-film transistor positioned over the active layer 110, but the present disclosure is not limited thereto.

The active layer 110 may be disposed on the buffer layer 210. The active layer 110 may contain a semiconductor material. For example, the active layer 110 may contain polycrystalline silicon. In another embodiment, the active layer 110 may contain monocrystalline silicon or amorphous silicon or may contain a non-silicone-based semiconductor material such as an oxide semiconductor.

The active layer 110 may include the channel region 110a, a drain region 110b, and a source region 110c. The channel region 110a may be an area having a path (i.e., a channel) through which electrons or holes may move depending on voltage applied to the gate electrode 130, which is the control terminal. That is, electrons or holes provided through the drain region 110b may move toward the source region 110c through the channel region 110a, or electrons or holes provided through the source region 110c may move toward the drain region 110b through the channel region 110a.

The drain region 110b and the source region 110c may be spaced apart, and the channel region 110a may be disposed therebetween. For example, the drain region 110b and the source region 110c may be partially conducted by being processed with plasma or doped with ionic impurities. The drain region 110b may be electrically connected with the drain electrode 150 to be described below, and the source region 110c may be electrically connected with the source electrode 170 to be described below. In this description, the meaning of "being electrically connected" includes a case in which two conductive elements conduct in direct contact with each other, a case in which a conductive device is interposed between two elements so that the elements conduct, or a case in which one or more switching devices such as a thin-film transistor are interposed between two elements so that the elements conduct as necessary.

The gate electrode 130 may be disposed on the active layer 110. The gate electrode 130 may be disposed to at least partially overlap with the channel region 110a of the active layer 110 in the third direction Z. The gate electrode 130 may contain, e.g., aluminum (Al), molybdenum (Mo), copper (Cu), or an alloy thereof. The gate electrode 130 may be electrically connected with an output electrode of a switching transistor for controlling turning on/off of a specific pixel. The control terminal and the input terminal of the switching transistor may be electrically connected with scanning signal lines and data signal lines, and the switching transistor may be configured to turn on/off an output terminal according to a signal applied to the control terminal.

A first insulating layer 230 may be interposed between the active layer 110 and the gate electrode 130 to insulate the active layer 110 from the gate electrode 130. The first insulating layer 230 may be made of an inorganic insulating material, e.g., silicon nitride, silicon oxide, silicon nitride oxide, or silicon oxynitride. In some embodiments, the first insulating layer 230 may cover a side surface of the buffer layer 210 in the non-display area NDA.

The second insulating layer 250 may be disposed on the gate electrode 130. The second insulating layer 250 may insulate the gate electrode 130 from elements disposed thereabove. In some embodiments, the second insulating layer 250 may be a multi-layered structure having a plurality of insulating layers. The second insulating layer 250 may contain an inorganic insulating material, e.g., silicon nitride, silicon oxide, silicon nitride oxide, or silicon oxynitride. In some embodiments, the second insulating layer 250 may cover a side surface of the first insulating layer 230 in the non-display area NDA.

At least one through-hole through which at least a portion of the active layer 110 is exposed may be formed in the first insulating layer 230 and the second insulating layer 250. For example, first and second through-holes may expose at least a portion of the drain region 110b and at least a portion of the source region 110c of the active layer 110, respectively, through the first insulating layer 230 and the second insulating layer 250.

The drain electrode 150 and the source electrode 170 may be disposed on the second insulating layer 250. The drain electrode 150 and the source electrode 170 may be inserted into corresponding through-holes and brought into contact with the drain region 110b and the source region 110c of the active layer 110, respectively. Also, the drain electrode 150 may be electrically connected with a driving voltage line, and the source electrode 170 may be electrically connected with an anode electrode 410 of the light emitting device 400.

A planarization layer 300 may be disposed on the driving element layer DE. The planarization layer 300 may protect the elements included in the driving element layer DE disposed on the base BS, e.g., the thin-film transistor 100, the auxiliary electrodes, and/or the wires, or may minimize a step height formed by the elements in the driving element layer DE. The planarization layer 300 may provide a space in which the light emitting device 400 is stably disposed. The planarization layer 300 may be formed as a single-layered structure or a multi-layered structure. The material of the planarization layer 300 is not especially limited as long as the material has isolation and planarization characteristics. For example, the planarization layer 300 may contain an inorganic insulating material or an organic material, e.g., an acrylic resin, an epoxy resin, an imide resin, a cardo resin, or an ester resin. In some embodiments, the planarization layer 300 may cover a side surface of the second insulating layer 250 in the non-display area NDA.

The light emitting device 400 may be disposed on the planarization layer 300. In an example embodiment, the light emitting device 400 may be an organic light emitting device including an anode electrode 410 and a cathode electrode 430 that are opposite to each other, and an organic light emitting layer 450 disposed therebetween.

First, the anode electrode 410 may be disposed on the planarization layer 300. The anode electrode 410 may be electrically connected with the source electrode 170 through a through-hole passing through the planarization layer 300. The anode electrode 410 may contain a material with a work function greater than that of the cathode electrode 430. The anode electrode 410 may be a transparent electrode, an opaque electrode, or a multi-layered structure thereof. Examples of a material of which the transparent electrode is formed may include indium tin oxide (ITO), indium zinc oxide (IZO), zinc oxide, indium oxide, and so on, and examples of a material of which the opaque electrode is formed may include lithium (Li), aluminum (Al), magnesium (Mg), silver (Ag), nickel (Ni), and so on. The anode electrode 410 may be a pixel electrode that is disposed in each pixel PX in the display area DA and configured to receive an independent driving signal.

The cathode electrode 430 may be disposed on the anode electrode 410. For example, the cathode electrode 430 may be spaced apart from and overlapped with the anode electrode 410 in the third direction Z. The cathode electrode 430 may contain a material with a work function smaller than that of the anode electrode 410. Like the anode electrode 410, the cathode electrode 430 may be a transparent electrode, an opaque electrode, or a multi-layered structure thereof. The cathode electrode 430 may be disposed without distinction of the pixels PX.

The organic light emitting layer 450 may be interposed between the anode electrode 410 and the cathode electrode 430. The organic light emitting layer 450 may recombine holes and electrons delivered from the anode electrode 410 and the cathode electrode 430 to generate light. A hole and an electron are recombined in the organic light emitting layer 450 to form an exciton, and the exciton may change from an excited state to a ground state to emit light. The organic light emitting layer 450 may emit light having one of primary colors of the display device 1.

For example, the organic light emitting layer 450 may exhibit phosphorescence of, exhibit fluorescence of, or emit blue light having a peak wavelength ranging from about 430 nm to about 470 nm, green light having a peak wavelength ranging from about 530 nm to about 570 nm, or red light having a peak wavelength ranging from about 610 nm to about 650 nm. In another embodiment, the organic light emitting layer 450 may emit white light including all of a blue wavelength band, a green wavelength band, and a red wavelength band. Although not shown, a hole control area, e.g., a hole injection layer, a hole transport layer, and a hole blocking layer, and/or an electron control area, e.g., an electron injection layer, an electron transport layer, and an electron blocking layer are interposed between the organic light emitting layer 450 and the anode electrode 410 or between the organic light emitting layer 450 and the cathode electrode 430, and thus, it is possible to improve light emission efficiency of the light emitting device 400.

In some embodiments, a pixel defining film 500 may be disposed on the anode electrode 410. The pixel defining film 500 may serve to distinguish between the pixels PX in the display area DA. The pixel defining film 500 may be disposed to have an opening for partially exposing the surface of the anode electrode 410. That is, when viewed from the top, the pixel defining film 500 may have an opening for exposing at least a portion of the anode electrode 410, which is disposed in each of the pixels PX. The aforementioned organic light emitting layer 450 and cathode electrode 430 may be disposed on the pixel defining film 500. The pixel defining film 500 may contain an organic material, e.g., an acrylic resin, an epoxy resin, an imide resin, or an ester resin. The pixel defining film 500 may be partially disposed in the non-display area NDA, but the present disclosure is not limited thereto.

An encapsulation layer 600 may be disposed on the light emitting device 400. The encapsulation layer 600 may prevent impurities, e.g. moisture or air outside the display device 1, from penetrating and damaging the light emitting device 400. That is, the encapsulation layer 600 may be disposed to encapsulate the light emitting device 400. The encapsulation layer 600 may be disposed over the display area DA and the non-display area NDA.

The encapsulation layer 600 may be a thin-film encapsulation film including one or more organic encapsulation layers 630 and one or more inorganic encapsulation layers 610 and 650. For example, the encapsulation layer 600 may include organic encapsulation layers 630 and encapsulation layers 610 and 650 that are alternatively stacked. In an example embodiment, the encapsulation layer 600 may include a first inorganic encapsulation layer 610 disposed on the cathode electrode 430, an organic encapsulation layer 630 disposed on the first inorganic encapsulation layer 610, and a second inorganic encapsulation layer 650 disposed on the organic encapsulation layer 630.

The first inorganic encapsulation layer 610 may be directly disposed on the cathode electrode 430. In some embodiments, at least a portion of the first inorganic encapsulation layer 610 may be disposed in the non-display area NDA, may be configured to cover a side surface of the pixel defining film 500, and may be brought into contact with the planarization layer 300. The second inorganic encapsulation layer 650 may form a top layer of the encapsulation layer 600. The second inorganic encapsulation layer 650 may have a larger planar area than the first inorganic encapsulation layer 610. For example, at least a portion of the second inorganic encapsulation layer 650 may be disposed in the non-display area NDA, may be configured to cover side surfaces of the organic encapsulation layer 630, the first inorganic encapsulation layer 610, and the pixel defining film 500, and may be brought into contact with the planarization layer 300. The organic encapsulation layer 630 may be interposed between the first inorganic encapsulation layer 610 and the second inorganic encapsulation layer 650.

In some embodiments, the encapsulation layer 600 may include a siloxane-based encapsulation layer, e.g., hexamethyldisiloxane. FIG. 2 illustrates a case in which the encapsulation layer 600 has a triple-layered structure including the first inorganic encapsulation layer 610, the organic encapsulation layer 630, and the second inorganic encapsulation layer 650. However, the encapsulation layer 600 may have a double-layered structure or a quadruple-layered structure.

Although not shown, a touch unit and/or a window glass may be further disposed on the encapsulation layer 600. The touch unit may detect a touch signal caused by a touch operation of a user. The touch signal may include a position of the touch operation, a pressure amount of the touch operation, or the like. The window glass may protect the display device 1 and form an external appearance of the display device 1. Also, the window glass may form a display surface of the display device 1 on which an image is displayed. Also, the window glass may form a touch surface in which a touch operation of a user, i.e., a physical contact between the display device 1 and a user, is achieved.

Figure 3:
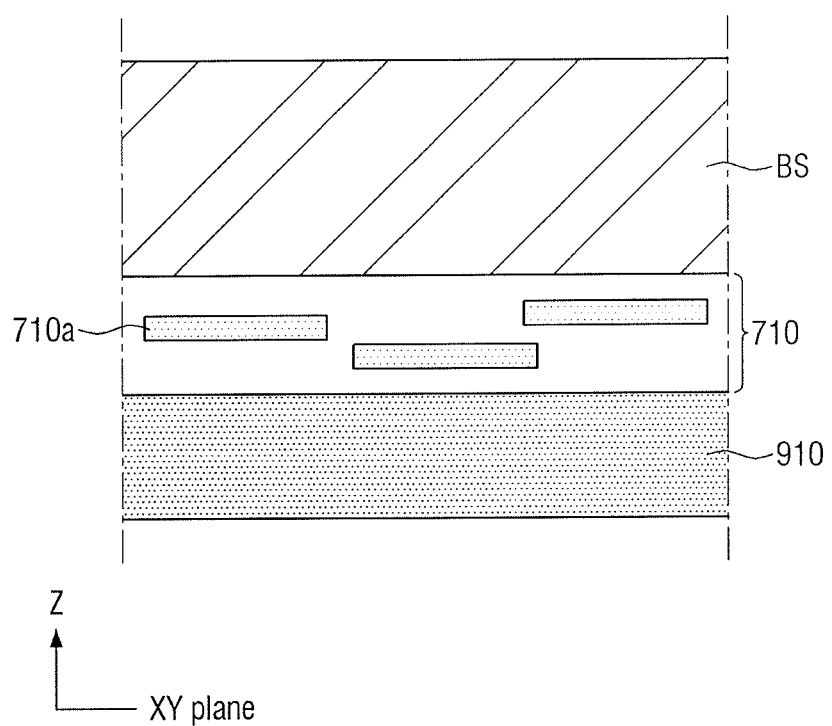
FIG. 3 illustrates an enlarged schematic diagram of a plate-like inorganic layer of FIG. 2.
Figure 4:
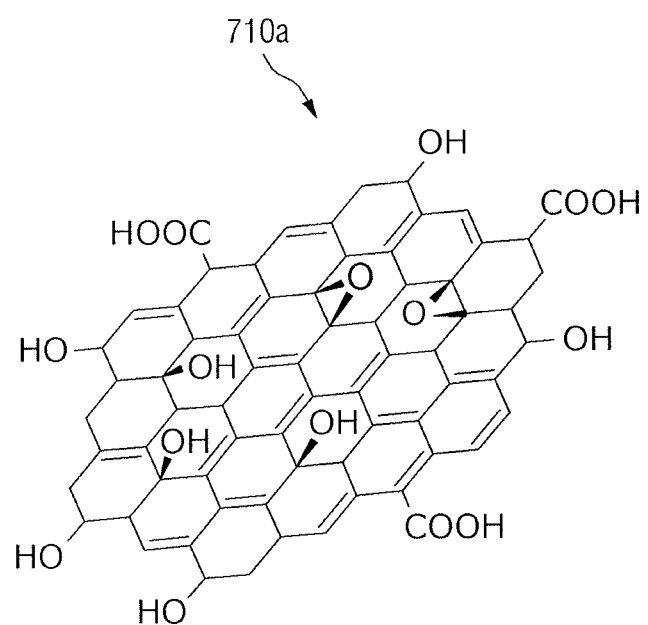
FIG. 4 illustrates a chemical structure of a plate-like inorganic particle of FIG. 3.

The display device 1 according to this embodiment will be described in detail below with reference to FIGS. 3 and 4. FIG. 3 is an enlarged schematic diagram showing the plate-like inorganic layer of FIG. 2, and FIG. 4 shows an example chemical structure of a plate-like inorganic particle of FIG. 3.

Referring to FIGS. 1 to 4, a plate-like inorganic layer 710 may be disposed on a second surface (a lower surface in FIG. 2) of the base BS, e.g., the base BS may be between the buffer layer 210 and the plate-like inorganic layer 710. The plate-like inorganic layer 710 may be, e.g., continuously, disposed over the display area DA and also the non-display area NDA. The plate-like inorganic layer 710 may be directly disposed on the second surface of the base BS. e.g., the plate-like inorganic layer 710 may continuously cover the entire second surface of the base BS.

As illustrated in FIG. 3, the plate-like inorganic layer 710 may include, e.g., consist of, a plurality of plate-like inorganic particles 710a arranged on the second surface of the base BS, e.g., the plurality of plate-like inorganic particles 710a may be spaced apart from each other on the second surface of the base BS. The plate-like inorganic layer 710 may include plate-like inorganic particles 710a having a horizontal size (e.g., a width in the XY plane) greater than a vertical size (e.g., a thickness in the Z direction). The aspect ratio, which is the ratio of width to thickness, of the plate-like inorganic particles 710a is greater than or equal to about 50 or about 100, but the present disclosure is not limited thereto.

In an example embodiment, the plate-like inorganic particles 710a may include graphene oxide particles. For example, the plate-like inorganic layer 710 may be a graphene oxide particle layer containing graphene oxide particles. In this description, the terms "inorganic substance," "inorganic material," and "inorganic particle" include plate-like "graphene" composed of only carbon atoms, "graphene oxide" obtained by at least partially oxidizing the graphene, "reduced graphene oxide" obtained by at least partially reducing the oxidized graphene oxide, and a layered structure of the graphene, the graphene oxide, and/or the reduced graphene oxide.

Graphene oxide particles, i.e., carbon atoms, may be two-dimensionally arranged to form a plate-like particle or a thin section. The plate-like inorganic particles 710a may include graphene oxide particles that contain carbon atoms, hydrogen atoms, and oxygen atoms but do not contain nitrogen atoms. The carbon atoms, the hydrogen atoms, and the oxygen atoms of the graphene oxide particles may form one or more of a hydroxyl group (—OH), a carboxyl group (—COOH), and an epoxy group (C—O—C). In a non-limiting example, the plate-like inorganic particles 710a according to this embodiment may be graphene oxide particles, as shown in FIG. 4. The plate-like inorganic layer 710 and the plate-like inorganic particles 710a may have no polarity and be substantially neutral. It is possible to prevent internal elements of the display device 1 from being damaged by polar charges by allowing the plate-like inorganic layer 710 and the plate-like inorganic particles 710a to have no polarity and to be neutral.

Referring to FIG. 3, the horizontal size (e.g., a maximum horizontal particle diameter in the XY plane) of the plate-like inorganic particles 710a may have a lower limit of about 0.5 μm, 0.6 μm, 0.7 μm, 0.8 μm, 0.9 μm, or 1.0 μm. When the lower limit of the size of the plate-like inorganic particles 710a is greater than 0.5 μm, it is possible to maintain a stable plate-like particle structure and also possible to form a van der Waals force in the third direction Z to maintain a bond between the plate-like inorganic layer 710 and the base BS. The horizontal size of the plate-like inorganic particles 710a, may have an upper limit of, e.g., about 1,000 μm, 500 μm, 100 μm, 50 μm, 40 μm, 30 μm, or 20 μm. However, the upper limit is not especially limited.

FIG. 3 illustrates a case in which the plurality of plate-like inorganic particles 710a may overlap with one another in the horizontal direction, i.e., in a planar direction. However, in some embodiments, at least some of the plate-like inorganic particles 710a may overlap with one another in the third direction Z to form a layered structure. That is, each of the plate-like inorganic particles 710a themselves form a relatively strong bond such as a covalent bond, and the plate-like inorganic particles 710a adjacent to each other in the third direction Z and horizontally overlap with one another through a relatively weak bonding force such as a van der Waals force, etc. The plate-like inorganic layer 710 may have a thickness ranging from about 0.3 nm to about 5 nm in the third direction Z, but the present disclosure is not limited thereto.

The plate-like inorganic layer 710 containing the plate-like inorganic particles 710a may be understood as a temporary adhesive layer remaining on a rear surface of the base BS in a method of manufacturing the display device, but the present disclosure is not limited thereto. For example, the plate-like inorganic layer 710 containing the plate-like inorganic particles 710a may be a residual temporary adhesive layer that was negatively charged but has been neutralized. The plate-like inorganic layer 710 according to this embodiment may be formed of only the plate-like inorganic particles 710a, i.e., without an organic material such as a polymer material, but the present disclosure is not limited thereto.

In some embodiments, an adhesive layer 910 and a functional sheet 970 may be disposed on the plate-like inorganic layer 710. For example, the adhesive layer 910 may be between the plate-like inorganic layer 710 and the functional sheet 970.

The functional sheet 970 may be disposed over the display area DA and the non-display area NDA and may overlap with the plate-like inorganic layer 710 in the third direction Z. The functional sheet 970 may include one or more of a shading sheet, a cushion sheet, and a metal sheet. FIG. 2 illustrates the functional sheet 970 as having only one sheet. However, in another embodiment, the functional sheet 970 may include two or more sheets.

For example, the shading sheet may include a layered structure of a support layer and a shading pattern printing layer. The shading pattern may prevent the elements inside the display device 1 from being viewed from the top. The shading pattern printing layer may be a pattern layer that performs a shading function on all or a portion of the surface of the display device 1. Also, the cushion sheet may include a layered structure of a support layer and a cushion layer. The cushion sheet may protect the display device 1 by dispersing or at least partially absorbing an external impact. The material of the cushion layer is not especially limited as long as the material is favorable for impact absorption and/or dispersion. For example, the cushion layer may contain a urethane resin, a carbonate resin, a rubber-based resin, or a foamed product thereof. A metal sheet may enhance intensity of the display device 1, absorb and/or disperse at least a portion of heat generated by the display device 1, or shield electromagnetic waves generated by the display device 1.

The adhesive layer 910 may be disposed between the plate-like inorganic layer 710 and the functional sheet 970. The adhesive layer 910 may be brought into contact with the plate-like inorganic layer 710 and the functional sheet 970, and may bond the plate-like inorganic layer 710 and the functional sheet 970. The adhesive layer 910 may include an optical transparent adhesive, an optical transparent resin, or a pressure-sensitive adhesive. In some embodiments, an embossed pattern for inducing discharge of air or the like to prevent an air layer from being trapped may be formed on one surface (the upper surface in FIG. 2) facing the plate-like inorganic layer 710 of the adhesive layer 910.

A display device according to other embodiments of the present disclosure will be described below. However, descriptions of elements substantially the same as those of the display device 1 according to an embodiment of the present disclosure will be omitted, and the omitted descriptions can be clearly understood from the accompanying drawings by those skilled in the art.

Figure 5:
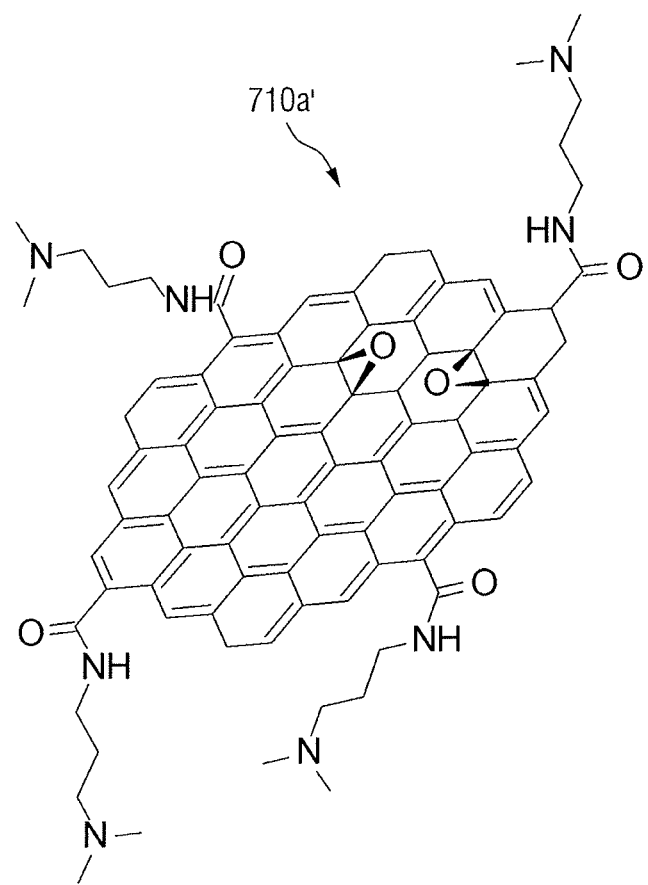
FIG. 5 illustrates a chemical structure of a plate-like inorganic particle of a plate-like inorganic layer of a display device according to another embodiment.

FIG. 5 shows a chemical structure of a plate-like inorganic particle of a plate-like inorganic layer of a display device according to another embodiment of the present disclosure.

Referring to FIG. 5, the plate-like inorganic layer of the display device according to this embodiment includes plate-like inorganic particles 710a', and the plate-like inorganic particles 710a' may include graphene oxide particles that contain carbon atoms and hydrogen atoms and further contain nitrogen atoms. The carbon atoms, the hydrogen atoms, and the nitrogen atoms of the graphene oxide particles may form an amine group. For example, the atoms may form one or more of a secondary amine group ($R_2NH$) and a tertiary amine group ($R_3N$). The plate-like inorganic layer and the plate-like inorganic particles 710a' may have no polarity and be substantially neutral. The plate-like inorganic layer containing the plate-like inorganic particles 710a' may be understood as a temporary adhesive layer remaining on the rear surface of the base BS in the method of manufacturing the display device, but the present disclosure is not limited thereto. For example, the plate-like inorganic layer containing the plate-like inorganic particles 710a may be a residual temporary adhesive layer that was positively charged but has been neutralized.

Figure 6:
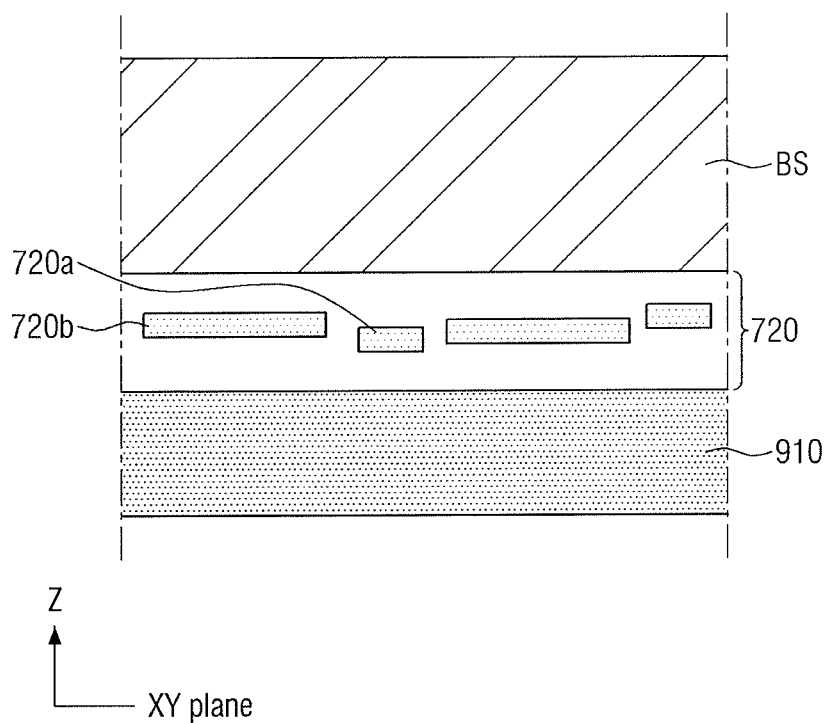
FIGS. 6 to 20 illustrate diagrams of a display device according to still other embodiments.

FIG. 6 is an enlarged schematic view showing a plate-like inorganic layer of a display device according to still another embodiment of the present disclosure.

Referring to FIG. 6, a plate-like inorganic layer 720 of the display device according to this embodiment may include plate-like inorganic particles 720a and 720b having different sizes. For example, the plate-like inorganic layer 720 may include a first plate-like inorganic particle 720a having a first size and a second plate-like inorganic particle 720b having a second size larger than the first size.

The first plate-like inorganic particle 720a and the second plate-like inorganic particle 720b may all include graphene oxide particles. In an example embodiment, the first plate-like inorganic particle 720a and the second plate-like inorganic particle 720b may be substantially the same kind of plate-like inorganic particle. For example, as shown in FIG. 4, the first plate-like inorganic particle 720a and the second plate-like inorganic particle 720b may include graphene oxide particles that contain carbon atoms, hydrogen atoms, and oxygen atoms but do not contain nitrogen atoms. As another example, as shown in FIG. 5, the first plate-like inorganic particle 720a and the second plate-like inorganic particle 720b may include graphene oxide particles that contain carbon atoms and hydrogen atoms and further contain nitrogen atoms. The plate-like inorganic layer 720, the first plate-like inorganic particle 720a, and the second plate-like inorganic particle 720b may have no polarity and be substantially neutral.

The size (e.g., the maximum horizontal particle diameter) of the second plate-like inorganic particle 720b may be greater than the size (e.g., the maximum horizontal particle diameter) of the first plate-like inorganic particle 720a. As a non-limiting example, when the plate-like inorganic layer 720 includes graphene oxide particles having various sizes, the sizes of the graphene oxide particles in the plate-like inorganic layer 720 may have a bimodal distribution with two peaks or a distribution with three or more peaks.

In an example embodiment, the horizontal size of the second plate-like inorganic particle 720b may have a lower limit of about 20 µm, 30 µm, or 40 µm. When the lower limit of the size of the second plate-like inorganic particle 720b is within the range, the second plate-like inorganic particle 720b may exhibit a stabilized arrangement along with the first plate-like inorganic particle 720a, which will be described below, thus increasing the extent to which the first plate-like inorganic particle 720a and the second plate-like inorganic particle 720b cover the base BS. The horizontal size of the second plate-like inorganic particle 720b may have an upper limit of about 1,000 µm, 500 µm, 100 µm, or 50 µm.

Also, the horizontal size of the first plate-like inorganic particle 720a may have an upper limit of about 8.0 µm, 6.0 µm, 5.0 µm, or 1.0 µm. When the upper limit of the size of the first plate-like inorganic particle 720a is within the range, the first plate-like inorganic particle 720a may exhibit a stabilized arrangement along with the second plate-like inorganic particle 720b. The horizontal size of the first plate-like inorganic particle 720a may have a lower limit of about 0.5 µm, 0.6 µm, 0.7 µm, 0.8 µm, or 0.9 µm.

Figure 7:
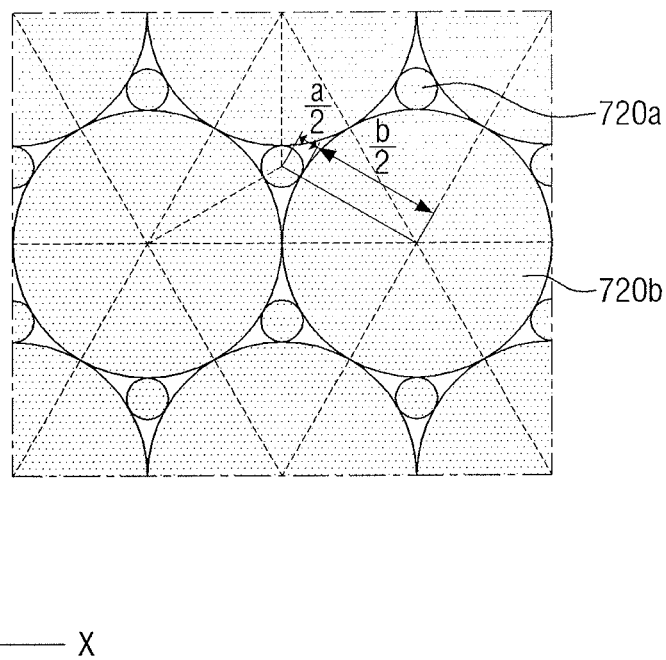

The sizes and arrangements of the first plate-like inorganic particle 720a and the second plate-like inorganic particle 720b according to this embodiment will be described in more detail with reference to FIG. 7. FIG. 7 is a schematic plan view showing an arrangement of the first plate-like inorganic particle and the second plate-like inorganic particle of FIG. 6.

Referring to FIGS. 6 and 7, the first plate-like inorganic particle 720a and the second plate-like inorganic particle 720b may be disposed in the same layer. For example, the first plate-like inorganic particle 720a and the second plate-like inorganic particle 720b overlap with one another in a horizontal direction, i.e., in the XY plane direction. A first plate-like inorganic particle 720a may be inserted into a void formed by adjacent second plate-like inorganic particles 720b. That is, it is possible for a first plate-like inorganic particle 720a and a second plate-like inorganic particle 720b to not overlap in the third direction Z. Also, any first plate-like inorganic particle 720a may be in direct contact with the base BS, and any second plate-like inorganic particle 720b may be in direct contact with the base BS. As a non-limiting example, the maximum horizontal size of the first plate-like inorganic particle 720a may be smaller than or equal to the size of the void defined by a plurality of, e.g., three, adjacent second plate-like inorganic particles 720b contacting each other.

In an example embodiment, the size b (i.e., the maximum horizontal particle diameter b) of the second plate-like inorganic particle 720b may be greater than or equal to about 6 times, 6.1 times, 6.2 times, 6.3 times, 6.4 times, or 6.5 times the size a (i.e., the maximum horizontal particle diameter a) of the first plate-like inorganic particle 720a. When the first plate-like inorganic particle 720a and the second plate-like inorganic particle 720b satisfy the above-described size range and have the above size relationship, the first plate-like inorganic particle 720a and the second plate-like inorganic particle 720b may exhibit a stable arrangement as shown in FIG. 7. Thus, it is possible to increase the extent to which the first plate-like inorganic particle 720a and the second plate-like inorganic particle 720b cover the base BS and also minimize an adhesive force between the base BS and a carrier substrate in the method of manufacturing the display device that will be described below.

The plate-like inorganic layer 720 including the first plate-like inorganic particle 720a and the second plate-like inorganic particle 720b may be understood as a residual temporary adhesive layer that was negatively charged but has been neutralized or a residual temporary adhesive layer that was positively charged but has been neutralized.

Figure 8:
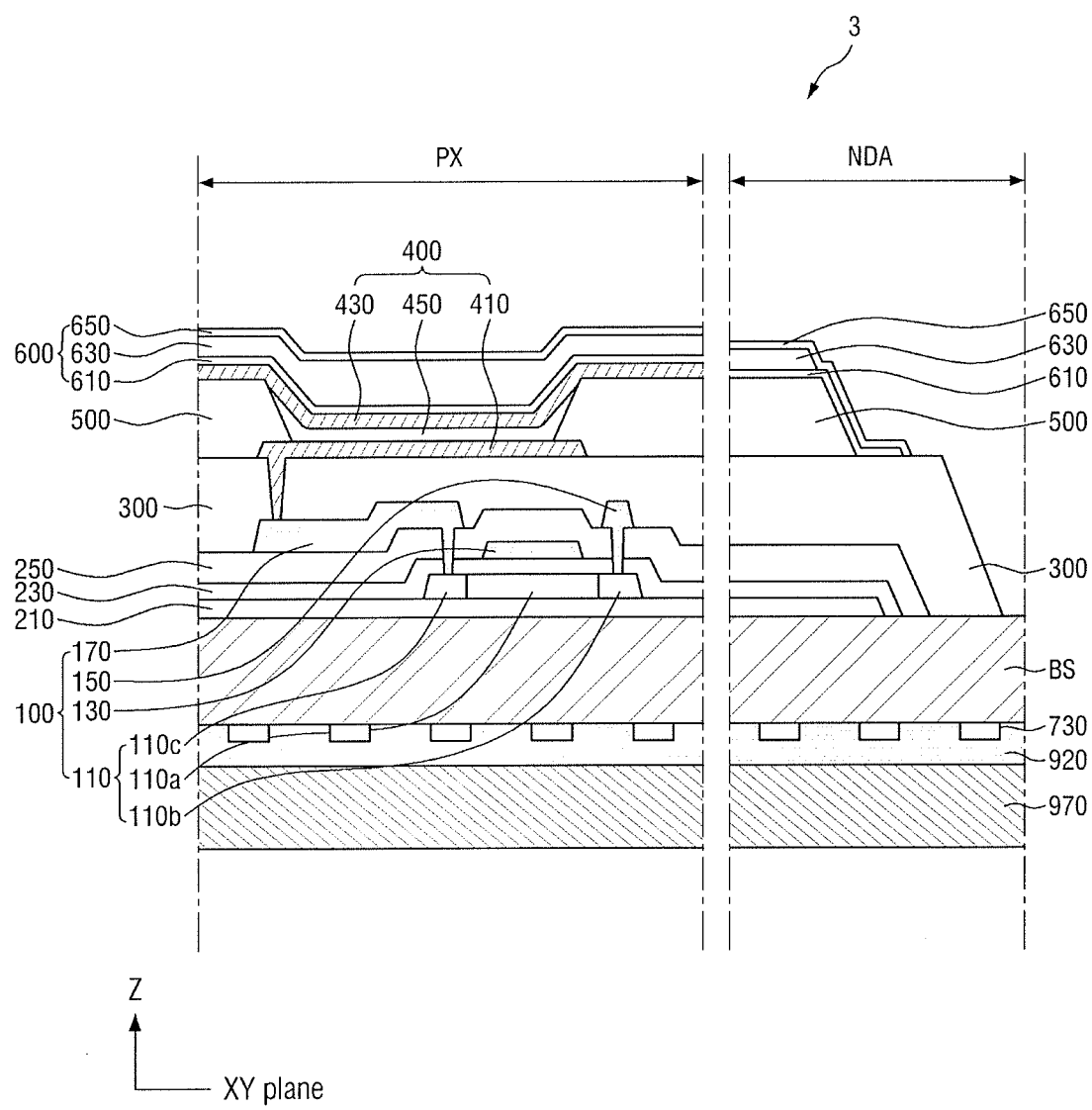
Figure 9:
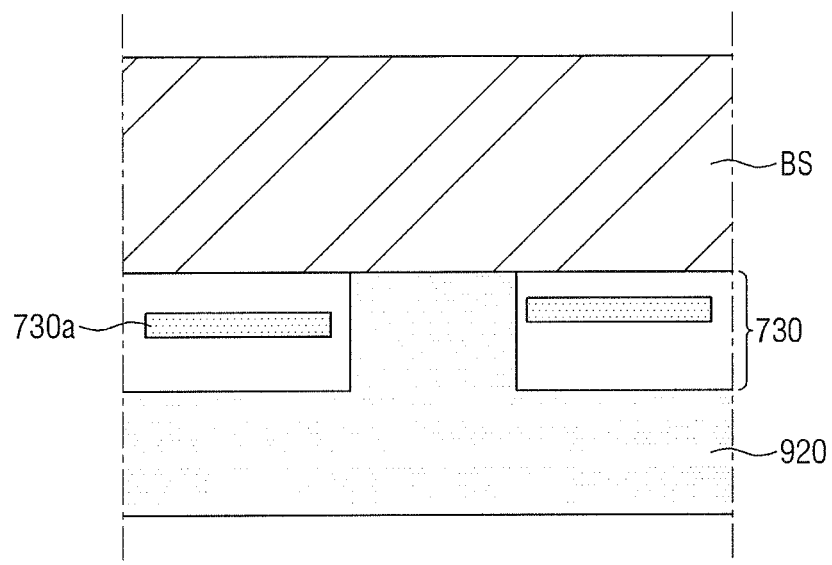

FIG. 8 is a sectional view of a display device according to still another embodiment of the present disclosure, and FIG. 9 is an enlarged schematic diagram of a plate-like inorganic layer of FIG. 8.

Referring to FIGS. 8 and 9, a display device 3 according to this embodiment is different from the display device 1 according to the embodiment of FIG. 2 or the like in that a plate-like inorganic layer 730 of the display device 3 is partially removed to partially expose the second surface (a lower surface in FIG. 8) of the base BS, e.g., the plate-like inorganic layer 730 may include a plurality of discrete segments that are spaced apart from each other along the second surface of the base BS.

In an example embodiment, the plate-like inorganic layer 730, which includes a plate-like inorganic particle 730a, may be disposed on the second surface of the base BS and be partially removed. That is, the plate-like inorganic layer 730 may be only partially disposed on the second surface of the base BS to partially expose the other surface of the base BS.

Also, the adhesive layer 920 may be brought into contact with the plate-like inorganic layer 730 and the base BS and further brought into contact with the second surface of the base BS. For example, the adhesive layer 920 may be positioned between plate-like inorganic layers 730 that are partially adjacent to each other.

In the display device 3 according to this embodiment, the plate-like inorganic layer 730 may be partially removed to directly bond the base BS and the adhesive layer 920. Accordingly, it is possible to improve the bond between the plate-like inorganic layer 730 and the base BS.

Figure 10:
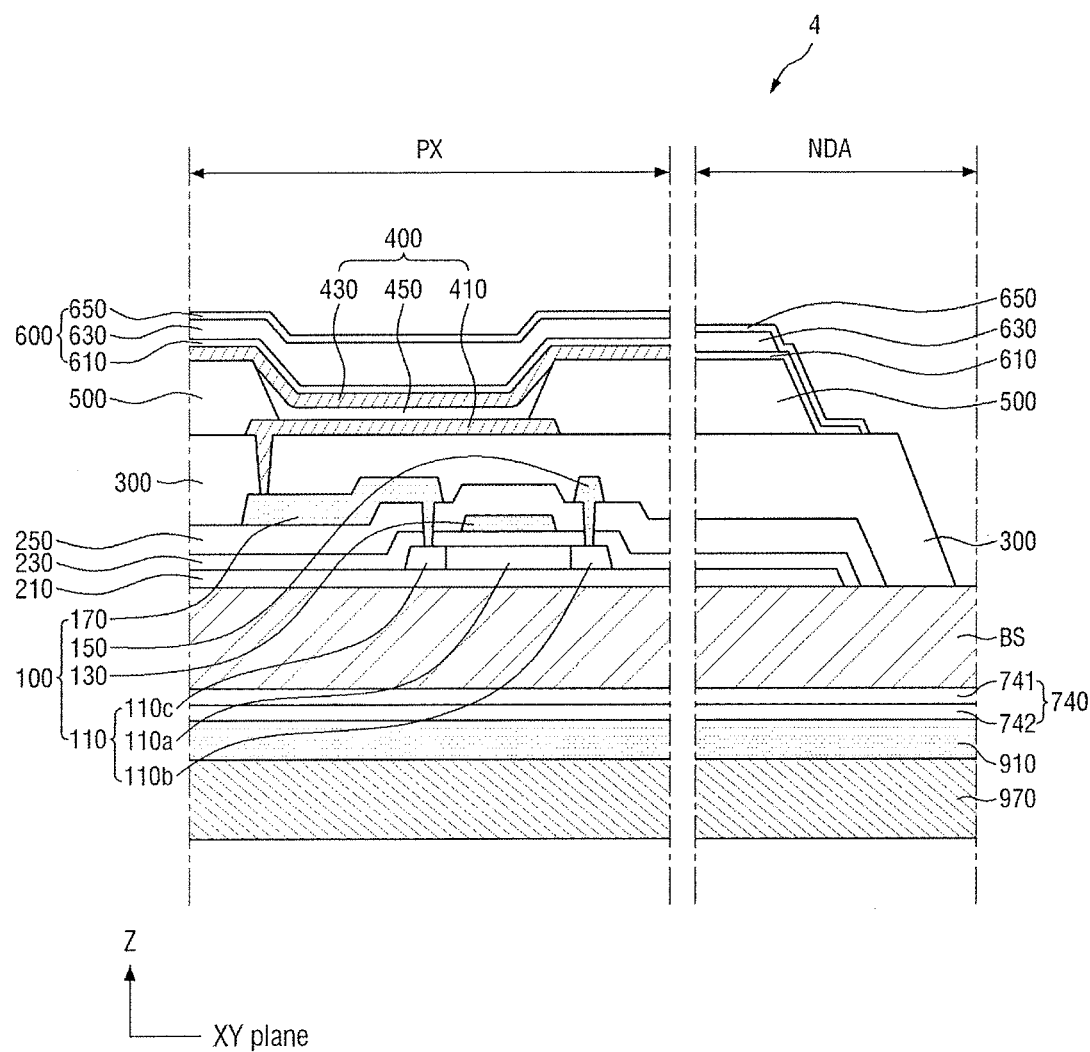
Figure 11:
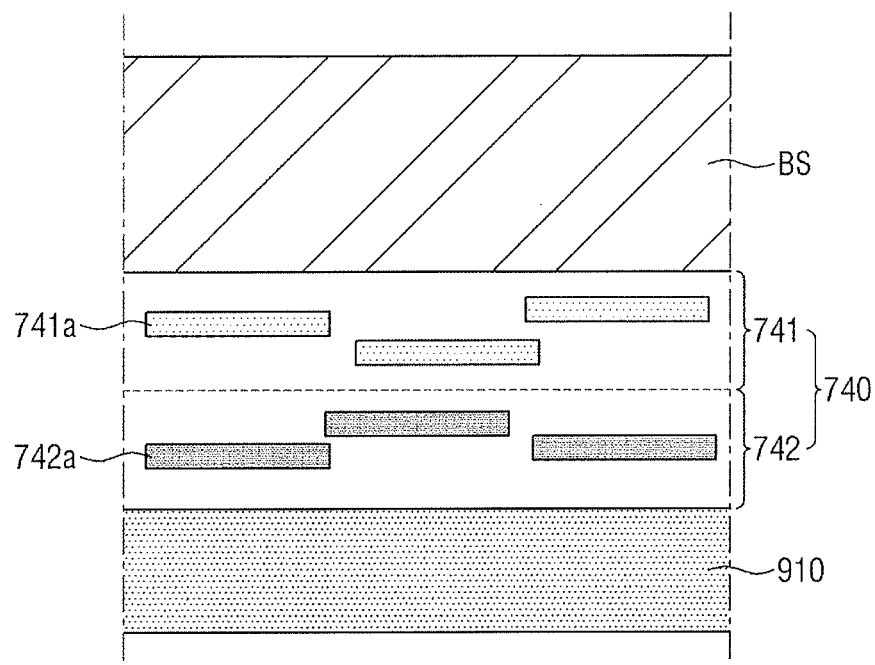

FIG. 10 is a sectional view of a display device according to still another embodiment of the present disclosure, and FIG. 11 is an enlarged schematic diagram of a plate-like inorganic layer of FIG. 10.

Referring to FIGS. 10 and 11, a display device 4 according to this embodiment is different from the display device 1 according to the embodiment of FIG. 2 or the like in that a plate-like inorganic layer 740 of the display device 4 includes a first plate-like inorganic layer 741 and a second plate-like inorganic layer 742 that are mutually stacked, e.g., on top of each other.

The plate-like inorganic layer 740 may include a first plate-like inorganic layer 741 disposed on the second surface (a lower surface in FIG. 10) of the base BS and a second plate-like inorganic layer 742 disposed on the first plate-like inorganic layer 741. The first plate-like inorganic layer 741 and the second plate-like inorganic layer 742 may include a first plate-like inorganic particle 741a and a second plate-like inorganic particle 742a, respectively. For example, the first plate-like inorganic particle 741a and the second plate-like inorganic particle 742b may all include graphene oxide particles.

In an example embodiment, the first plate-like inorganic particle 741a and the second plate-like inorganic particle 742b may be different kinds of plate-like inorganic particles. For example, the first plate-like inorganic particle 741a may include graphene oxide particles that contain carbon atoms, hydrogen atoms, and oxygen atoms but do not contain nitrogen atoms, as shown in FIG. 4, and may include graphene oxide particles that contain carbon atoms and hydrogen atoms and further contain nitrogen atoms, as shown in FIG. 5. The first plate-like inorganic layer 741, the first plate-like inorganic particle 741a, the second plate-like inorganic layer 742, and the second plate-like inorganic particle 742a may have no polarity and be substantially neutral. In another embodiment, the first plate-like inorganic particle 741a may include a graphene oxide particle as shown in FIG. 5, and the second plate-like inorganic particle 742a may include a graphene oxide particle as shown in FIG. 4. The first plate-like inorganic particle 741a and the second plate-like inorganic particle 742b may have different or approximately the same sizes.

A plurality of first plate-like inorganic particles 741a may horizontally overlap with one another in the first plate-like inorganic layer 741, and a plurality of second plate-like inorganic particles 742a may horizontally overlap with one another in the second plate-like inorganic layer 742. In some embodiments, the first plate-like inorganic particle 741a in the first plate-like inorganic layer 741 and the second plate-like inorganic particle 742a in the second plate-like inorganic layer 742 may partially overlap in the third direction Z. The first plate-like inorganic particle 741a and the second plate-like inorganic particle 742b may have a weak bonding force caused by a van der Waals force or like. The first plate-like inorganic layer 741 and the second plate-like inorganic layer 742 may have a thickness ranging from about 0.3 nm to about 5 nm, but the present disclosure is not limited thereto.

The first plate-like inorganic layer 741 containing the first plate-like inorganic particle 741a and the second plate-like inorganic layer 742 containing the second plate-like inorganic particle 742a may respectively be understood as a residual temporary adhesive layer that had a first charge but has been neutralized and a residual temporary adhesive layer that had a second charge with a polarity opposite to that of the first charge but has been neutralized.

In another embodiment, any one of the first plate-like inorganic particle 741a and the second plate-like inorganic particle 742a may include a graphene oxide particle that contains carbon atoms and hydrogen atoms and further contains nitrogen atoms, and the other may include a plate-like silicate particle.

Examples of the plate-like silicate particle may include kaolin-based inorganic particles such as kaolinite, decite, nacrite, and haloisite, montmorillonite-based inorganic particles such as montmorillonite, bentonite, hectorite, saponite, soconite, and nontronite, zeolite-based inorganic particles, illite-based inorganic particles, pyrophyllite-based inorganic particles, and vermiculite-based inorganic particles.

Figure 12:
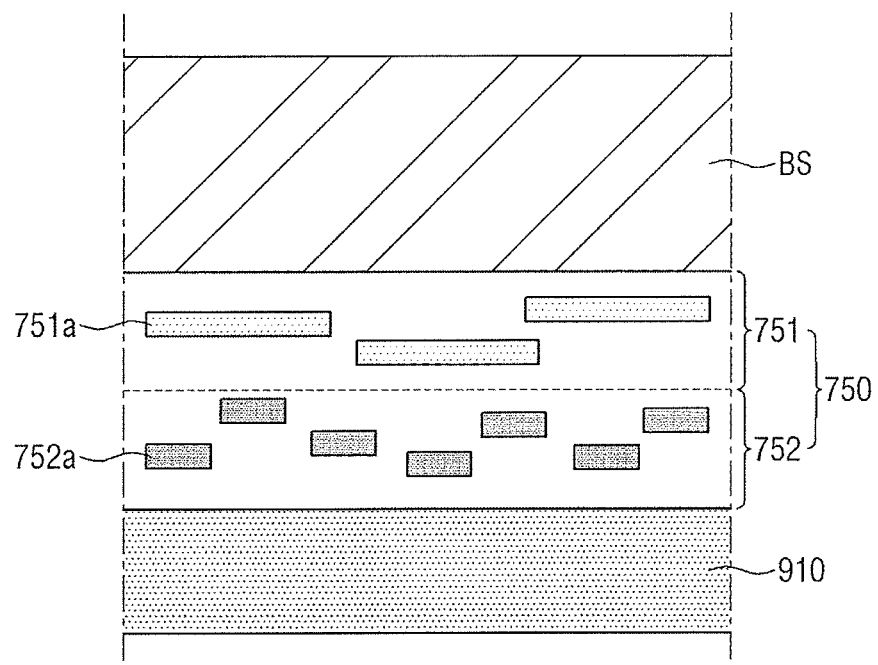

FIG. 12 is an enlarged schematic view showing a plate-like inorganic layer of a display device according to still another embodiment of the present disclosure.

Referring to FIG. 12, the display device according to this embodiment is different from the display device 4 according to the embodiment of FIG. 11 or the like in that a plate-like inorganic layer 750 includes a first plate-like inorganic layer 751 and a second plate-like inorganic layer 752, the first plate-like inorganic layer 751 includes a first plate-like inorganic particle 751a having a first size, and the second plate-like inorganic layer 752 includes a second plate-like inorganic particle 752a having a second size different from the first size.

In an example embodiment, the first plate-like inorganic particle 751a and the second plate-like inorganic particle 752a may be different kinds of plate-like inorganic particles. For example, the first plate-like inorganic particle 751a may include a graphene oxide particle that contains carbon atoms, hydrogen atoms, and oxygen atoms but does not contain nitrogen atoms. In another embodiment, the first plate-like inorganic particle 751a may include a plate-like silicate particle. Also, the second plate-like inorganic particle 752a may include a graphene oxide particle that contains carbon atoms and hydrogen atoms and further contains nitrogen atoms, as shown in FIG. 5. The first plate-like inorganic particle 751a and the second plate-like inorganic particle 752a may have no polarity and be substantially neutral.

In an example embodiment, the size (e.g., the maximum horizontal particle diameter) of the first plate-like inorganic particle 751a may be greater than the size (e.g., the maximum horizontal particle diameter) of the second plate-like inorganic particle 752a. When the first plate-like inorganic particle 751a includes the graphene oxide particle as shown in FIG. 4 and the second plate-like inorganic particle 752a includes the graphene oxide particle as shown in FIG. 5, the first plate-like inorganic particle 751a has a relatively large size and sufficiently covers the base BS, and also the second plate-like inorganic particle 752a has a relatively small size. Accordingly, it is possible to manufacture a second plate-like inorganic particle 752a with high zeta potential in the method of manufacturing the display device that will be described below, and thus it is possible to improve a coating property of the second plate-like inorganic layer 752 with respect to the first plate-like inorganic layer 751 and minimize an adhesive force between the base BS and a carrier substrate.

For example, the horizontal size of the first plate-like inorganic particle 751a may range from about 20 μm to about 50 μm, and the horizontal size of the second plate-like inorganic particle 752a may range from about 0.5 μm to about 8.0 μm, but the present disclosure is not limited thereto.

In some embodiments, the first plate-like inorganic particle 751a in the first plate-like inorganic layer 751 and the second plate-like inorganic particle 752a in the second plate-like inorganic layer 752 may partially overlap in the third direction Z and have a weak bonding force caused by a van der Waals force.

Figure 13:
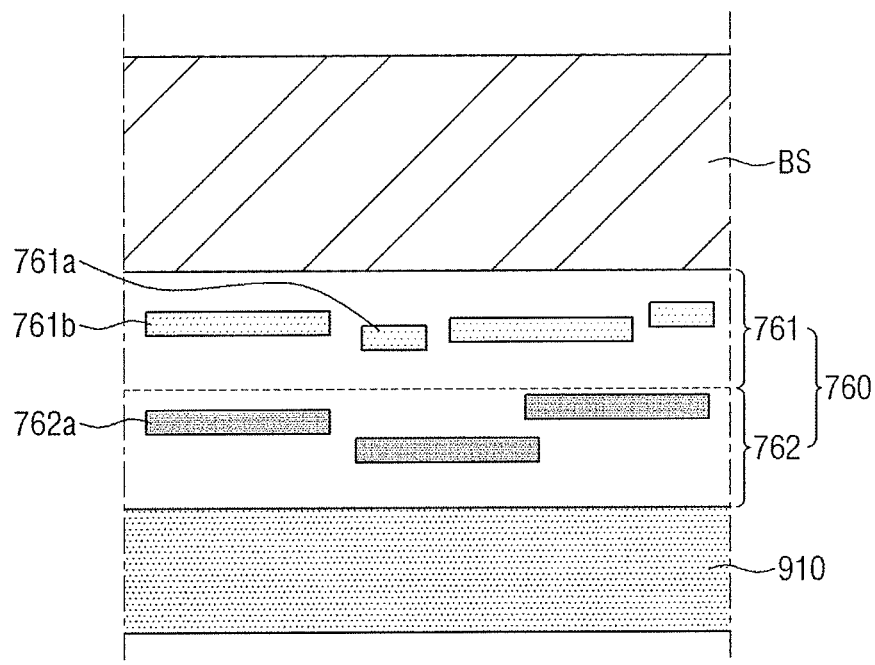

FIG. 13 is an enlarged schematic view showing a plate-like inorganic layer of a display device according to still another embodiment of the present disclosure.

Referring to FIG. 13, the display device according to this embodiment is different from the display device 4 according to the embodiment of FIG. 11 or the like in that a plate-like inorganic layer 760 includes a first plate-like inorganic layer 761 and a second plate-like inorganic layer 762, the first plate-like inorganic layer 761 includes a first plate-like inorganic particle 761a having a first size and a second plate-like inorganic particle 761b having a second size larger than the first size, and the second plate-like inorganic layer 762 includes a third plate-like inorganic particle 762a having a third size larger than the first size.

In an example embodiment, the first plate-like inorganic particle 761a and the second plate-like inorganic particle 761b may be substantially the same kind of plate-like inorganic particle, and the first plate-like inorganic particle 761a and the third plate-like inorganic particle 762a may be different kinds of plate-like inorganic particles. For example, the first plate-like inorganic particle 761a and the second plate-like inorganic particle 761b may be the graphene oxide particle shown in FIG. 4, and the third plate-like inorganic particle 762a may be a graphene oxide particle as shown in FIG. 5. In another embodiment, the first plate-like inorganic particle 761a and the second plate-like inorganic particle 761b may be the graphene oxide particle shown in FIG. 5, and the third plate-like inorganic particle 762a may be a graphene oxide particle as shown in FIG. 4.

The first plate-like inorganic particle 761a and the second plate-like inorganic particle 761b in the first plate-like inorganic layer 761 may have the same sizes and arrangements as the plate-like inorganic particles that have been described with reference to FIGS. 6 and 7, and thus repetitive description thereof will be omitted. For example, the second size of the second plate-like inorganic particle 761b may be greater than or equal to about 6 times, 6.1 times, 6.2 times, 6.3 times, 6.4 times, or 6.5 times the first size of the first plate-like inorganic particle 761a. The second size of the second plate-like inorganic particle 761b may be substantially the same as or different from the third size of the third plate-like inorganic particle 762a.

In some embodiments, the first plate-like inorganic particle 761a in the first plate-like inorganic layer 761 and the third plate-like inorganic particle 762a in the second plate-like inorganic layer 762, and the second plate-like inorganic particle 761b in the first plate-like inorganic layer 761 and the third plate-like inorganic particle 762a in the second plate-like inorganic layer 762 may partially overlap in the third direction Z and have a weak bonding force caused by a van der Waals force.

The first plate-like inorganic layer 761 including the first plate-like inorganic particle 761a and the second plate-like inorganic particle 761b, which have different sizes, of the plate-like inorganic layer 760 of the display device according to this embodiment may contribute to an increase in the extent to which the base BS is covered. Also, by diversifying a bonding force such as a van der Waals force formed between the first plate-like inorganic layer 761 and the second plate-like inorganic layer 762, it is possible to improve a coating property of the second plate-like inorganic layer 762 with respect to the first plate-like inorganic layer 761 and thus minimize an adhesive force between the base BS and a carrier substrate in the method of manufacturing the display device that will be described below.

Figure 14:
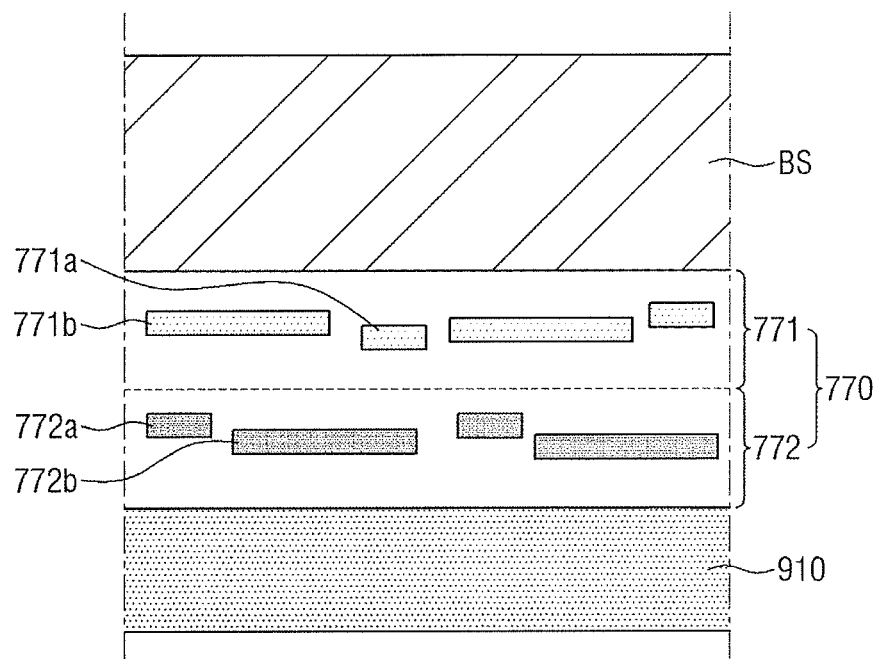

FIG. 14 is an enlarged schematic view showing a plate-like inorganic layer of a display device according to still another embodiment of the present disclosure.

Referring to FIG. 14, the display device according to this embodiment is different from the display device 4 according to the embodiment of FIG. 11 or the like in that a plate-like inorganic layer 770 includes a first plate-like inorganic layer 771 and a second plate-like inorganic layer 772, the first plate-like inorganic layer 771 includes a first plate-like inorganic particle 771a having a first size and a second plate-like inorganic particle 771b having a second size larger than the first size, and the second plate-like inorganic layer 772 includes a third plate-like inorganic particle 772a having a third size larger than the second size and a fourth plate-like inorganic particle 772b having a fourth size larger than the third size.

In an example embodiment, the first plate-like inorganic particle 771a and the second plate-like inorganic particle 771b may be substantially the same kind of plate-like inorganic particle, the third plate-like inorganic particle 772a and the fourth plate-like inorganic particle 772b may be substantially the same kind of plate-like inorganic particle, and the first plate-like inorganic particle 771a and the third plate-like inorganic particle 772a may be different kinds of plate-like inorganic particles. For example, the first plate-like inorganic particle 771a and the second plate-like inorganic particle 771b may be the graphene oxide particle shown in FIG. 4, and the third plate-like inorganic particle 772a and the fourth plate-like inorganic particle 772b may be the graphene oxide particle shown in FIG. 5. In another embodiment, the first plate-like inorganic particle 771a and the second plate-like inorganic particle 771b may be the graphene oxide particle shown in FIG. 5, and the third plate-like inorganic particle 772a and the fourth plate-like inorganic particle 772b may be the graphene oxide particles shown in FIG. 4.

The first plate-like inorganic particle 771a and the second plate-like inorganic particle 771b in the first plate-like inorganic layer 771, and the third plate-like inorganic particle 772a and the fourth plate-like inorganic particle in the second plate-like inorganic layer 772 may have the same sizes and arrangements as the plate-like inorganic particles that have been described with reference to FIGS. 6 and 7, and thus repetitive description thereof will be omitted. For example, the second size of the second plate-like inorganic particle 771b may be greater than or equal to about 6 times, 6.1 times, 6.2 times, 6.3 times, 6.4 times, or 6.5 times the first size of the first plate-like inorganic particle 771a, and the fourth size of the fourth plate-like inorganic particle 772b may be greater than or equal to about 6 times, 6.1 times, 6.2 times, 6.3 times, 6.4 times, or 6.5 times the third size of the third plate-like inorganic particle 772a. Also, the first size of the first plate-like inorganic particle 771a may be substantially the same as or different from the third size of the third plate-like inorganic particle 772a, and the second size of the second plate-like inorganic particle 771b may be substantially the same as or different from the fourth size of the fourth plate-like inorganic particle 772b.

Figure 15:
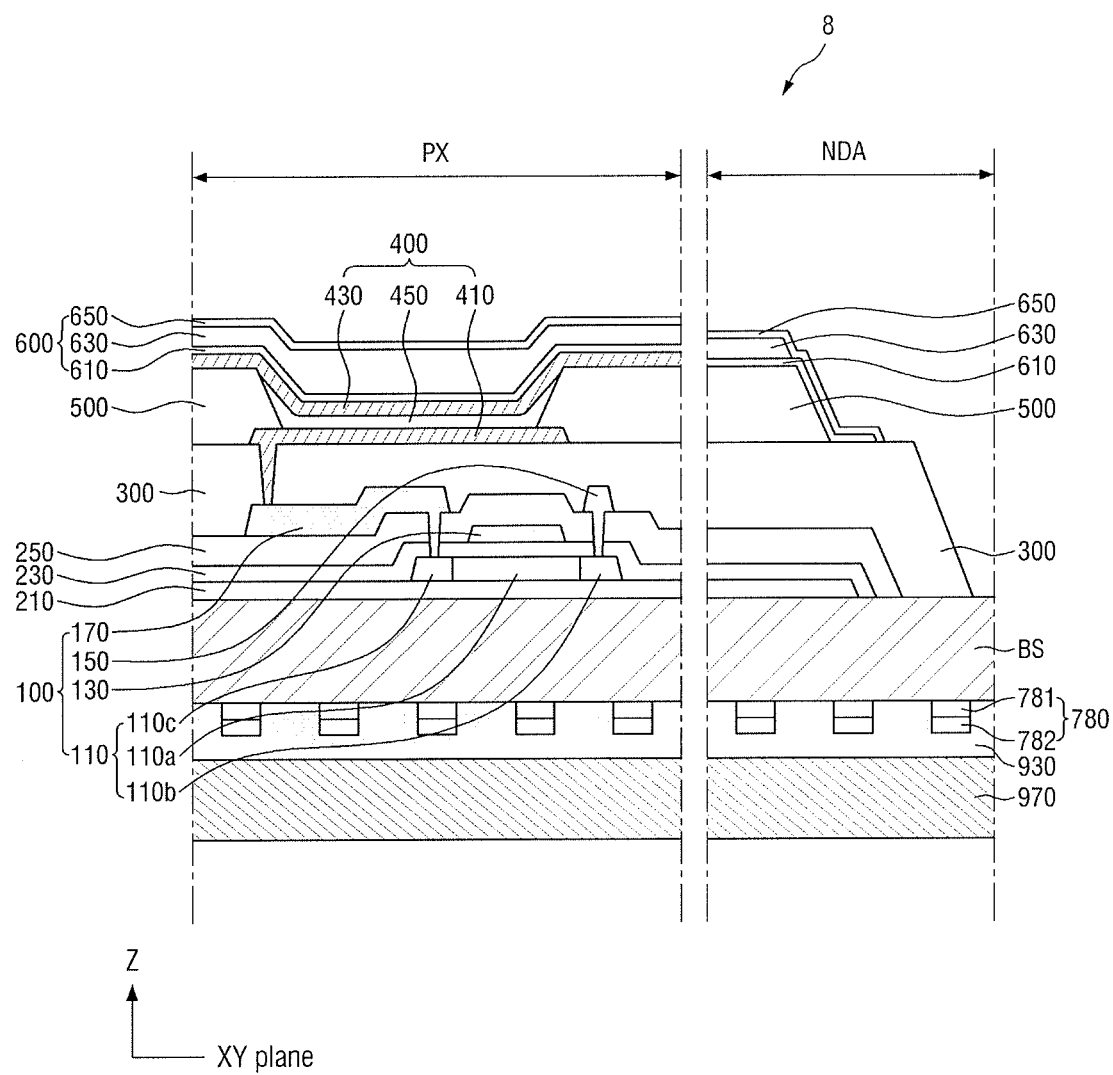
Figure 16:
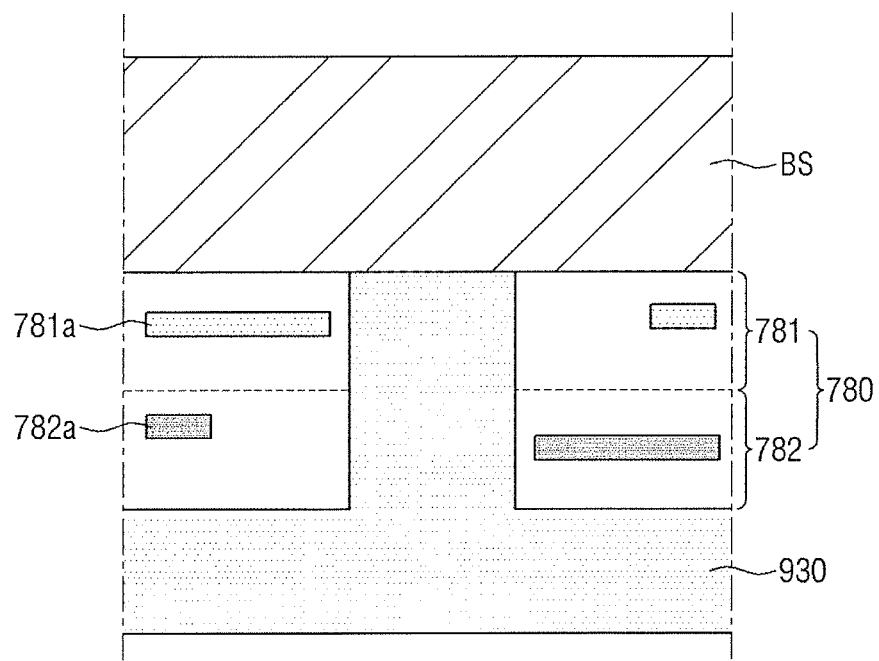

FIG. 15 is a sectional view of a display device according to still another embodiment of the present disclosure, and FIG. 16 is an enlarged schematic diagram of a plate-like inorganic layer of FIG. 15.

Referring to FIGS. 15 and 16, a display device 8 according to this embodiment is different from the display device according to the embodiment of FIG. 14 in that a plate-like inorganic layer 780 of the display device 8 is partially removed to partially expose the other surface (a lower surface in FIG. 15) of the base BS.

In an example embodiment, the plate-like inorganic layer 780 may include a first plate-like inorganic layer 781 disposed on the other surface of the base BS and a second plate-like inorganic layer 782 disposed on the first plate-like inorganic layer 781, and the plate-like inorganic layer 780 may be partially removed. That is, the plate-like inorganic layer 780 may be only partially disposed on the other surface of the base BS to partially expose the other surface of the base BS. The first plate-like inorganic layer 781 may include first plate-like inorganic particles 781a having different sizes, and the second plate-like inorganic layer 782 may include second plate-like inorganic particles 782a having different sizes.

Also, an adhesive layer 930 may be brought into contact with the first plate-like inorganic layer 781, the second plate-like inorganic layer 782, and the base BS and also may be further brought into contact with the other surface of the base BS.

Figure 17:
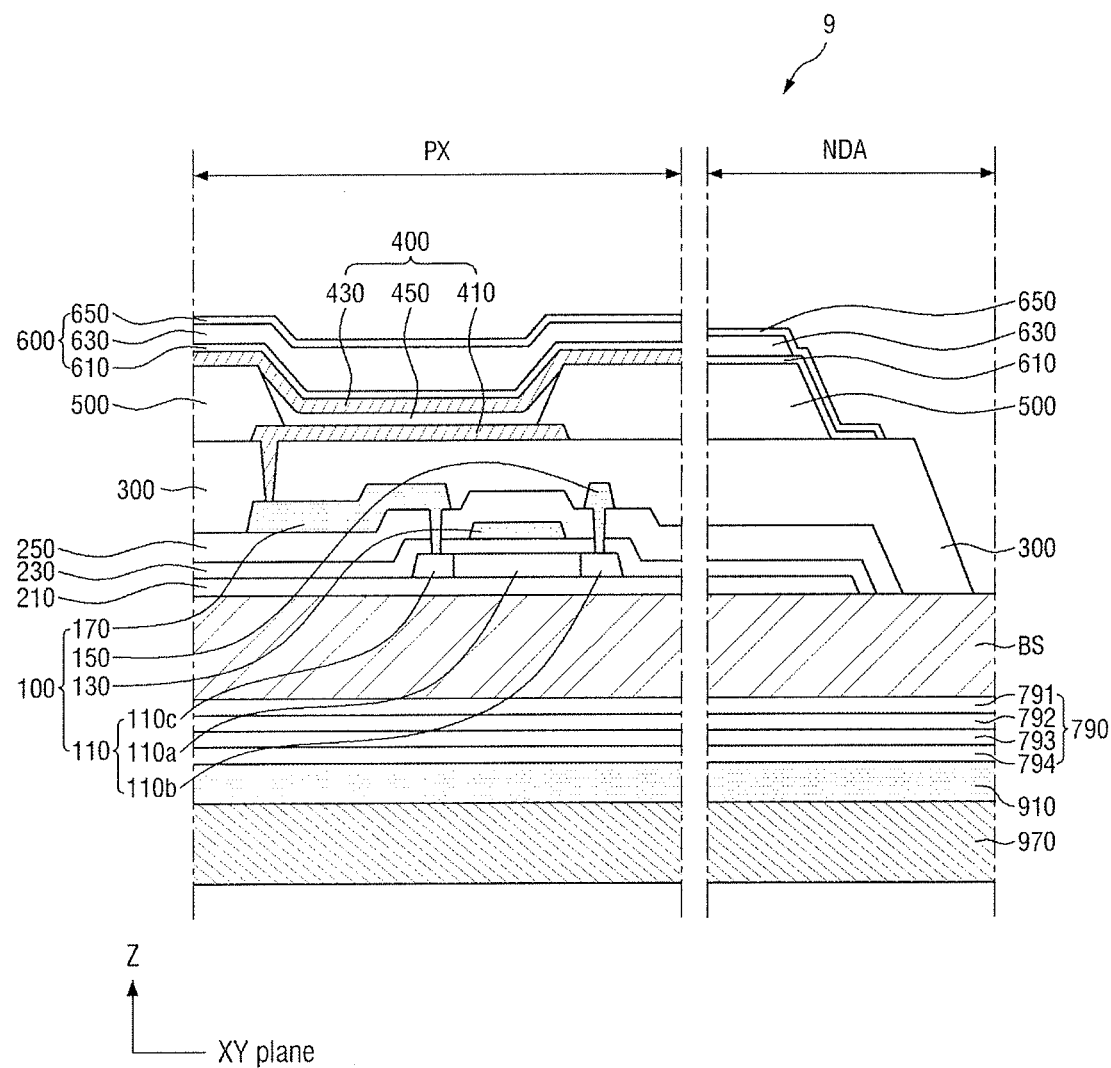
Figure 18:
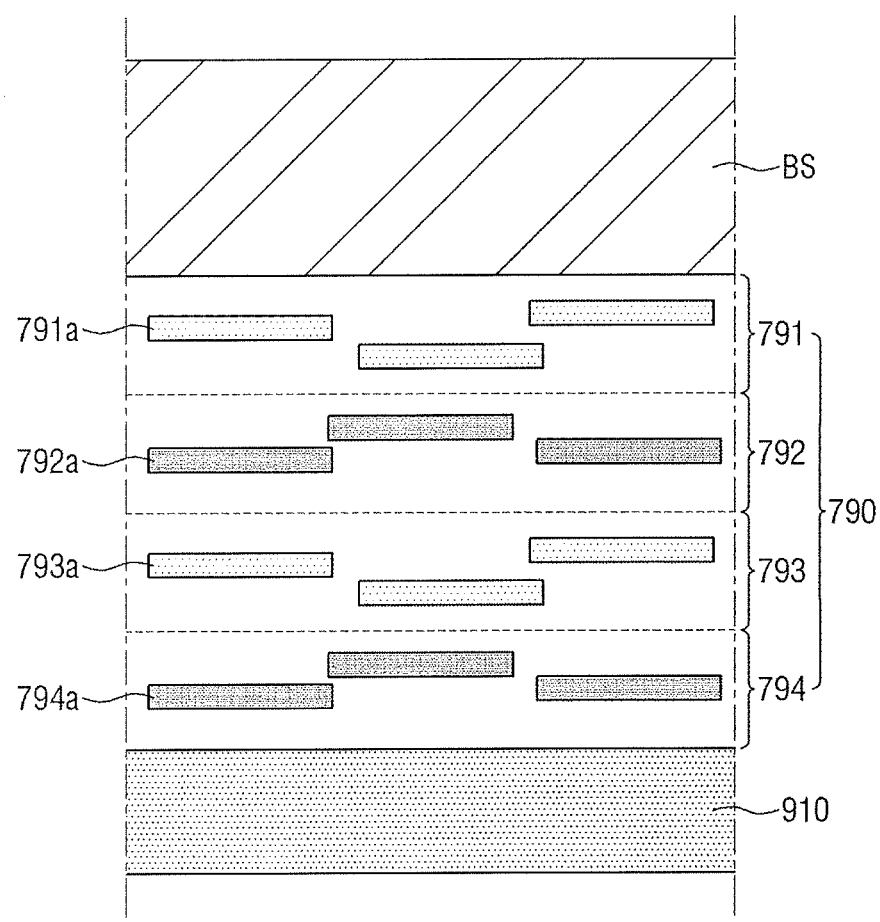

FIG. 17 is a sectional view of a display device according to still another embodiment of the present disclosure, and FIG. 18 is an enlarged schematic diagram of a plate-like inorganic layer of FIG. 17.

Referring to FIGS. 17 and 18, a display device 9 according to this embodiment is different from the display device 1 according to the embodiment of FIG. 2 or the like in that a plate-like inorganic layer 790 of the display device 9 includes a first plate-like inorganic layer 791, a second plate-like inorganic layer 792, a third plate-like inorganic layer 793, and a fourth plate-like inorganic layer 794 that are mutually stacked.

The plate-like inorganic layer 790 may include a first plate-like inorganic layer 791 disposed on the other surface (a lower surface in FIG. 17) of the base BS and including a first plate-like inorganic particle 791a, a second plate-like inorganic layer 792 disposed on the first plate-like inorganic layer 791 and including a second plate-like inorganic particle 792a, a third plate-like inorganic layer 793 disposed on the second plate-like inorganic layer 792 and including a third plate-like inorganic particle 793a, and a fourth plate-like inorganic layer 794 disposed on the third plate-like inorganic layer 793 and including a fourth plate-like inorganic particle 794a.

In an example embodiment, the first plate-like inorganic particle 791a and the third plate-like inorganic particle 793a may be the same kind of plate-like inorganic particle, the second plate-like inorganic particle 792a and the fourth plate-like inorganic particle 794a may be the same kind of plate-like inorganic particle, and the first plate-like inorganic particle 791a and the second plate-like inorganic particle 792a may be different kinds of plate-like inorganic particles. That is, the plate-like inorganic layers including different kinds of plate-like inorganic particles may be alternately stacked. FIG. 18 illustrates a case in which the plate-like inorganic layer 790 has four layered-structures in which different plate-like inorganic particles are alternately stacked. In another embodiment, the plate-like inorganic layer 790 may have five or more layered-structures.

For example, the first plate-like inorganic particle 791a and the third plate-like inorganic particle 793a may be the graphene oxide particle shown in FIG. 4, and the second plate-like inorganic particle 792a and the fourth plate-like inorganic particle 794a may be the graphene oxide particle shown in FIG. 5. In another embodiment, the first plate-like inorganic particle 791a and the third plate-like inorganic particle 793a may be the graphene oxide particle shown in FIG. 5, and the second plate-like inorganic particle 792a and the fourth plate-like inorganic particle 794a may be the graphene oxide particle shown in FIG. 4. The first plate-like inorganic particle 791a, the second plate-like inorganic particle 792a, the third plate-like inorganic particle 793a, and the fourth plate-like inorganic particle 794a may have approximately the same or different sizes.

In some embodiments, the first plate-like inorganic particle 791a and the second plate-like inorganic particle 792a may partially overlap in the third direction Z, the second plate-like inorganic particle 792a and the third plate-like inorganic particle 793a may partially overlap in the third direction Z, and the third plate-like inorganic particle 793a and the fourth plate-like inorganic particle 794a may partially overlap in the third direction Z. Thus, the first plate-like inorganic layer 791 and the second plate-like inorganic layer 792, the second plate-like inorganic layer 792 and the third plate-like inorganic layer 793, and the third plate-like inorganic layer 793 and the fourth plate-like inorganic layer 794 may have a weak bonding force caused by a van der Waals force.

Figure 19:
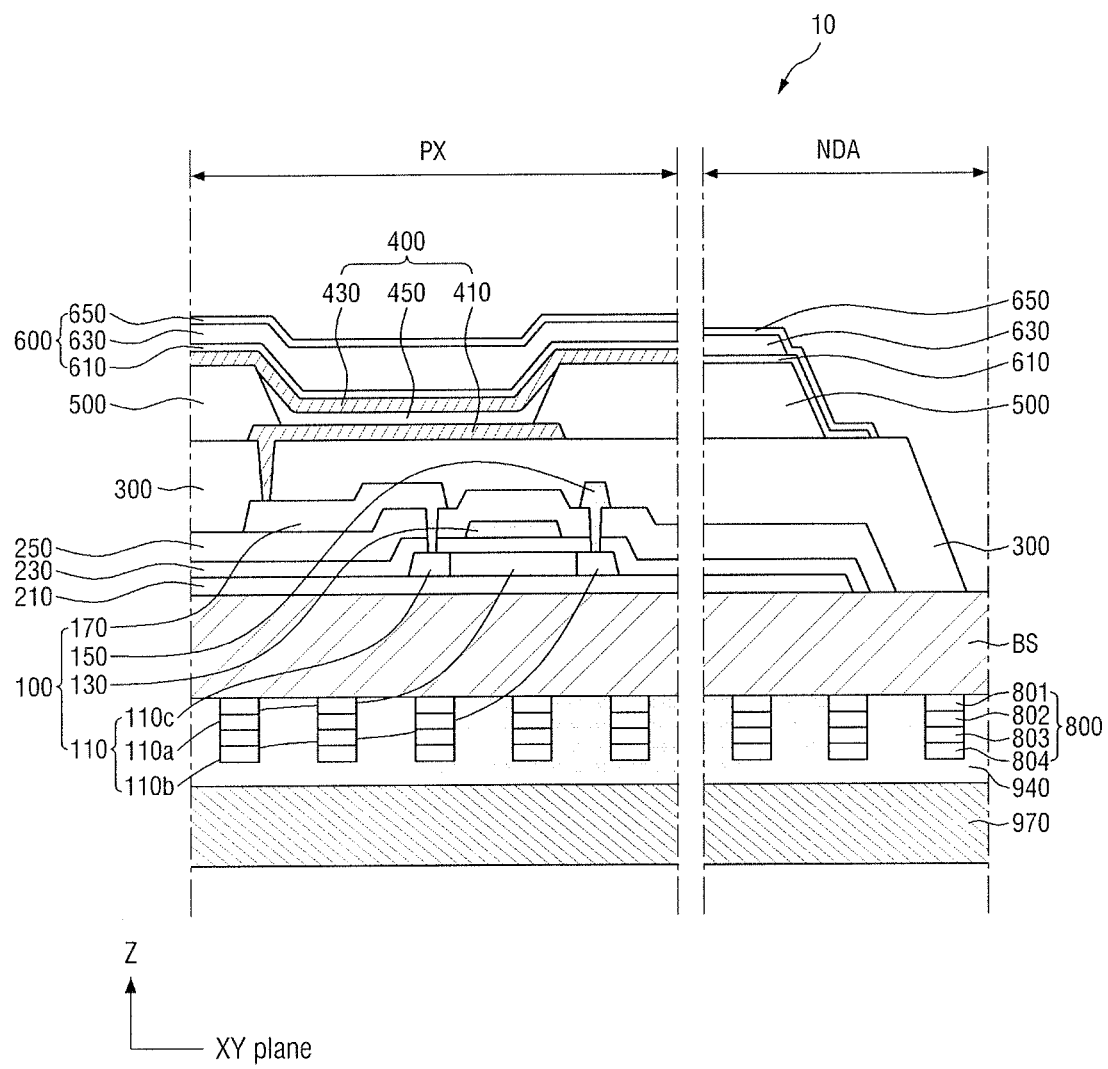
Figure 20:
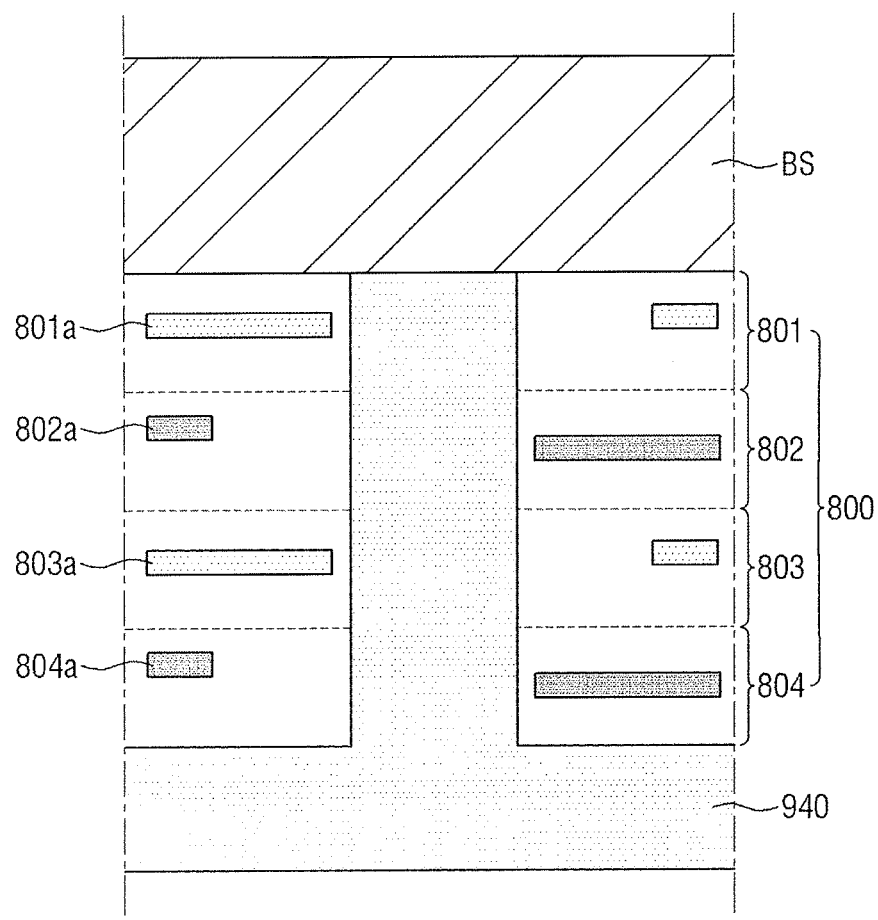

FIG. 19 is a sectional view of a display device according to still another embodiment of the present disclosure, and FIG. 20 is an enlarged schematic diagram of a plate-like inorganic layer of FIG. 19.

Referring to FIGS. 19 and 20, a display device 10 according to this embodiment is different from the display device 9 according to the embodiment of FIG. 17 or the like in that a plate-like inorganic layer 800 of the display device 10 is partially removed to partially expose the other surface (a lower surface in FIG. 19) of the base BS.

In an example embodiment, the plate-like inorganic layer 800 may include a first plate-like inorganic layer 801 disposed on the other surface of the base BS, a second plate-like inorganic layer 802 disposed on the first plate-like inorganic layer 801, a third plate-like inorganic layer 803 disposed on the second plate-like inorganic layer 802, and a fourth plate-like inorganic layer 804 disposed on the third plate-like inorganic layer 803. In this case, the plate-like inorganic layer 800 may be partially removed. That is, the plate-like inorganic layer 800 may be only partially disposed on the other surface of the base BS to partially expose the other surface of the base BS.

A first plate-like inorganic particle 801*a* of the first plate-like inorganic layer 801 and a third plate-like inorganic particle 803*a* of the third plate-like inorganic layer 803 may be the same kind of plate-like inorganic particle, a second plate-like inorganic particle 802*a* of the second plate-like inorganic layer 802 and a fourth plate-like inorganic particle 804*a* of the fourth plate-like inorganic layer 804 may be the same kind of plate-like inorganic particle, and the first plate-like inorganic particle 801*a* and the second plate-like inorganic particle 802*a* may be the same kind of plate-like inorganic particle. For example, the first plate-like inorganic particle 801*a* and the third plate-like inorganic particle 803*a* may be the graphene oxide particle shown in FIG. 4, and the second plate-like inorganic particle 802*a* and the fourth plate-like inorganic particle 804*a* may be the graphene oxide particle shown in FIG. 5. In another embodiment, the first plate-like inorganic particle 801*a* and the third plate-like inorganic particle 803*a* may be the graphene oxide particle shown in FIG. 5, and the second plate-like inorganic particle 802*a* and the fourth plate-like inorganic particle 804*a* may be the graphene oxide particle shown in FIG. 4.

In some embodiments, the first plate-like inorganic particle 801*a* may include a plurality of plate-like inorganic particles of different sizes. As a non-limiting example, the sizes of the first plate-like inorganic particles 801*a* in the first plate-like inorganic layer 801 may have a bimodal distribution with two peaks or a distribution with three or more peaks. Likewise, the second plate-like inorganic particle 802*a*, the third plate-like inorganic particle 803*a*, and the fourth plate-like inorganic particle 804*a* may include a plurality of plate-like inorganic particles of different sizes.

Also, an adhesive layer 940 may be brought into contact with the first plate-like inorganic layer 801, the second plate-like inorganic layer 802, the third plate-like inorganic layer 803, the fourth plate-like inorganic layer 804, and the base BS and also may be further brought into contact with the other surface of the base BS.

A method of manufacturing the display device according to the embodiments of the present disclosure will be described below. FIGS. 21 to 38 are diagrams illustrating stages in a method of manufacturing a display device according to an embodiment of the present disclosure.

Figure 21:
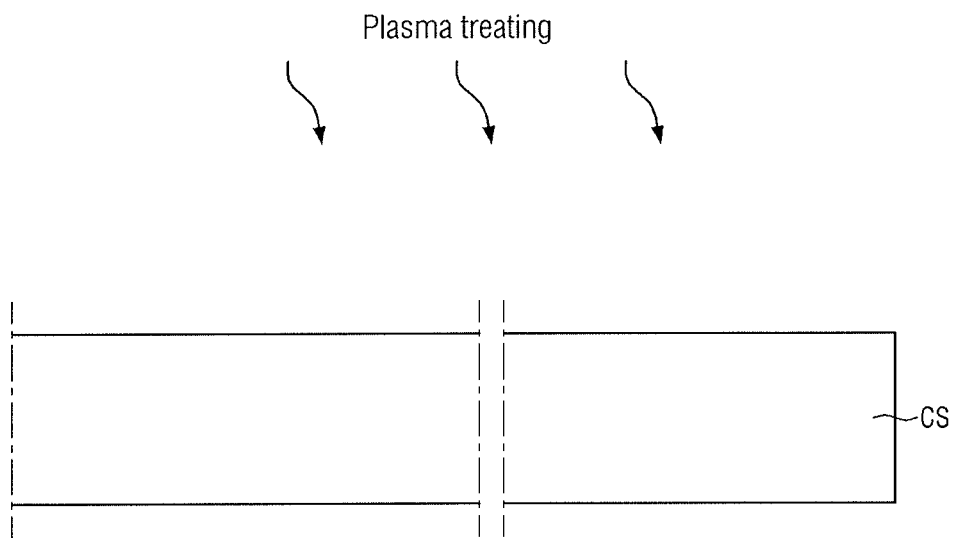
FIGS. 21 to 38 illustrate diagrams of stages in a method of manufacturing a display device according to an embodiment.
Figure 22:
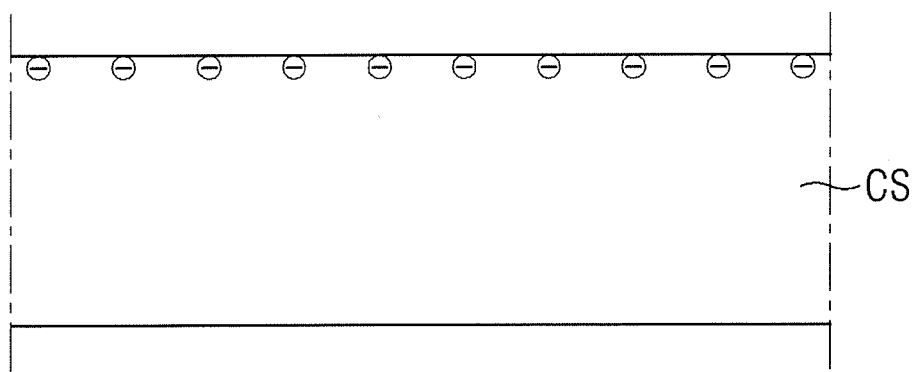

First, FIG. 21 is a diagram showing an operation of preparing a carrier substrate CS and performing surface treatment on the carrier substrate CS, and FIG. 22 is a schematic diagram showing a charge state of the surface of the carrier substrate CS.

Referring to FIGS. 21 and 22, the method includes preparing the carrier substrate CS and performing surface treatment on the carrier substrate CS to charge the surface of the carrier substrate CS.

The material of the carrier substrate CS is not especially limited as long as the material is rigid enough to stably support a base and elements formed thereabove in the subsequent process. For example, the carrier substrate CS may be formed of a glass material or a quartz material.

The surface of the carrier substrate CS may be treated to have a first charge through surface treatment. A case in which a first charge is a negative charge and a second charge having a polarity opposite to that of the first charge is a positive charge will be described below as an example, but the present disclosure is not limited thereto.

The operation of treating the surface of the carrier substrate CS with a negative charge may include performing plasma treatment. For example, the surface treatment operation may include performing plasma treatment using nitrogen or oxygen. In an example embodiment, the surface of the carrier substrate CS may have hydroxyl groups or the like and thus a negative charge.

Figure 23:
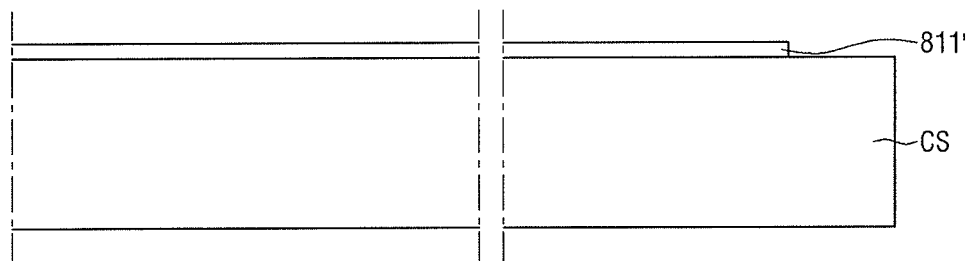
Figure 24:
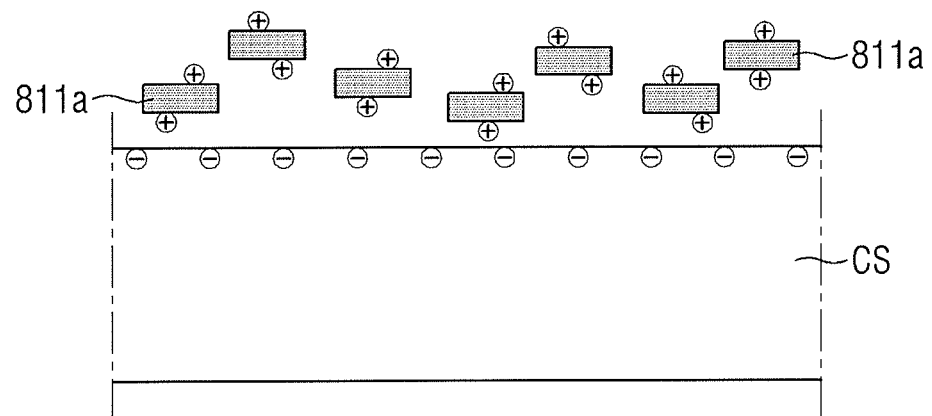

FIG. 23 is a diagram showing an operation of forming a first temporary adhesive layer 811', and FIG. 24 is a schematic diagram showing a charge state of the first temporary adhesive layer 811' of FIG. 23.

Referring to FIGS. 23 and 24, the method includes forming a first temporary adhesive layer 811' including a first plate-like inorganic particle 811*a* on the carrier substrate CS. That is, the first temporary adhesive layer 811' may be a plate-like inorganic layer containing plate-like inorganic particles. The operation of forming the first temporary adhesive layer 811' may include providing an aqueous solution of the first plate-like inorganic particle 811*a* on the carrier substrate CS.

The first plate-like inorganic particle 811*a* of the first temporary adhesive layer 811' formed on the carrier substrate CS may have a positive charge, i.e., the second charge opposite to the first charge. By forming the positively charged first temporary adhesive layer 811' on the negatively charged carrier substrate CS, it is possible to fasten, e.g., attach, the first temporary adhesive layer 811' on the carrier substrate CS using an attractive force (e.g., a Coulomb force) between the carrier substrate CS and the first temporary adhesive layer 811' without a separate adhesive layer or an additional adhesive process.

In an example embodiment, the first plate-like inorganic particle 811*a* may be a graphene oxide particle that contains carbon atoms, hydrogen atoms, and nitrogen atoms. The carbon atoms, the hydrogen atoms, and the nitrogen atoms of the graphene oxide particle may form an amine group. For example, the carbon atoms, the hydrogen atoms, and the nitrogen atoms of the graphene oxide particle may form one or more of a secondary amine group and a tertiary amine group. The amine group of the first plate-like inorganic particle 811*a* may form positive ions in an aqueous solution and thus may form a graphene oxide particle layer having a positive charge, that is, the first temporary adhesive layer 811'.

In some embodiments, zeta potential of the aqueous solution of the first plate-like inorganic particle 811*a* may have a lower limit of about +20 mV. By forming a relatively high zeta potential for the aqueous solution of the first plate-like inorganic particle 811*a*, it is possible to prevent aggregation of the first plate-like inorganic particle 811*a* in the aqueous solution and form a high-dispersed aqueous solution of the first plate-like inorganic particle 811*a*. Accordingly, first plate-like inorganic particles 811*a* may be uniformly distributed on the carrier substrate CS, and thus a first temporary adhesive layer 811' capable of covering the carrier substrate CS well may be formed.

Figure 25:
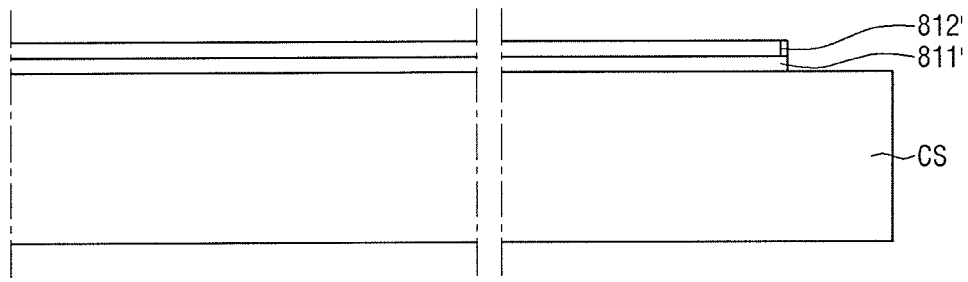
Figure 26:
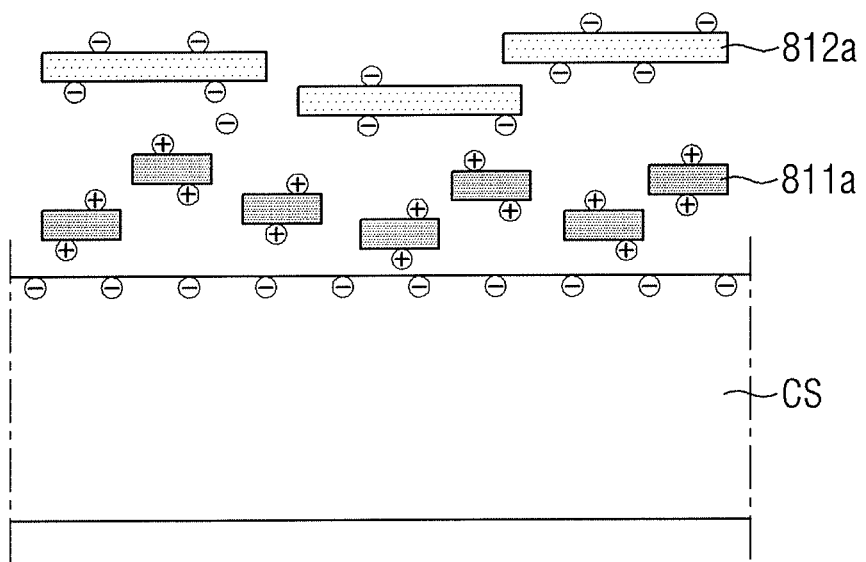

FIG. 25 is a diagram showing an operation of forming a second temporary adhesive layer 812', and FIG. 26 is a schematic diagram showing a charge state of the second temporary adhesive layer 812' of FIG. 25.

Referring to FIGS. 25 and 26, the method includes forming a second temporary adhesive layer 812' including a second plate-like inorganic particle 812a on the first temporary adhesive layer 811'. That is, the second temporary adhesive layer 812' may be a plate-like inorganic layer containing plate-like inorganic particles. The operation of forming the second temporary adhesive layer 812' may include providing an aqueous solution of the second plate-like inorganic particle 812a on the first temporary adhesive layer 811'.

The second plate-like inorganic particle 812a of the second temporary adhesive layer 812' formed on the first temporary adhesive layer 811' may have a negative charge. By forming the positively charged second temporary adhesive layer 812' on the negatively charged first temporary adhesive layer 811', it is possible to fasten the second temporary adhesive layer 812' by means of an attractive force between the first temporary adhesive layer 811' and the second temporary adhesive layer 812'.

In an example embodiment, the second plate-like inorganic particle 812a may include a graphene oxide particle that contains carbon atoms, hydrogen atoms, and oxygen atoms and does not contain nitrogen atoms. The carbon atoms, the hydrogen atoms, and the oxygen atoms of the graphene oxide particle may form one or more of a hydroxyl group, a carboxyl group, and an epoxy group. The hydroxyl group, the carboxyl group, or the epoxy group of the second plate-like inorganic particle 812a may form negative ions in an aqueous solution and thus may form a graphene oxide particle layer having a negative charge, that is, the second temporary adhesive layer 812'.

In some embodiments, the horizontal size of the second plate-like inorganic particle 812a may be greater than the horizontal size of the first plate-like inorganic particle 811a. The second plate-like inorganic particle 812a may have a relatively large size and sufficiently cover the carrier substrate CS and a base to be described below. Also, the first plate-like inorganic particle 811a has a relatively small size and thus high zeta potential to allow the aqueous solution of the first plate-like inorganic particle 811a having high dispersion to be formed. Thus, it is possible to uniformly distribute the first plate-like inorganic particle 811a on the carrier substrate CS.

In another embodiment, the second plate-like inorganic particle 812a may include a plate-like silicate particle. The plate-like silicate particle has been described, and thus repetitive description thereof will be omitted.

Figure 27:
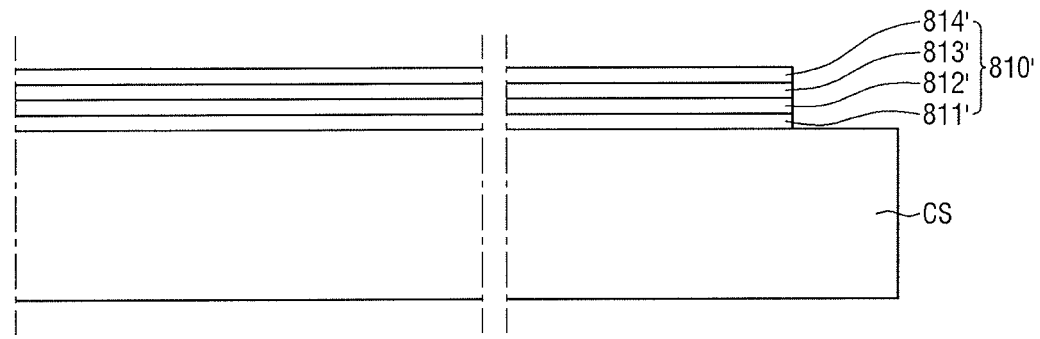

FIG. 27 is a diagram showing an operation of forming a third temporary adhesive layer 813' and a fourth temporary adhesive layer 814', and FIG. 4 is a schematic diagram showing a charge state of the temporary adhesive layer 810' of FIG. 27.

Figure 28:
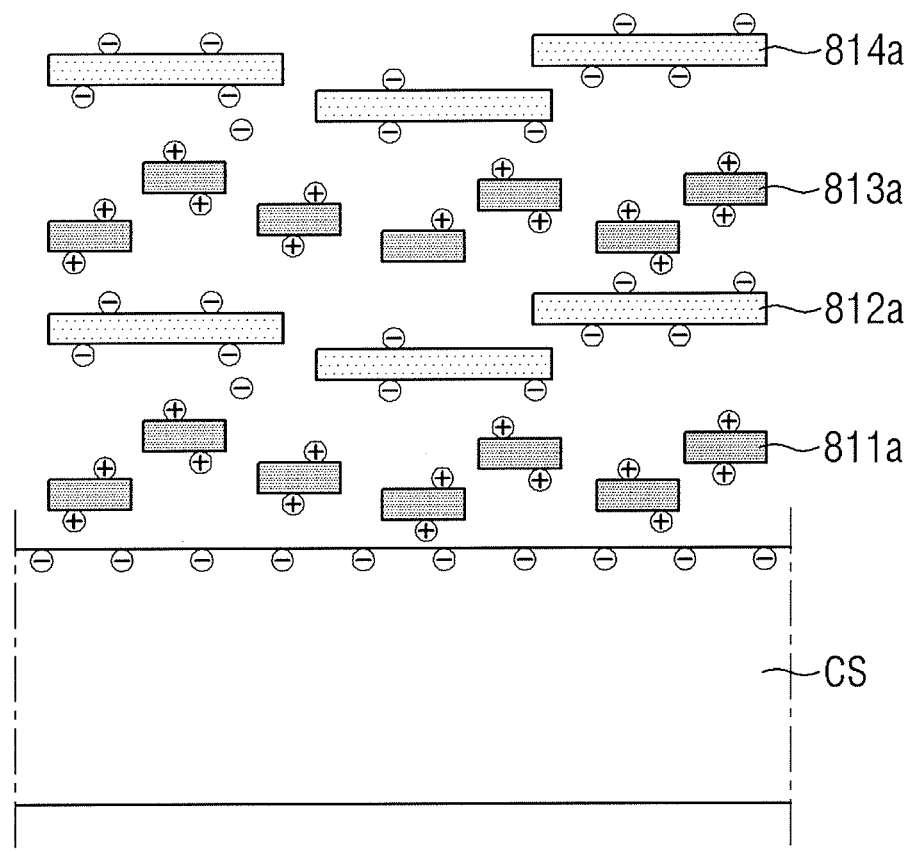

Referring to FIGS. 27 and 28, the method includes forming a third temporary adhesive layer 813' and a fourth temporary adhesive layer 814' on the second temporary adhesive layer 812'.

The third temporary adhesive layer 813' and the fourth temporary adhesive layer 814' may contain a third plate-like inorganic particle 813a and a fourth plate-like inorganic particle 814a, respectively. That is, the third temporary adhesive layer 813' and the fourth temporary adhesive layer 814' may be plate-like inorganic layers containing plate-like inorganic particles. The third plate-like inorganic particle 813a and the first plate-like inorganic particle 811a may be substantially the same kind of plate-like inorganic particle, and the fourth plate-like inorganic particle 814a and the second plate-like inorganic particle 812a may be substantially the same kind of plate-like inorganic particle. For example, the third temporary adhesive layer 813' may include a graphene oxide particle that contains carbon atoms and hydrogen atoms and further contains nitrogen atoms, like the first temporary adhesive layer 811', and the fourth temporary adhesive layer 814' may include a graphene oxide particle that contains carbon atoms, hydrogen atoms, and oxygen atoms and does not contain nitrogen atoms, like the second temporary adhesive layer 812'.

By forming the positively charged third temporary adhesive layer 813' on the negatively charged second temporary adhesive layer 812', and forming the negatively charged fourth temporary adhesive layer 814' on the third temporary adhesive layer 813', it is possible to fasten the third temporary adhesive layer 813' and the fourth temporary adhesive layer 814' by means of an attractive force between the temporary adhesive layers 810'.

FIG. 27 illustrates a case in which the temporary adhesive layer 810' is composed of four layers, but the present disclosure is not limited thereto. In another example, the temporary adhesive layer 810' may be composed of three or less layers or five or more layers. Also, the temporary adhesive layer 810' may be composed of an even number of layers or an odd number of layers.

Figure 29:
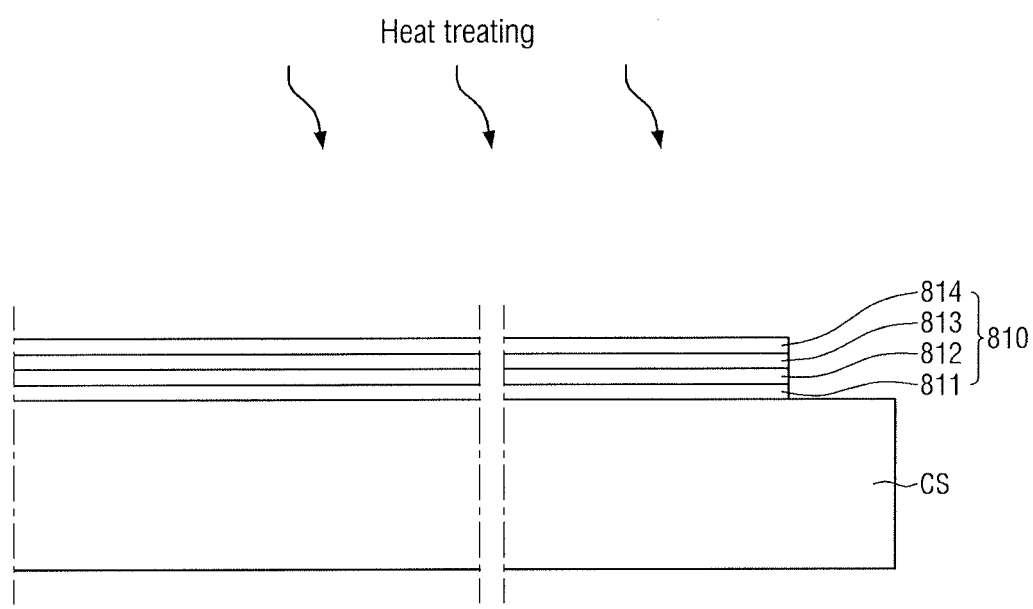
Figure 30:
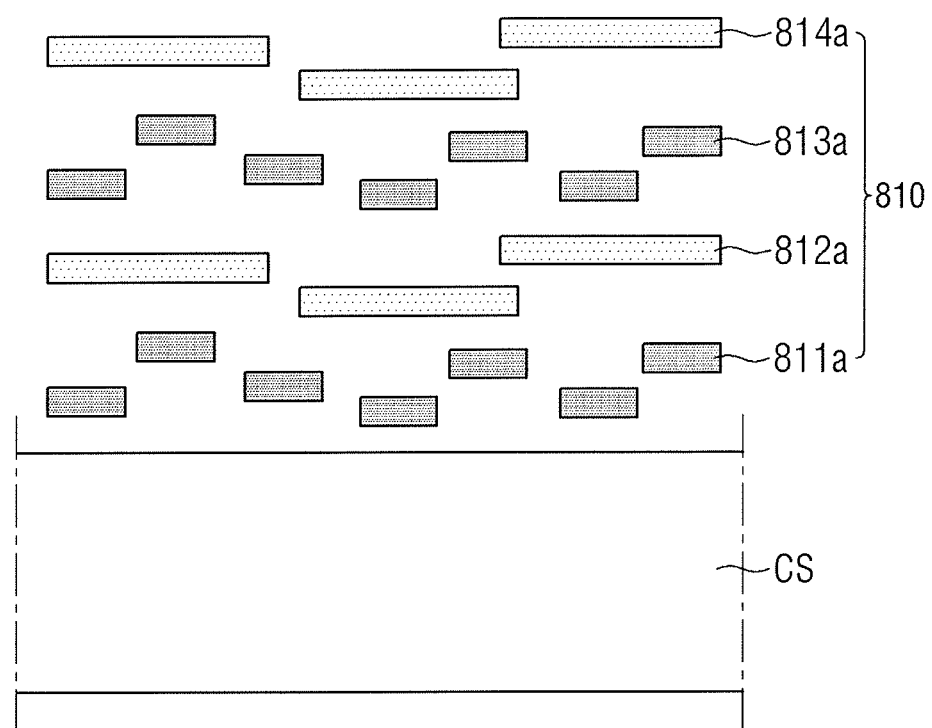

FIG. 29 is a diagram showing an operation of heat-treating a temporary adhesive layer 810, and FIG. 30 is a schematic diagram showing a charge state of the temporary adhesive layer 810 of FIG. 29.

Referring to FIGS. 29 and 30, the operation of heat-treating a temporary adhesive layer 810 may include evaporating the aqueous solutions and depolarizing at least a portion of the first temporary adhesive layer 811, the second temporary adhesive layer 812, the third temporary adhesive layer 813, and the fourth temporary adhesive layer 814 to substantially neutralize the temporary adhesive layer 810. For example, after the heat treatment, only plate-like particles may remain on the carrier substrate CS.

The present disclosure is not limited thereto, but the first temporary adhesive layer 811, the second temporary adhesive layer 812, the third temporary adhesive layer 813, and the fourth temporary adhesive layer 814 that are substantially neutral may be fastened or bonded to each other by a relatively weak bonding force such as a van der Waals force.

Figure 31:
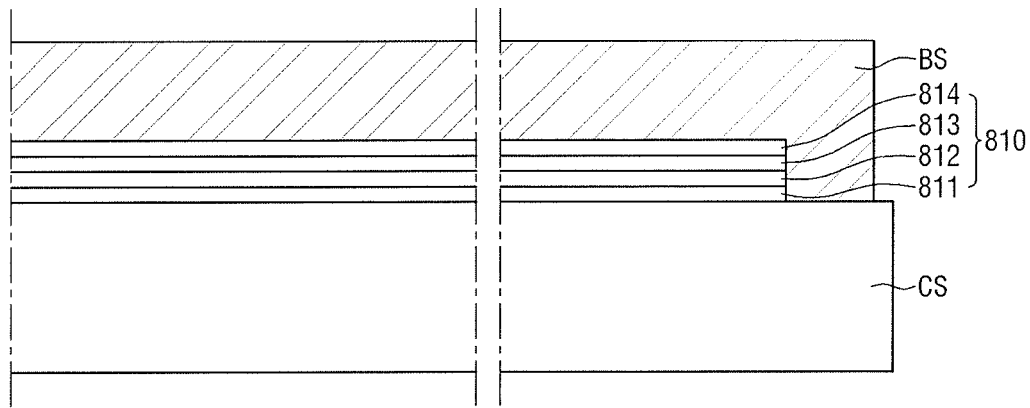

Subsequently, referred to FIG. 31, the method includes forming the base BS on the temporary adhesive layer 810. The base BS may contain a flexible polymeric material, e.g., polyimide, polycarbonate, polyethylene terephthalate, polyacrylate, and the like.

In an example embodiment, the formation of the base BS may include forming the base BS to cover side surfaces of the first temporary adhesive layer 811, the second temporary adhesive layer 812, the third temporary adhesive layer 813, and the fourth temporary adhesive layer 814 and come in contact with the carrier substrate CS. By forming the base BS to cover the side surface of the temporary adhesive layer 810, it is possible to, during a subsequent process, prevent impurities or the like from penetrating between temporary adhesive layers 810 that are stacked by a weak bonding force.

Figure 32:
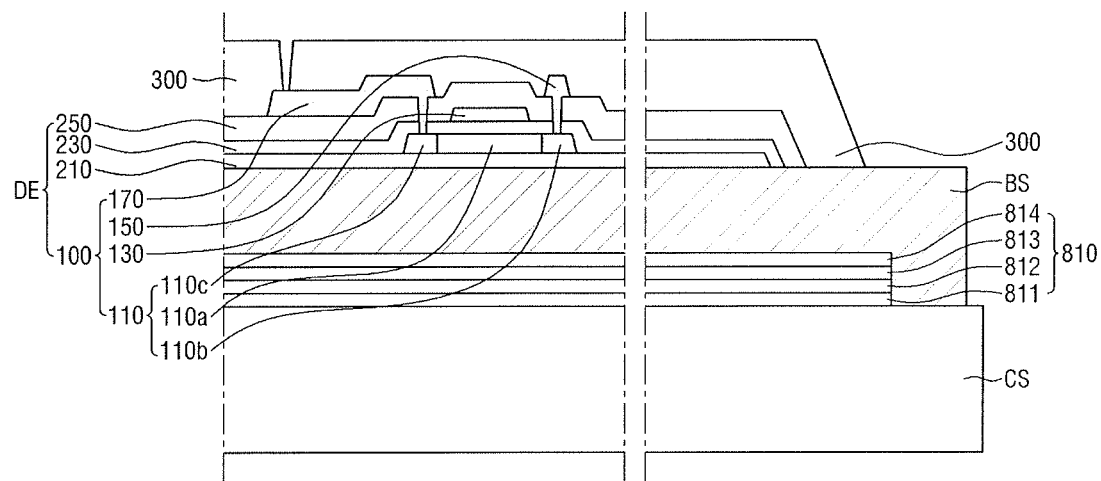

Subsequently, referring to FIG. 32, the method includes forming the planarization layer 300 and the driving element layer DE including the thin-film transistor 100, auxiliary electrodes, wires, and a plurality of insulating layers 230 and 250 on the base BS.

In an example embodiment, the formation of the driving element layer DE and/or the formation of the planarization layer 300 may include performing heat treatment at or over about 450° C. The driving element layer DE and the planarization layer 300 have been described above, and repetitive description thereof will be omitted.

Figure 33:
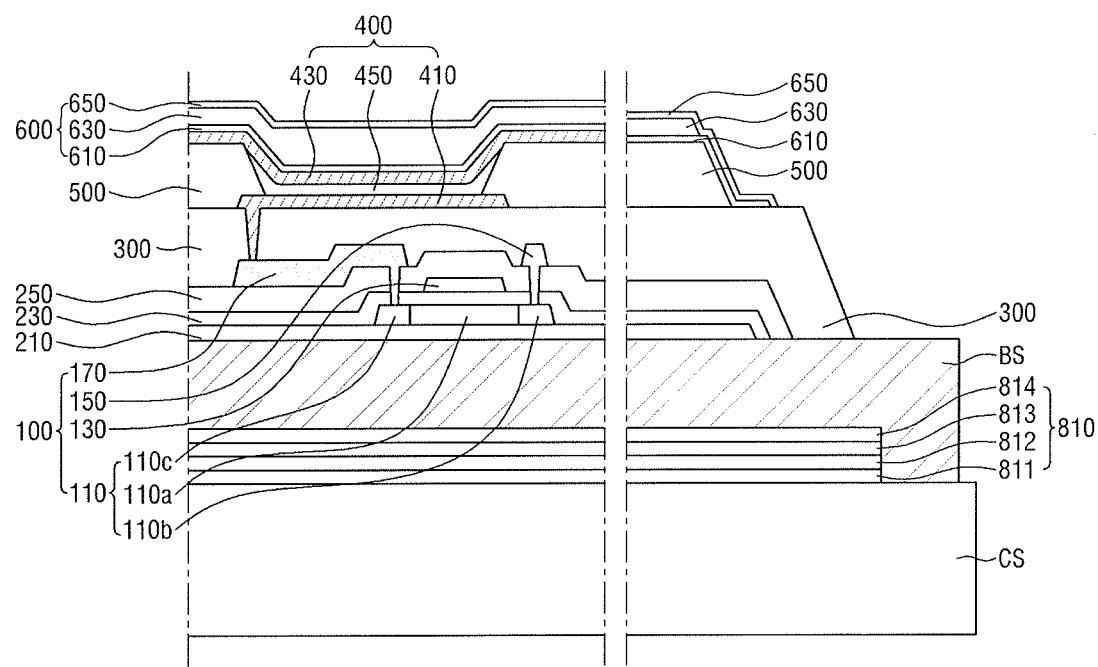

Subsequently, referring to FIG. 33, the method includes forming the light emitting device 400 and the encapsulation layer 600 on the planarization layer 300. In an example embodiment, the formation of the light emitting device 400 and/or the formation of the encapsulation layer 600 may include performing heat treatment at or over about 450° C. The light emitting device 400 and the encapsulation layer 600 have been described above, and thus repetitive description thereof will be omitted.

Subsequently, referring to FIG. 34, the method includes partially cutting an edge of the base BS to partially expose the temporary adhesive layer 810. The cutting of the edge of the base BS may be performed by using a cutting knife NF or the like. When the carrier substrate CS and the base BS may have a planar shape of a rectangle, a cut portion may also have a rectangular shape along the edge of the base BS.

In an example embodiment, the partial cutting of the edge of the base BS may include cutting an edge of the base BS overlapping with the temporary adhesive layer 810 and partially cutting an edge of the temporary adhesive layer 810.

Figure 34:
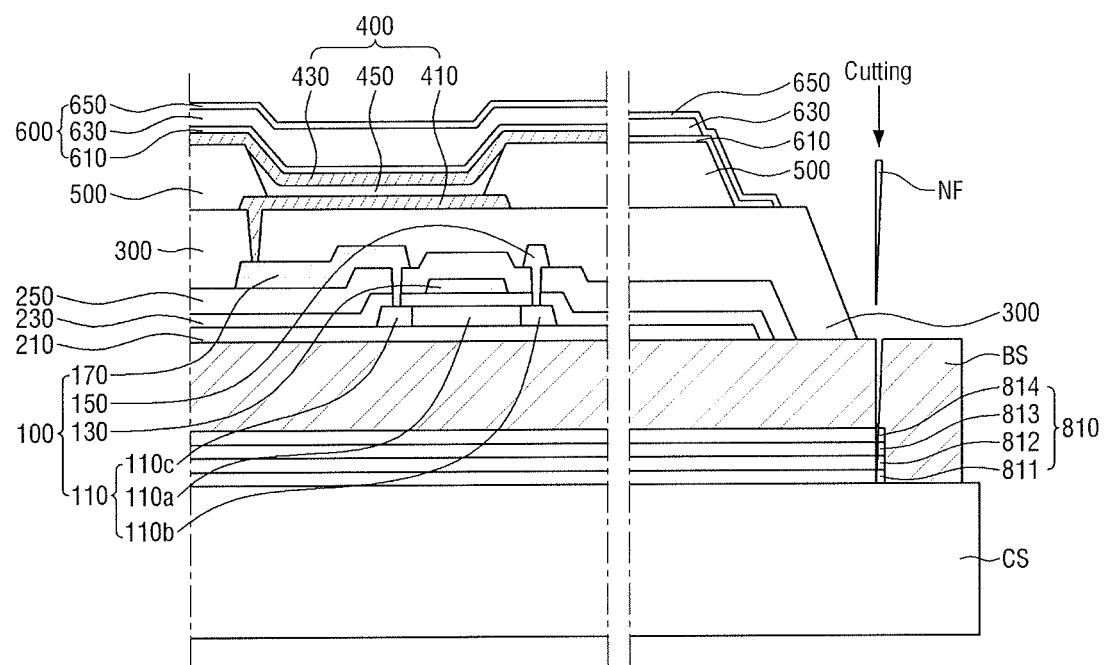

FIG. 34 illustrates a case in which the knife NF penetrates up to the first temporary adhesive layer 811 to expose all of the side surfaces of the first temporary adhesive layer 811, the second temporary adhesive layer 812, the third temporary adhesive layer 813, and the fourth temporary adhesive layer 814. However, in another embodiment, only some of the temporary adhesive layers 810 may be exposed. For example, the knife NF penetrates up to the third temporary adhesive layer 813 to expose the side surfaces of the third temporary adhesive layer 813 and the fourth temporary adhesive layer 814 while the side surfaces of the first temporary adhesive layer 811 and the second temporary adhesive layer 812 may be covered by the base BS and not be exposed.

Figure 35:
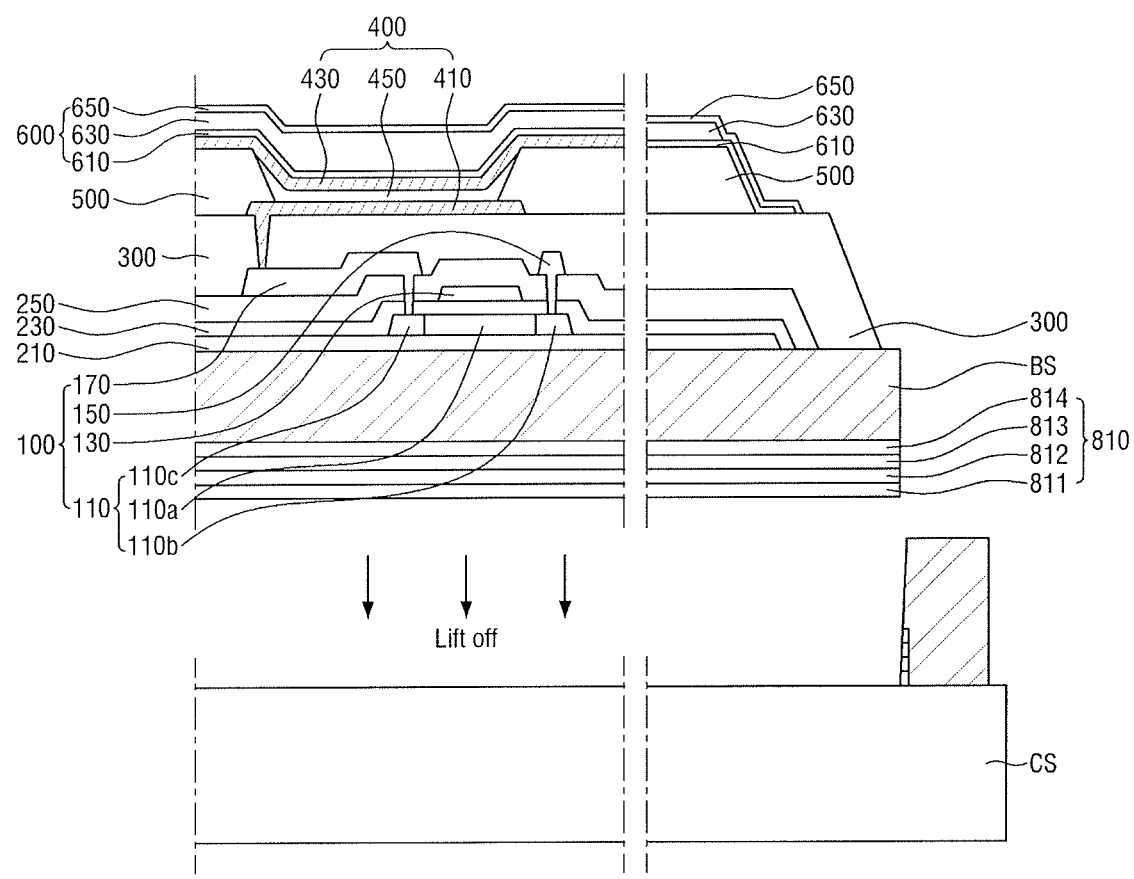
Figure 36:
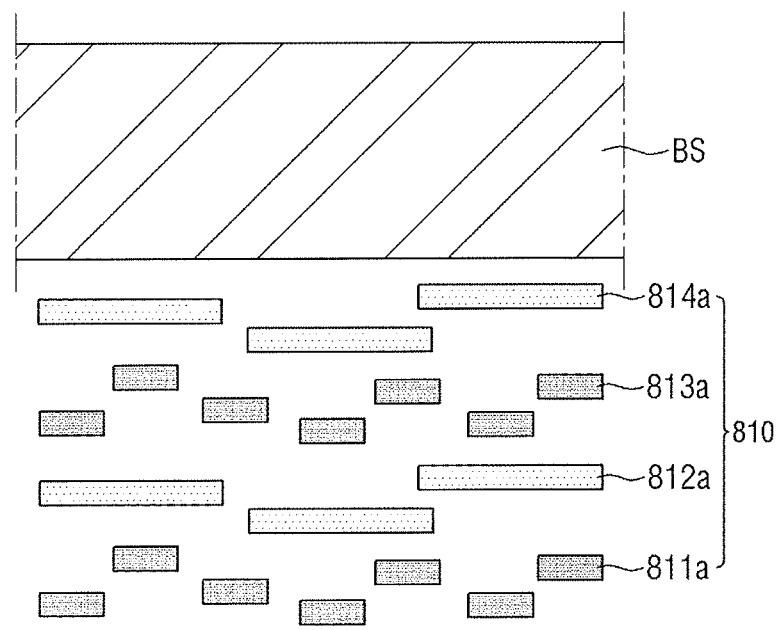

FIG. 35 is a diagram showing an operation of lifting off the carrier substrate CS from the base BS, and FIG. 36 is a schematic diagram showing a charge state of the temporary adhesive layer 810 of FIG. 35.

Referring to FIGS. 35 and 36, the method includes lifting off the carrier substrate CS from the base BS. In an example embodiment, the lifting-off of the carrier substrate CS from the base BS may include mechanically lifting off, e.g., peeling or pulling, the carrier substrate CS from the base BS. For example, by lifting off the carrier substrate CS through a mechanical method rather than by a laser, it is possible to prevent the base BS or the like from being damaged by the laser, but the present disclosure is not limited thereto. It is also possible to reduce maintenance costs of the laser and simplify processing.

Also, the mechanical lifting-off of the carrier substrate CS may include fastening a layered body including the base BS, the driving element layer DE, and the light emitting device 400, fastening the carrier substrate CS, and lifting off the carrier substrate CS from the layered body (BS, DE, and 400). The lifting-off may be performed while the layered body (BS, DE, and 400) is substantially not rolled.

For example, when a flexible layered body (BS, DE, and 400) is lifted off using a method such as a roll-off, there may be a reduction in display quality of the display device due to excessive stress applied to the layered body (BS, DE, and 400), but the present disclosure is not limited thereto. However, when the method of manufacturing the display device according to this embodiment is used, it is possible for just the carrier substrate CS to be lifted off in an approximately vertical direction or in a predetermined diagonal direction while the layered body (BS, DE, and 400) is fastened. Thus, the carrier substrate CS may be lifted off while the stress applied to the layered body (BS, DE, and 400) is minimized.

The first temporary adhesive layer 811 and the carrier substrate CS, which are temporarily adhered to each other by a weak bonding force (e.g., a vertical weak bonding force) such as a van der Waals force, may be easily separated from each other. In this operation, the adhesive force between the base BS and the carrier substrate CS may be less than or equal to about 5.0 gf/in, but the present disclosure is not limited thereto. The adhesive force between the base BS and the carrier substrate CS may have a lower limit of about 1.0 gf/in. By allowing the base BS and the carrier substrate CS to have a weak adhesive force ranging from about 1.0 gf/in to about 5.0 gf/in, the carrier substrate CS may be easily lifted off without damage to the driving element layer DE, the light emitting device 400, and so on.

The weak adhesive force between the base BS and the carrier substrate CS may satisfy the range by increasing the extent to which plate-like inorganic particles cover the carrier substrate CS and/or the base BS in the temporary adhesive layer 810. That is, it is possible to adjust, e.g., increase or decrease, an adhesive force between the temporary adhesive layer 810 and the base BS and between the temporary adhesive layer 810 and the carrier substrate CS by adjusting, e.g., maximizing or minimizing, voids between the plate-like inorganic particles. For example, the above range of adhesive force may be achieved by densely arranging the plate-like inorganic particles.

The extent to which the plate-like inorganic particles in the temporary adhesive layer 810 cover the temporary adhesive layer 810. e.g., the area of the base BS or the carrier substrate CS overlapping with the third temporary adhesive layer 813 and the fourth temporary adhesive layer 814, may be greater than or equal to about 85.0%, 90.0%, or 95.0%, but the present disclosure is not limited thereto. That is, the ratio of the area occupied by the plate-like inorganic particles to the area occupied by the voids between the plate-like inorganic particles may be greater than or equal to about 85:15 or about 90:10.

The temporary adhesive layer 810 may remain on the rear surface (a lower surface in FIG. 35) of the base BS. As described above, in the operation of heat-treating the temporary adhesive layer 810, at least a portion of the first temporary adhesive layer 811, the second temporary adhesive layer 812, the third temporary adhesive layer 813, and the fourth temporary adhesive layer 814 may have lost charge and be substantially neutral.

In the cutting of the temporary adhesive layer 810, a portion of the base BS and/or a portion of the temporary adhesive layer 810 that remains after the cutting may be removed along with the carrier substrate CS.

Subsequently, referring to FIG. 37, the method may include partially removing the temporary adhesive layer 810 disposed on the rear surface of the base BS. In an example embodiment, the partial removal of the temporary adhesive layer 810 may include partially removing the temporary adhesive layer 810 through dry-etching to partially expose the rear surface of the base BS. The temporary adhesive layer 810 remaining on the rear surface of the base BS may be positioned in both a region corresponding to the display area of the display device and a region corresponding to the non-display area.

Figure 37:
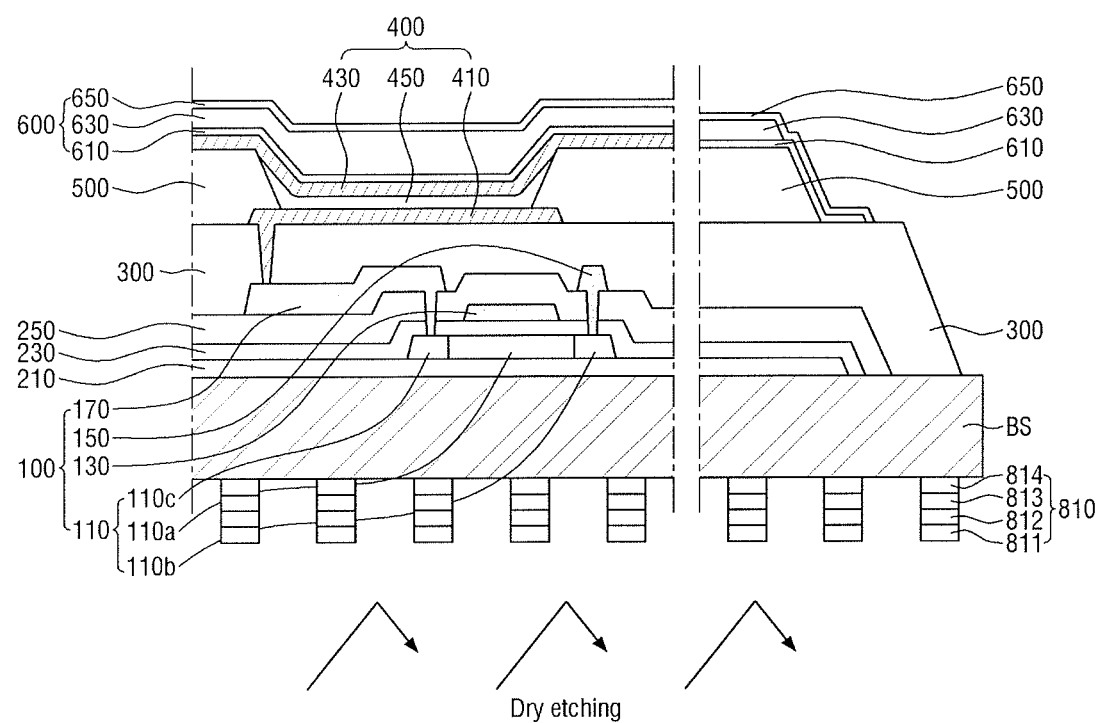

FIG. 37 illustrates a case in which the first temporary adhesive layer 811, the second temporary adhesive layer 812, the third temporary adhesive layer 813, and the fourth temporary adhesive layer 814 are all uniformly removed. However, the first temporary adhesive layer 811, the second temporary adhesive layer 812, the third temporary adhesive layer 813, and the fourth temporary adhesive layer 814 may be removed to different degrees. For example, the degree to which the first temporary adhesive layer 811 is removed may be greater than the degree to which the second temporary adhesive layer 812 is removed, the degree to which the second temporary adhesive layer 812 is removed may be greater than the degree to which the third temporary adhesive layer 813 is removed, or the degree to which the third temporary adhesive layer 813 is removed may be greater than the degree to which the fourth temporary adhesive layer 814 is removed. The resultant structure may correspond to that of the embodiment in FIG. 19.

Figure 38:
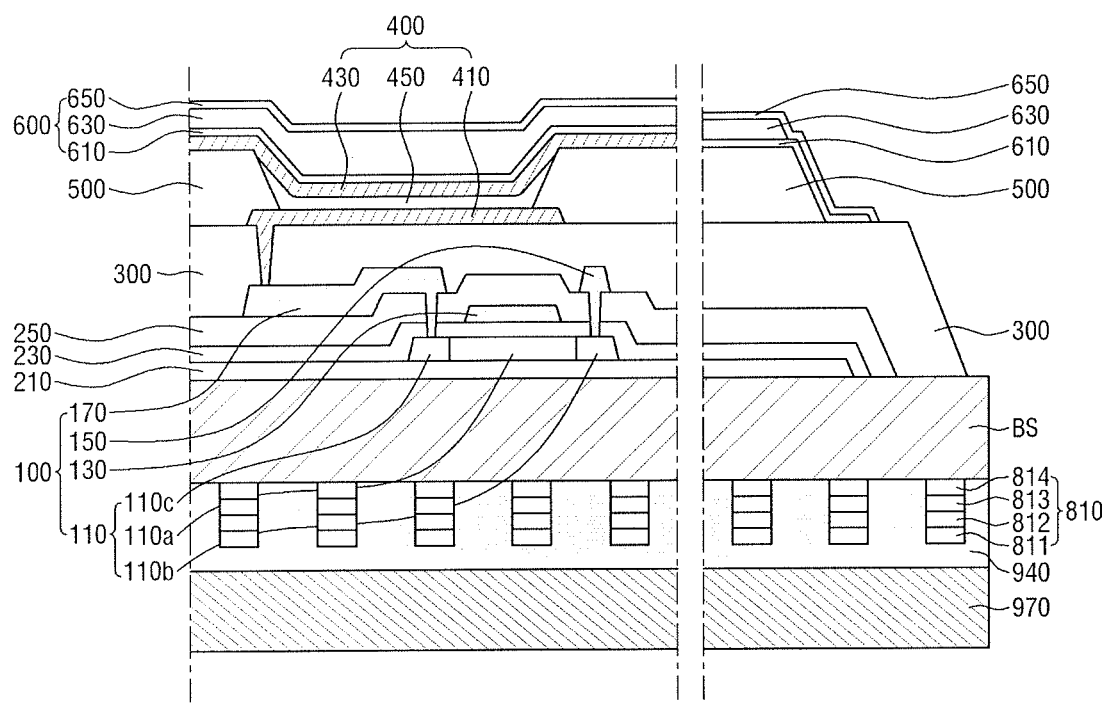
Figure 39:
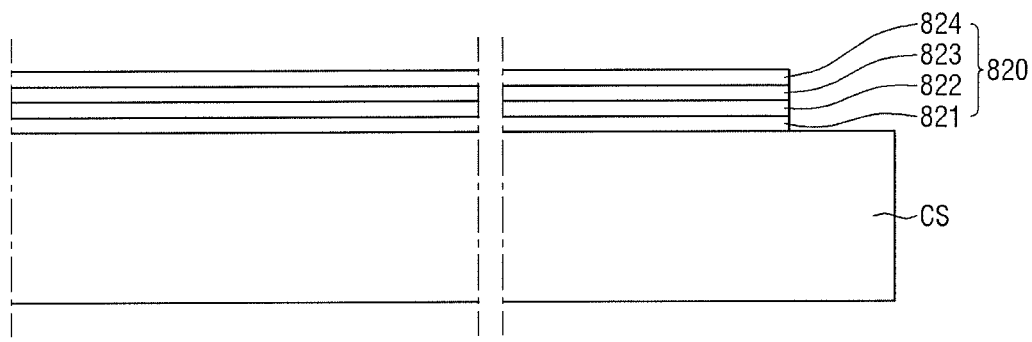
FIGS. 39 to 43 illustrate diagrams of stages in a method of manufacturing a display device according to another embodiment.

Subsequently, referred to FIG. 38, the method may include positioning the functional sheet 970 on the rear surface of the base BS. The functional sheet 970 has been described above, and repetitive description thereof will be omitted.

The base BS and the functional sheet 970 may be bonded by interposing the adhesive layer 940 therebetween. In an example embodiment, the adhesive layer 940 may be brought into contact with the base BS, the temporary adhesive layer 810, and the functional sheet 970. By partially removing the temporary adhesive layer 810 to partially expose the surface of the base BS, it is possible to bring the adhesive layer 940 and the base BS into contact with each other and increase a bond force between the base BS and the functional sheet 970.

With the method of manufacturing the display device according to this embodiment, it is possible to stably form the driving element layer DE and the light emitting device 400 by using the carrier substrate CS even when the base BS is flexible. Also, by using a temporary adhesive layer containing plate-like inorganic particles as the temporary adhesive layer 810 between the carrier substrate CS and the base BS, it is possible to easily lift off the carrier substrate through a mechanical method, rather than by using a laser or the like, when the carrier substrate CS is lifted off after a process of forming the light emitting device 400 is completed.

In addition, it is possible to achieve excellent thermal stability for subsequent processes by using plate-like inorganic particles, instead of polymeric materials such as ethyleneimine-based polymers, as the temporary adhesive layer for temporarily fastening the base BS and the carrier substrate CS.

For example, when the formation of the driving element layer DE, the planarization layer 300, the light emitting device 400, and/or the encapsulation layer 600 includes performing heat treatment at or above about 450° C., at least some unstable ethyleneimine-based polymers may be thermally decomposed and re-hardened, thus making it difficult to lift off the carrier substrate CS from the base BS. Also, a polymeric material that is partially thermally decomposed and/or re-hardened may remain on the rear surface of the base BS and cause defects such as pores. The pores may be visible on the entire surface of the display device.

In contrast, in the method of manufacturing a display device according to the present embodiment, it is possible to form the temporary adhesive layer 810 having a bond force such as a van der Walls force by using only plate-like inorganic particles with excellent thermal stability. Further, by increasing the coverage by the plate-like inorganic particles, it is possible to achieve an extremely low adhesive force and reduce the required number of dyads in the temporary adhesive layer 810.

A method of manufacturing the display device according to the other embodiments of the present disclosure will be described below.

FIGS. 39 to 43 are diagrams for describing a method of manufacturing a display device according to another embodiment of the present disclosure.

Figure 40:
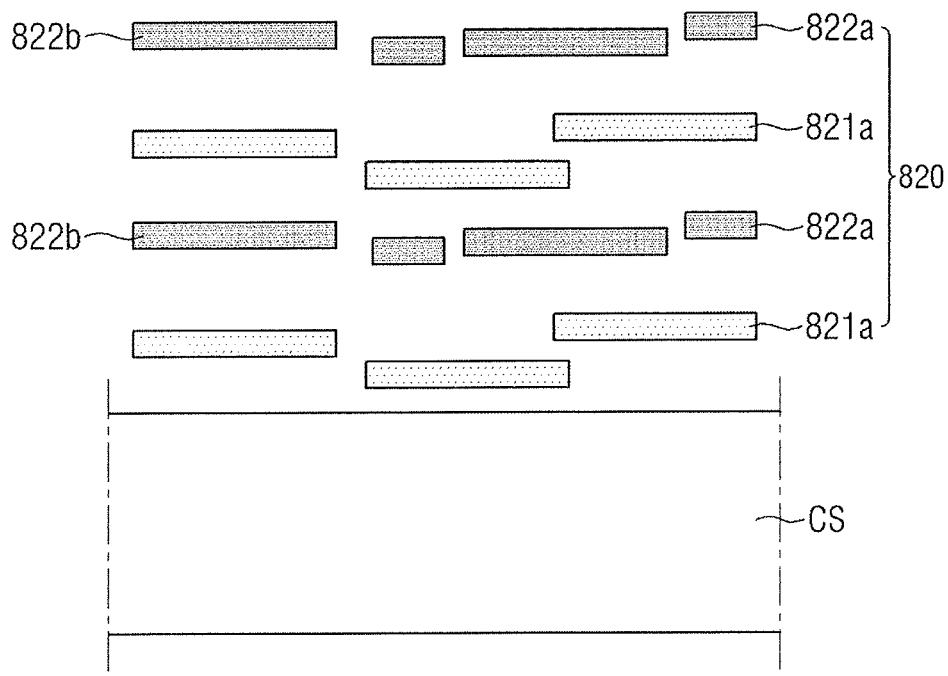

First, referring to FIGS. 30 and 40, the method includes forming a temporary adhesive layer 820 including a first temporary adhesive layer 821, a second temporary adhesive layer 822, a third temporary adhesive layer 823, and a fourth temporary adhesive layer 824 on a carrier substrate CS and heat-treating the temporary adhesive layer 820.

In an example embodiment, the first temporary adhesive layer 821 and the third temporary adhesive layer 823 may include a first plate-like inorganic particle 821a having a first size. Also, the second temporary adhesive layer 822 and the fourth temporary adhesive layer 824 may include a second plate-like inorganic particle 822a having a second size smaller than the first size and a third plate-like inorganic particle 822b having a third size larger than the second size.

The first plate-like inorganic particle 821a and the second plate-like inorganic particle may be different kinds of plate-like inorganic objects, and the second plate-like inorganic particle 822a and the third plate-like inorganic particle 822b may be substantially the same kind of plate-like inorganic particle. For example, the first plate-like inorganic particle 821a is the graphene oxide particle shown in FIG. 5, and the second plate-like inorganic particle 822a and the third plate-like inorganic particle 822b may be the graphene oxide particle shown in FIG. 4. In a different embodiment, the first plate-like inorganic particle 821a is the graphene oxide particle shown in FIG. 4, and the second plate-like inorganic particle 822a and the third plate-like inorganic particle 822b may be the graphene oxide particle shown in FIG. 5.

The second plate-like inorganic particle 822a and the third plate-like inorganic particle 822b in the second temporary adhesive layer 822 and the fourth temporary adhesive layer 824 may have the same sizes and arrangements as those of the particle-plate inorganic particles shown in FIGS. 6 and 7, and thus repetitive description thereof will be omitted. For example, the third size of the third plate-like inorganic particle 822b may be greater than or equal to about 6 times, 6.1 times, 6.2 times, 6.3 times, 6.4 times, or 6.5 times the second size of the second plate-like inorganic particle 822a. The first size of the first plate-like inorganic particle 821a may be substantially the same as or different from the third size of the third plate-like inorganic particle 822b.

The first plate-like inorganic particles 821a of the first temporary adhesive layer 821 and the third temporary adhesive layer 823 may have a relatively large size and may contribute to enhancement of primary coverage by plate-like inorganic particles in the temporary adhesive layer 820. Also, the second plate-like inorganic particle 822a and the third plate-like inorganic particle 822b of the second temporary adhesive layer 822 and the fourth temporary adhesive layer 824 may have stable arrangements and minimize voids between the plate-like inorganic particles. Also, it is possible to diversify a bonding force between the temporary adhesive layers 820 to improve a coating property and also to minimize an adhesive force between the base BS and the carrier substrate CS.

The heat-treated temporary adhesive layer 820 may be unpolarized and substantially neutralized. This step has been described with reference to FIGS. 21 to 30, and thus repetitive description thereof will be omitted.

Figure 41:
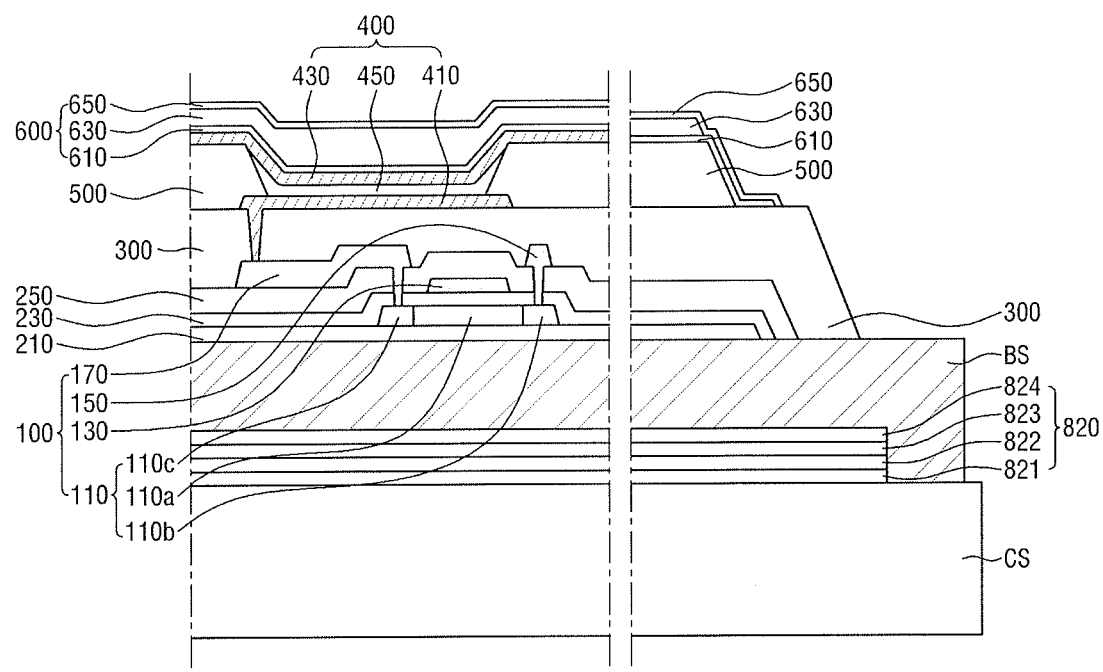

Subsequently, referring to FIG. 41, the method includes forming a base BS, a driving element layer DE, a planarization layer 300, a light emitting device 400, and a encapsulation layer 600 on the temporary adhesive layer 820. This step has been described with reference to FIGS. 31 to 33, and thus repetitive description thereof will be omitted.

Figure 42:
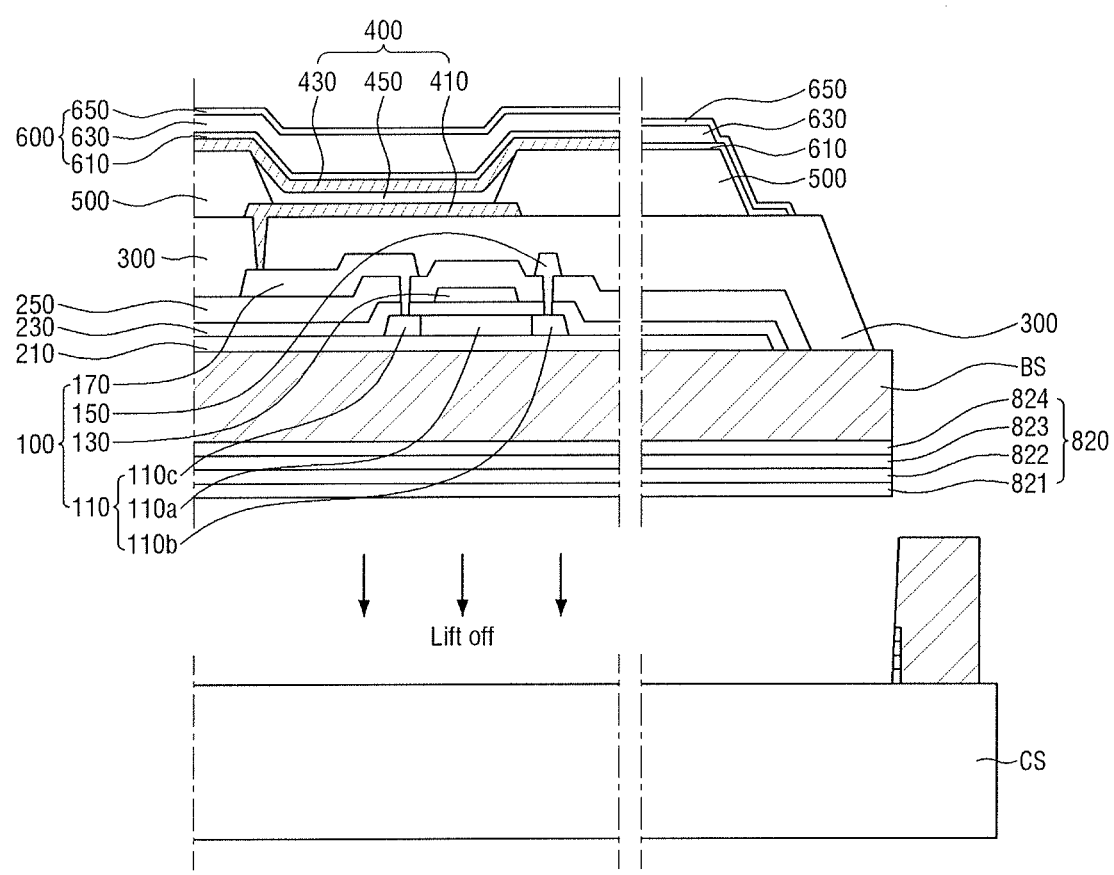
Figure 43:
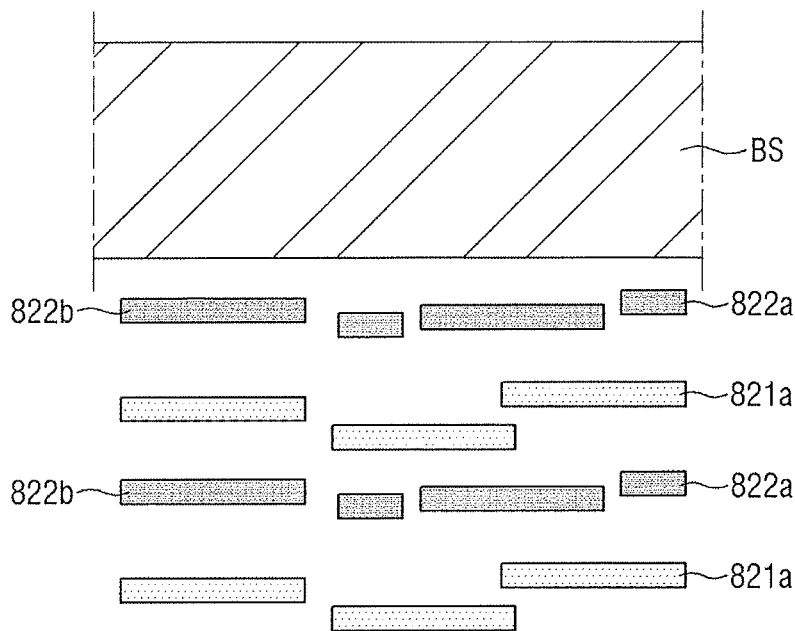

FIG. 42 is a diagram showing an operation of lifting off the carrier substrate CS from the base BS, and FIG. 43 is a schematic diagram showing a charge state of the temporary adhesive layer 820 of FIG. 42.

Referring to FIGS. 42 and 43, the method includes partially cutting an edge of the base BS and lifting off the carrier substrate CS from the base BS. This step has been described with reference to FIGS. 34 to 36, and thus repetitive description thereof will be omitted.

As described above, the first temporary adhesive layer 821, the second temporary adhesive layer 822, the third temporary adhesive layer 823, and the fourth temporary adhesive layer 824 remaining on the rear surface of the base BS may be substantially neutralized.

Although not shown, in some embodiments, the method may further include partially removing the temporary adhesive layer 820 disposed on the rear surface of the base BS and interposing an adhesive layer (not shown) on the rear surface of the base BS to position a functional sheet (not shown).

FIGS. 44 to 48 are diagrams for describing a method of manufacturing the display device according to still another embodiment of the present disclosure.

Figure 44:
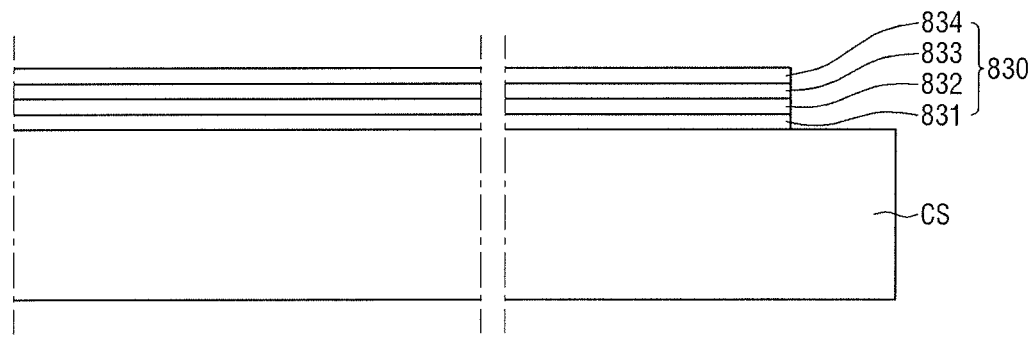
FIGS. 44 to 54 illustrate diagrams of stages in methods of manufacturing display devices according to still other embodiments.
Figure 45:
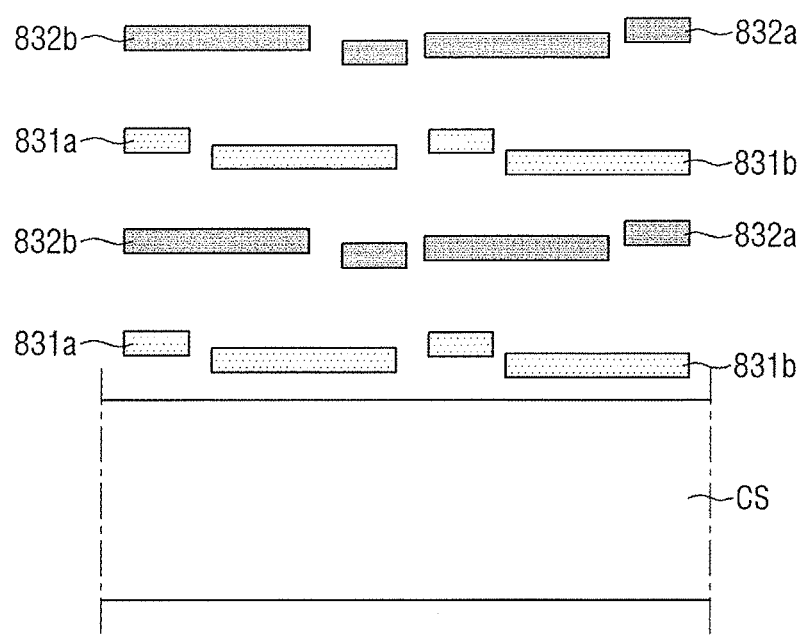

First, referring to FIGS. 44 and 45, the method includes forming a temporary adhesive layer 830 including a first temporary adhesive layer 831, a second temporary adhesive layer 832, a third temporary adhesive layer 833, and a fourth temporary adhesive layer 834 on a carrier substrate CS and heat-treating the temporary adhesive layer 830.

In an example embodiment, the first temporary adhesive layer 831 and the third temporary adhesive layer 833 may include a first plate-like inorganic particle 831a having a first size and a second plate-like inorganic particle 831b having a second size larger than the first size. Also, the second temporary adhesive layer 832 and the fourth temporary adhesive layer 834 may include a third plate-like inorganic particle 832a having a third size larger than the second size and a fourth plate-like inorganic particle 832b having a fourth size larger than the third size.

The first plate-like inorganic particle 831a and the second plate-like inorganic particle 831b may be substantially the same kind of plate-like inorganic particle, and the third plate-like inorganic particle 832a and the fourth plate-like inorganic particle 832b may be substantially the same kind of plate-like inorganic particle. Also, the first plate-like inorganic particle 831a and the third plate-like inorganic particle 832a may be different kinds of plate-like inorganic particles. For example, the first plate-like inorganic particle 831a and the second plate-like inorganic particle 831b may be the graphene oxide particle shown in FIG. 5, and the third plate-like inorganic particle 832a and the fourth plate-like inorganic particle 832b may be the graphene oxide particle shown in FIG. 4. In another embodiment, the first plate-like inorganic particle 831a and the second plate-like inorganic particle 831b may be the graphene oxide particle shown in FIG. 4, and the third plate-like inorganic particle 832a and the fourth plate-like inorganic particle 832b may be the graphene oxide particles shown in FIG. 5.

The first plate-like inorganic particle 831a, the second plate-like inorganic particle 831b, the third plate-like inorganic particle 832a, and the fourth plate-like inorganic particle 832b in the temporary adhesive layer 830 may have the same sizes and arrangements as those of the plate-like inorganic particles that have been described in FIGS. 6 and 7, and repetitive description thereof will be omitted. For example, the second size of the second plate-like inorganic particle 831b may be greater than or equal to about 6 times, 6.1 times, 6.2 times, 6.3 times, 6.4 times, or 6.5 times the first size of the first plate-like inorganic particle 831a. Also, the fourth size of the fourth plate-like inorganic particle 832b may be greater than or equal to about 6 times, 6.1 times, 6.2 times, 6.3 times, 6.4 times, or 6.5 times the third size of the third plate-like inorganic particle 832a. The first size of the first plate-like inorganic particle 831a may be substantially the same as or different from the third size of the third plate-like inorganic particle 832a, and the second size of the second plate-like inorganic particle 831b may be substantially the same as or different from the fourth size of the fourth plate-like inorganic particle 832b.

The heat-treated temporary adhesive layer 830 may be unpolarized and substantially neutralized. This step has been described with reference to FIGS. 21 to 30, and thus repetitive description thereof will be omitted.

Figure 46:
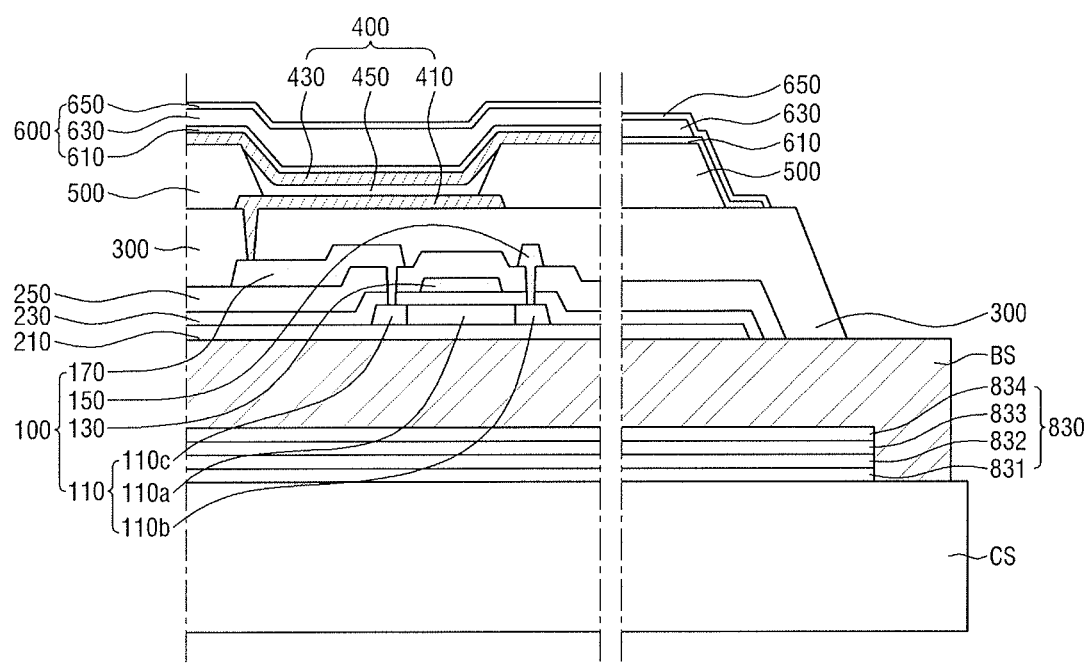

Subsequently, referring to FIG. 46, the method includes forming a base BS, a driving element layer DE, a planarization layer 300, a light emitting device 400, and a encapsulation layer 600 on the temporary adhesive layer 830. This step has been described with reference to FIGS. 31 to 33, and thus repetitive description thereof will be omitted.

Figure 47:
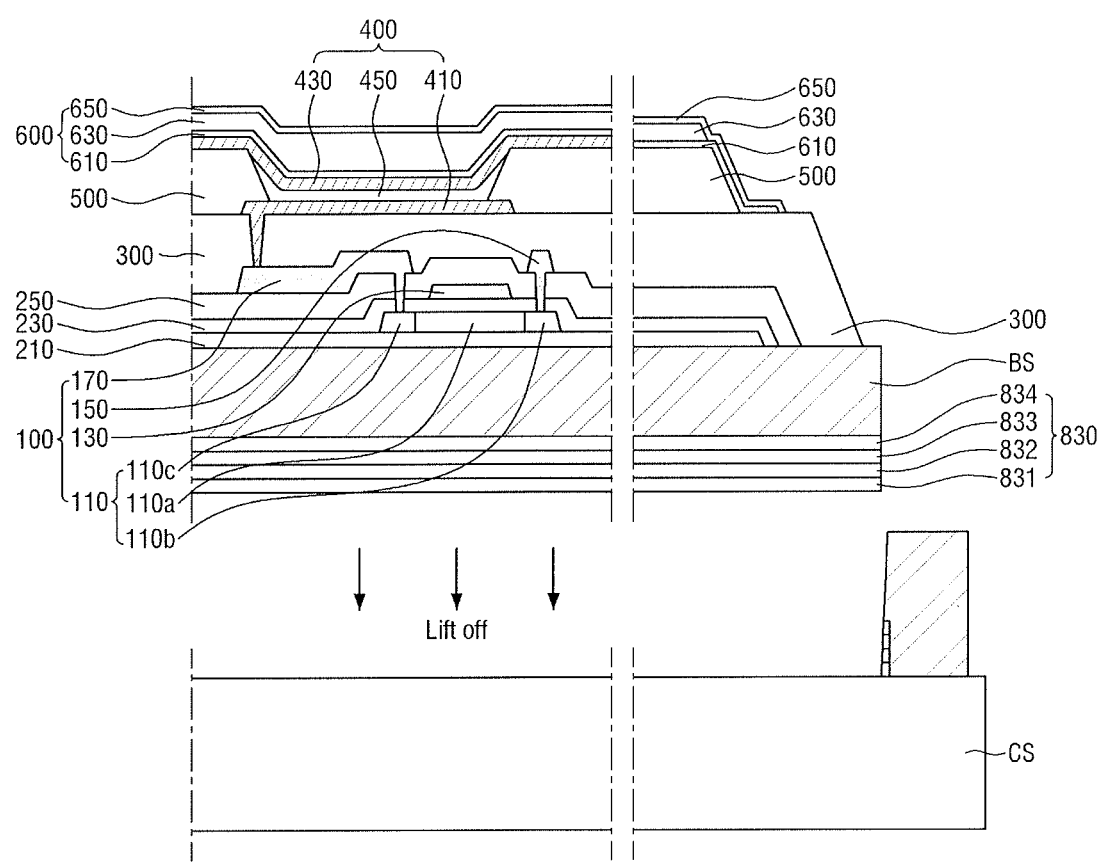
Figure 48:
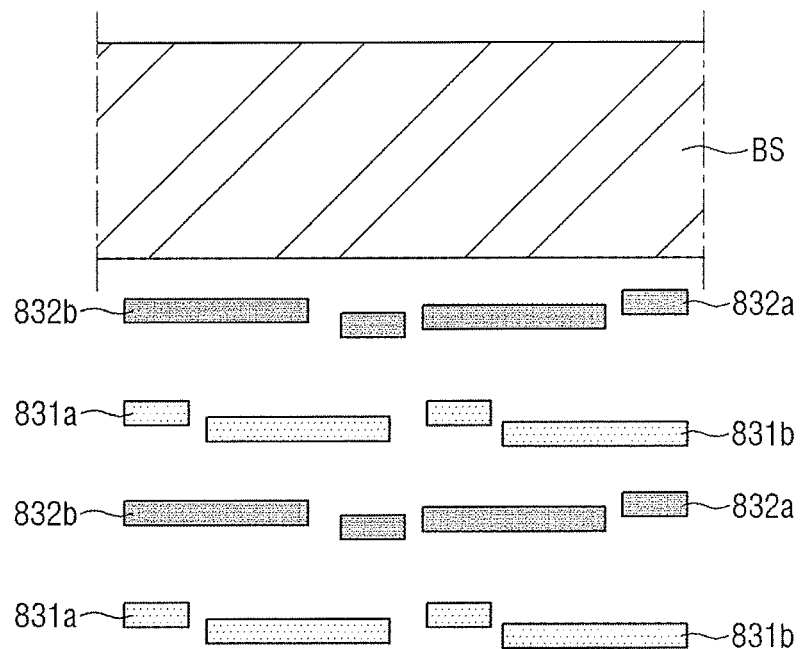

FIG. 47 is a diagram showing an operation of lifting off the carrier substrate CS from the base BS, and FIG. 48 is a schematic diagram showing a charge state of the temporary adhesive layer 830 of FIG. 47.

Referring to FIGS. 47 and 48, the method includes partially cutting an edge of the base BS and lifting off the carrier substrate CS from the base BS. This step has been described with reference to FIGS. 34 to 36, and thus repetitive description thereof will be omitted.

As described above, the first temporary adhesive layer 831 the second temporary adhesive layer 832, the third temporary adhesive layer 833, and the fourth temporary adhesive layer 834 remaining on the rear surface of the base BS may be substantially neutralized.

Although not shown, in some embodiments, the method may further include partially removing the temporary adhesive layer 830 disposed on the rear surface of the base BS and interposing an adhesive layer on the rear surface of the base BS to position a functional sheet.

Figure 49:
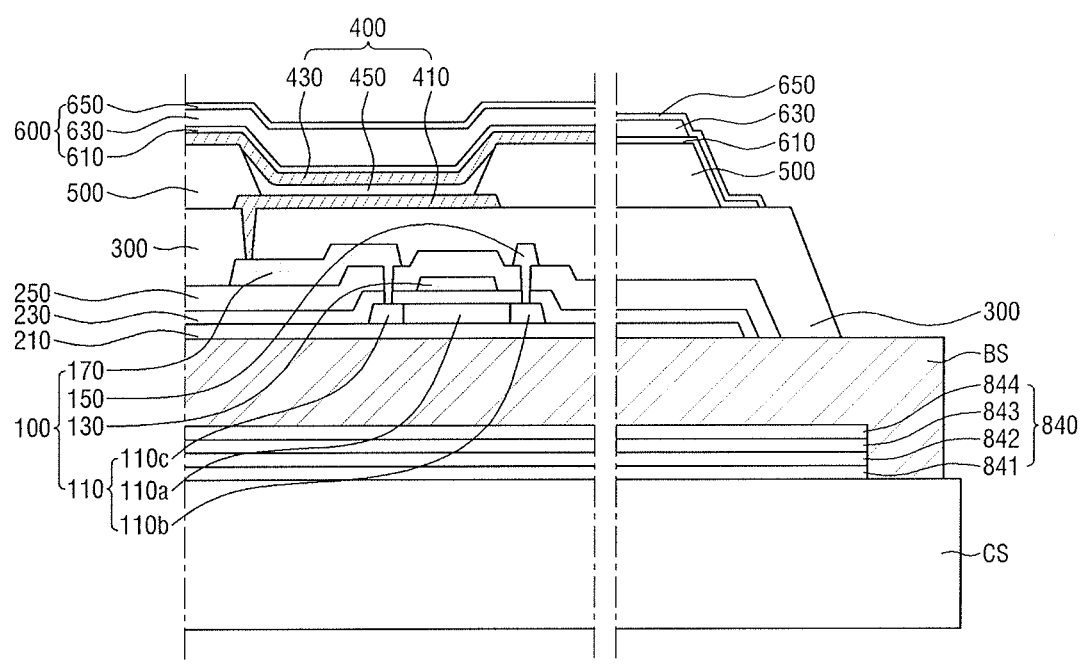
Figure 50:
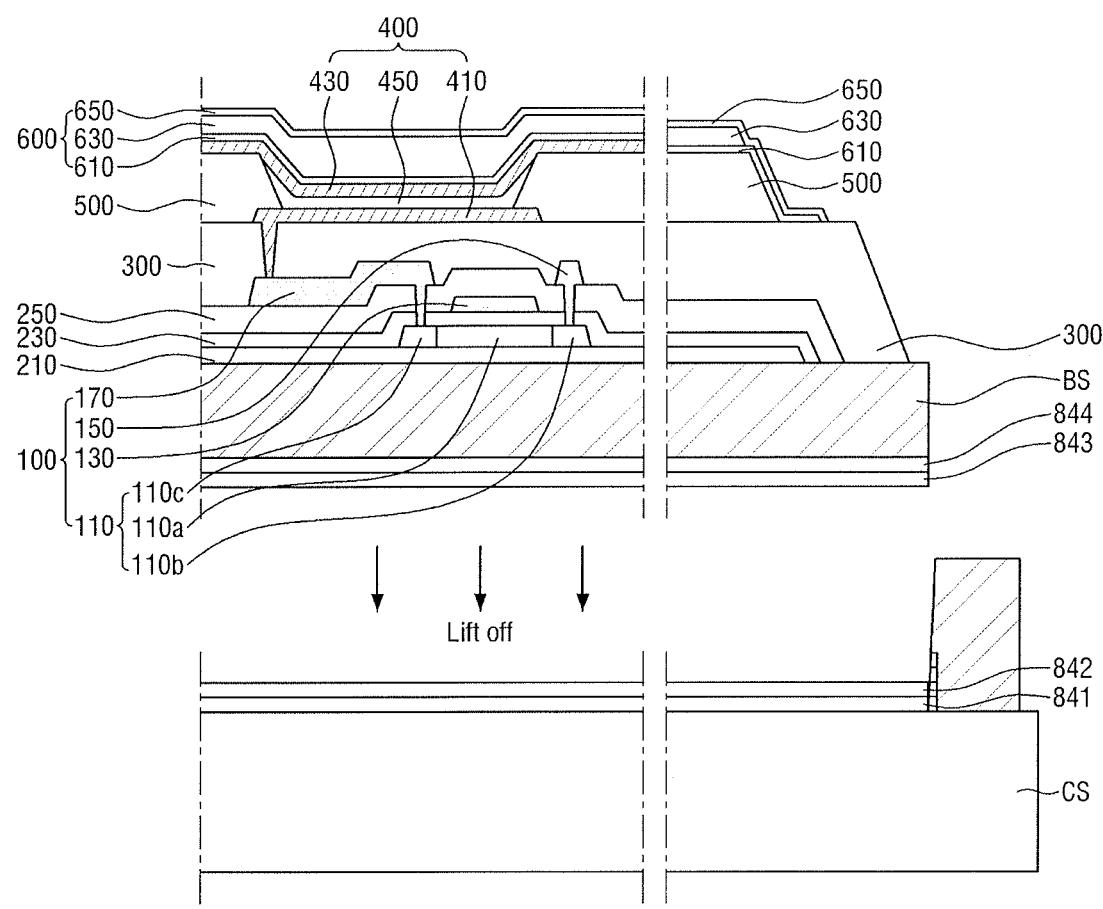
Figure 51:
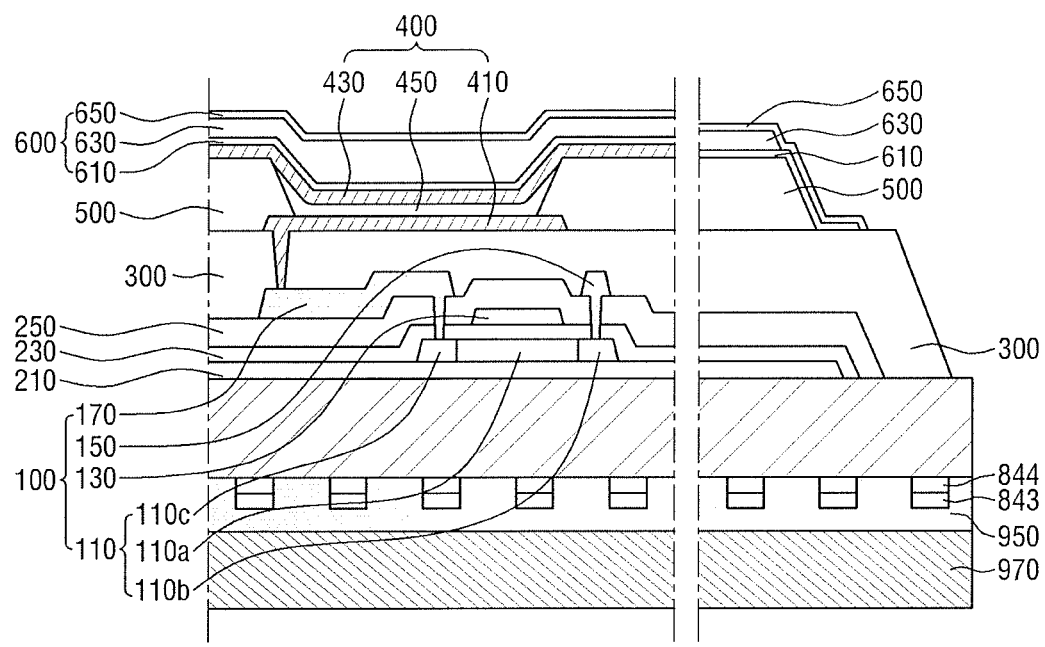

FIGS. 49 to 51 are diagrams for describing a method of manufacturing the display device according to still another embodiment of the present disclosure.

First, referring to FIG. 49, the method includes forming a temporary adhesive layer 840, a base BS, a driving element layer DE, a planarization layer 300, a light emitting device 400, and an encapsulation layer 600 on a carrier substrate CS. This step has been described with reference to FIGS. 21 to 33, and thus repetitive description thereof will be omitted.

Although not shown, a first temporary adhesive layer 841, a second temporary adhesive layer 842, a third temporary adhesive layer 843, and a fourth temporary adhesive layer 844 may be substantially neutralized.

Subsequently, referring to FIG. 50, the method includes partially cutting an edge of the base BS and lifting off the carrier substrate CS from the base BS.

In an example embodiment, the third temporary adhesive layer 843 and the fourth temporary adhesive layer 844 may remain on the rear surface of the base BS, and the first temporary adhesive layer 841 and the second temporary adhesive layer 842 may be lifted off and removed along with the carrier substrate CS. For example, the second temporary adhesive layer 842 and the third temporary adhesive layer 843 that have been unpolarized and temporarily adhered to each other by a weak bonding force such as a van der Waals force may be separated at an interface therebetween.

This step has been described with reference to FIGS. 34 to 36, and thus repetitive description thereof will be omitted.

Subsequently, referring to FIG. 51, the method may further include partially removing the third temporary adhesive layer 843 and the fourth temporary adhesive layer 844 disposed on the rear surface of the base BS and interposing an adhesive layer 950 on the rear surface of the base BS to position a functional sheet 970. This step has been described with reference to FIGS. 37 and 38, and thus repetitive description thereof will be omitted.

Figure 52:
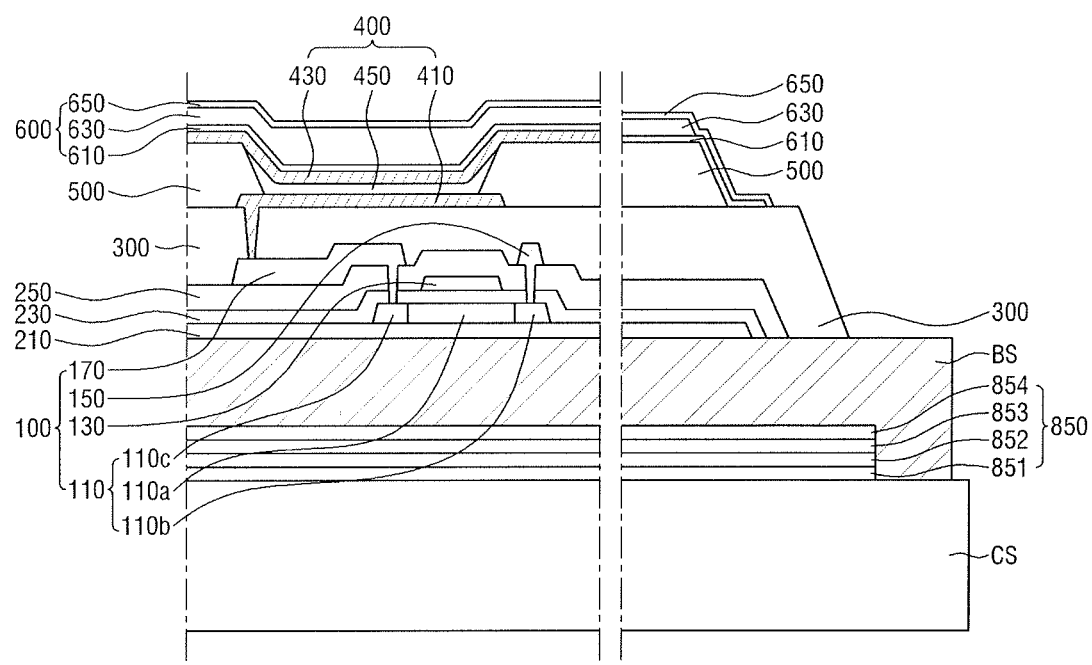
Figure 53:
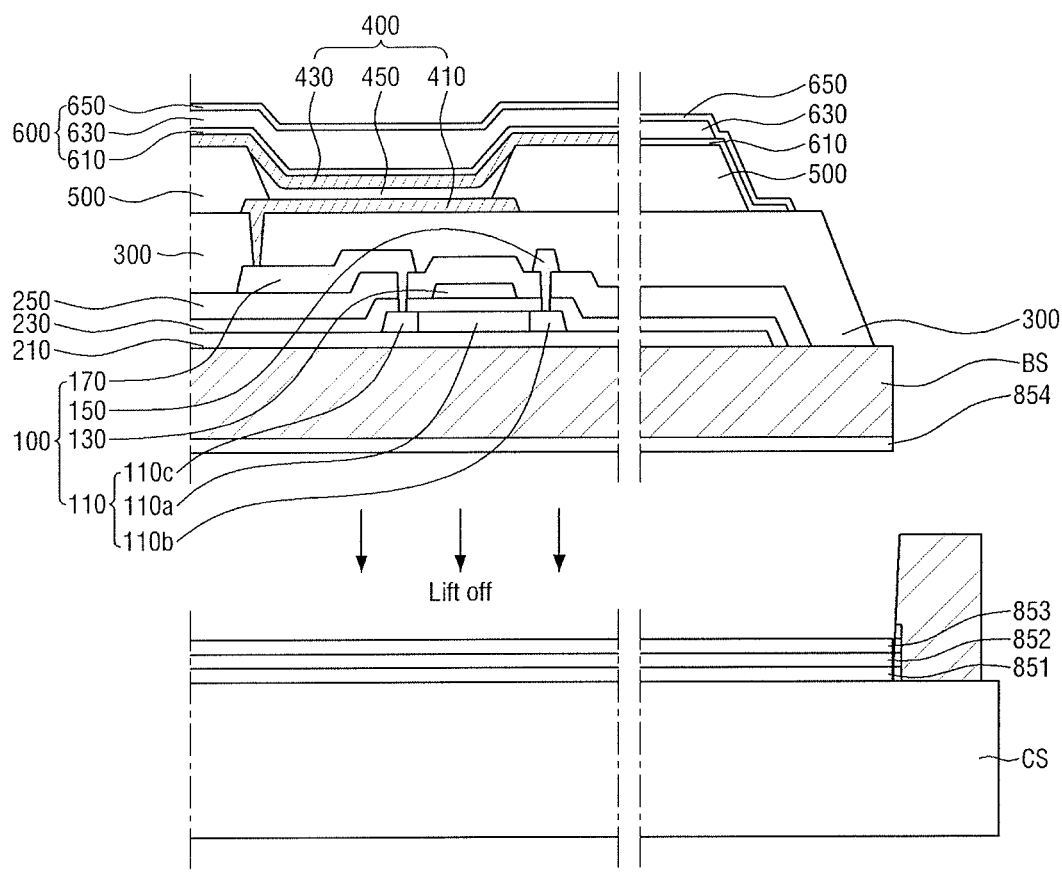
Figure 54:
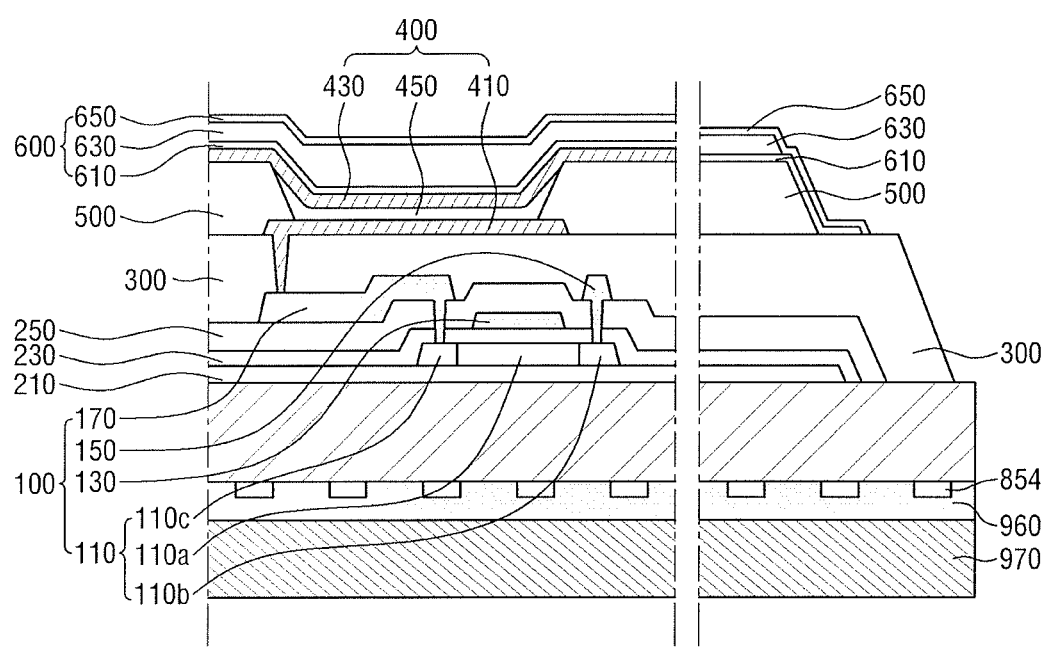

FIGS. 52 to 54 are diagrams for describing methods of manufacturing display devices according to still other embodiments of the present disclosure.

First, referring to FIG. 52, the method includes forming a temporary adhesive layer 850, a base BS, a driving element layer DE, a planarization layer 300, a light emitting device 400, and an encapsulation layer 600 on a carrier substrate CS. This step has been described with reference to FIGS. 21 to 33, and thus repetitive description thereof will be omitted.

Although not shown, a first temporary adhesive layer 851, a second temporary adhesive layer 852, a third temporary adhesive layer 853, and a fourth temporary adhesive layer 854 may be substantially neutralized.

Subsequently, referring to FIG. 53, the method includes partially cutting an edge of the base BS and lifting off the carrier substrate CS from the base BS.

In an example embodiment, the fourth temporary adhesive layer 854 may remain on the rear surface of the base BS, and the first temporary adhesive layer 851, the second temporary adhesive layer 852, and the third temporary adhesive layer 853 may be lifted off and remove along with the carrier substrate CS. For example, the third temporary adhesive layer 853 and the fourth temporary adhesive layer 854 that have been unpolarized and temporarily adhered to each other by a weak bonding force such as a van der Waals force may be separated at an interface therebetween.

This step has been described with reference to FIGS. 34 to 36, and thus repetitive description thereof will be omitted.

Subsequently, referring to FIG. 54, the method may further include partially removing the fourth temporary adhesive layer 854 disposed on the rear surface of the base BS and interposing an adhesive layer 960 on the rear surface of the base BS to position a functional sheet 970. This step has been described with reference to FIGS. 37 and 38, and thus repetitive description thereof will be omitted.

The present disclosure will be described below in more detail with reference to Examples, comparative examples, and an experimental example.

Example 1

As described above, a temporary adhesive layer was formed on a carrier substrate having a surface processed with a negative charge, and the carrier substrate and the temporary adhesive layer was heat-treated and thus unpolarized. Next, a base formed of an imide polymer, a driving element layer, a planarization layer, a light emitting device, and an encapsulation layer were formed on the temporary adhesive layer, and then the carrier substrate was lifted off therefrom. Thus, a display device was manufactured.

Also, a graphene oxide having an amine group capable of forming a positive charge in an aqueous solution was used in a positively charged temporary adhesive layer. A graphene oxide with a diameter of 5 µm and a graphene oxide with a diameter of 30 µm were used as a graphene oxide in the positively charged temporary adhesive layer.

A graphene oxide having a hydroxyl group, a carboxyl group, and an epoxy group capable of forming a negative charge in an aqueous solution was used in a negatively charged temporary adhesive layer. Also, a graphene oxide with a diameter of 5 µm and a graphene oxide with a diameter of 30 µm were used as a graphene oxide in the negatively charged temporary adhesive layer.

Three negatively charged temporary adhesive layers and three positively charged temporary adhesive layers were alternately stacked to form a temporary adhesive layer composed of a total of six layers. That is, the temporary adhesive layer was composed of three dyads.

Example 2

Figure 55:
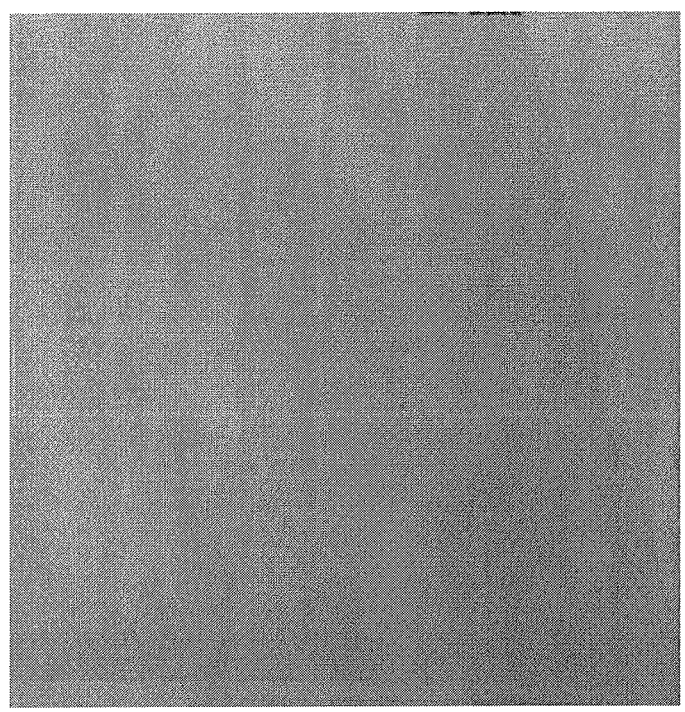
FIG. 55 illustrates an image of a temporary adhesive layer of Example 2.

A display device was manufactured using the same method as that of Example 1, except that the temporary adhesive layer was composed of four dyads. Also, an image of a temporary adhesive layer remaining on the rear of the base while the carrier substrate is lifted off therefrom is shown in FIG. 55.

Comparative Example 1

A temporary adhesive layer was formed on a carrier substrate having a surface processed to have a negative charge, and the carrier substrate and the temporary adhesive layer was heat-treated and thus unpolarized. Next, a base formed of an imide polymer, a driving element layer, a planarization layer, a light emitting device, and an encapsulation layer were formed on the temporary adhesive layer, and then the carrier substrate was lifted off therefrom. Thus, a display device was manufactured.

Polyethyleneimine was used as a polymer electrolyte material in a temporary adhesive layer having a positive charge (instead of a graphene oxide with a positive charge). A graphene oxide was used in a temporary adhesive layer having a negative charge, like in Example 1.

Three temporary adhesive layers having a negative charge and three temporary adhesive layers having a positive charge were alternately stacked to form a temporary adhesive layer composed of a total of six layers. That is, the temporary adhesive layer was composed of three dyads.

Comparative Example 2

Figure 56:
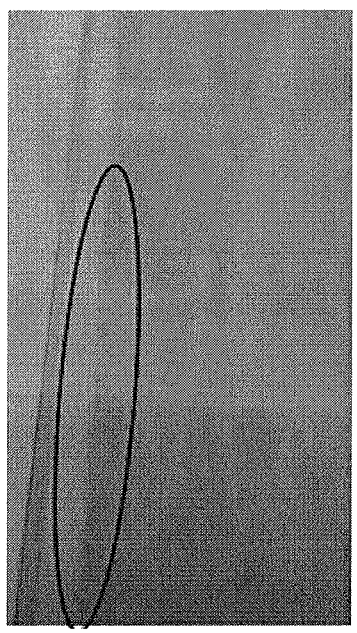
FIG. 56 illustrates an image of a temporary adhesive layer of Comparative Example 2.
Figure 56:
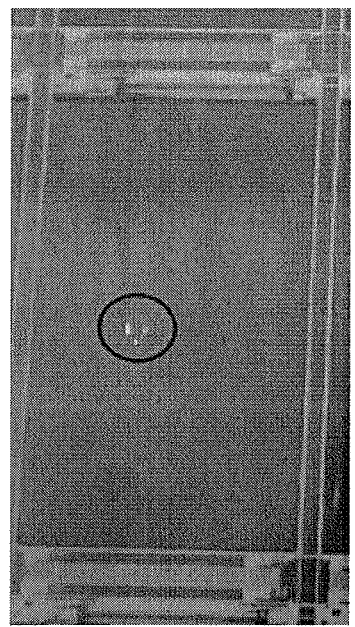
Figure 56:
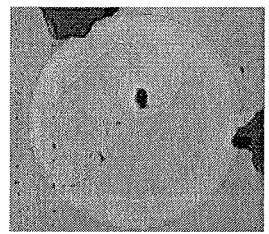

A display device was manufactured in the same method as that of Comparative Example 1, except that the temporary adhesive layer (PEI-nGO adhesive layer) was composed of a relatively high number of four dyads. Also, an image of a temporary adhesive layer remaining on the rear of the base while the carrier substrate is lifted off therefrom is shown in FIG. 56.

Experimental Example

An adhesive force caused by a temporary adhesive layer of Example 1, Example 2, Comparative Example 1, or Comparative Example 2 was measured in the carrier substrate lifting-off process performed while manufacturing a display device.

Specifically, while the carrier substrate or the like was made to stand in a vertical direction, elements such as the base were lifted off upward in the vertical direction. A result of measuring an adhesive force between the carrier substrate and the base by the temporary adhesive layer is shown in FIG. 57.

First, referring to FIG. 55, it can be seen that a temporary adhesive layer of a display device manufactured in Example 2 had a smooth surface.

On the other hand, referring to FIG. 56, it can be seen that despite the adhesion of the temporary adhesive layer of a display device manufactured in Comparative Example 2, the adhesive layer had pores that were partially formed. That is, it can be seen that the temporary adhesive layer of Comparative Example 2, which is based on a polymer, did not have a smoother surface than the temporary adhesive layer of Example 2. The pores of the temporary adhesive layer of Comparative Example 2 may have been formed by the polymer material that was exposed to high temperature, thermally decomposed and/or re-hardened, and then trapped between layers of the temporary adhesive layer during a subsequent process after the formation of the temporary adhesive layer.

Figure 57:
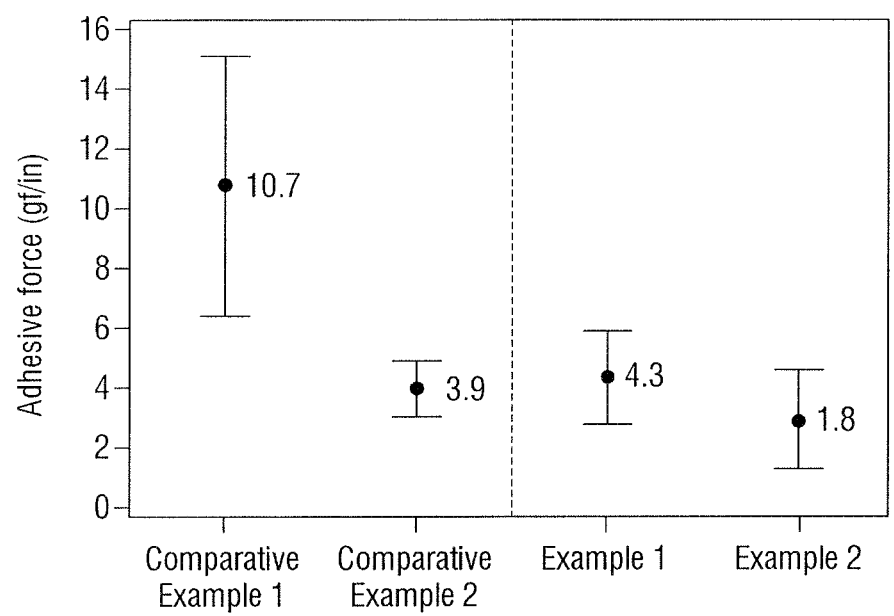
FIG. 57 illustrates a result of an experimental example.

Next, referring to FIG. 57, it can be seen that the adhesive force decreases as the number of dyads increases in both the Examples and the comparative examples. Also, it can be seen that Example 1 and Example 2 in which only a graphene oxide was used for the temporary adhesive layer show a very low level of adhesive force.

As described above, Comparative Example 2 in which a polymer material was used for the temporary adhesive layer has a problem in that pores were generated in the temporary adhesive layer. However, with Example 1 and Example 2 according to the present disclosure, it is possible to prevent the generation of pores by using a graphene oxide with excellent thermal stability for the temporary adhesive layer and also possible to form a temporary adhesive layer with an adhesive force less than or equal to that of Example 2 in which the polymer material was used.

By way of summation and review, when a base of a flexible display device has flexibility, elements on the base cannot be supported during a process of forming a light emitting device or the like disposed on the base. While a method of forming a light emitting device or the like on a carrier substrate having predetermined rigidity, and then lifting off the carrier substrate by a laser may be used, lifting off the carrier substrate by a laser may damage the base. Further, maintenance costs for a laser apparatus may increase process costs, thereby decreasing processability.

In contrast, embodiments are directed to a display device having a structure in which a carrier substrate may be lifted off without any damage. Embodiments are also directed to a method of manufacturing a display device by removing a carrier substrate through a mechanical method, thereby preventing damage to a base and reduced processability. Embodiments are also directed to providing a display device manufacturing method capable of minimizing an adhesive force between the carrier substrate and the base and preventing the occurrence of defects caused by thermal disposition of the temporary adhesive layer.

That is, a display device according to embodiments may include a plate-like inorganic layer disposed on a rear surface of a base, thereby allowing a light emitting device or the like to be stably formed. Further, it may be possible to mechanically lift off a carrier substrate and a base during a display device manufacturing process and also minimize an adhesive force between the carrier substrate and the base.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a base;
   a light emitting device on a first surface of the base; and
   a plate-like inorganic layer on a second surface of the base, the plate-like inorganic layer including a first plate-like inorganic particle with a first size and a second plate-like inorganic particle with a second size different from the first size, wherein
   the plate-like inorganic layer includes a first plate-like inorganic layer directly on the second surface of the base and including the first plate-like inorganic particle, and a second plate-like inorganic layer directly on the first plate-like inorganic layer and including the second plate-like inorganic particle, and
   the first plate-like inorganic layer and the second plate-like inorganic layer each comprise a different graphene oxide particle from one another.

2. The display device as claimed in claim 1, wherein the first plate-like inorganic particle and the second plate-like inorganic particle are positioned in a same layer, the second size being greater than or equal to six times the first size.

3. The display device as claimed in claim 2, wherein the first size is less than or equal to 8.0 µm, and the second size ranges from 20.0 µm to 50.0 µm.

4. The display device as claimed in claim 1, wherein:
   the first plate-like inorganic particle is a first graphene oxide particle covalently-bonded to carbon atoms, hydrogen atoms, and oxygen atoms covalently-bonded to nitrogen atoms, and
   the second plate-like inorganic particle is a second graphene oxide particle covalently-bonded to carbon atoms, hydrogen atoms, and nitrogen atoms.

5. The display device as claimed in claim 4, wherein:
   the carbon atoms, hydrogen atoms, and oxygen atoms of the first plate-like inorganic particle form one or more of a hydroxyl group, a carboxyl group, and an epoxy group, and
   the carbon atoms, hydrogen atoms, and nitrogen atoms of the second plate-like inorganic particle form an amine group.

6. The display device as claimed in claim 4, wherein the first plate-like inorganic layer further includes carbon atoms, hydrogen atoms, and oxygen atoms covalently-bonded to a third graphene oxide particle, does not include nitrogen atoms covalently-bonded to the third graphene oxide particle, and has a third size different from the first size.

7. The display device as claimed in claim 6, wherein the second plate-like inorganic layer further includes carbon atoms, hydrogen atoms, and nitrogen atoms covalently-bonded to a fourth grapheme oxide particle, and has a fourth size different from the second size.

8. The display device as claimed in claim 7, wherein the third size is greater than or equal to six times the first size, and the second size is greater than or equal to six times the fourth size.

9. The display device as claimed in claim 1, wherein the plate-like inorganic layer further includes:
   a third plate-like inorganic layer directly on the second plate-like inorganic layer and including a third plate-like inorganic particle, the third plate-like inorganic particle being a same type as that of the first plate-like inorganic particle; and
   a fourth plate-like inorganic layer directly on the third plate-like inorganic layer and including a fourth plate-like inorganic particle, the fourth plate-like inorganic particle being a same type as that of the second plate-like inorganic particle.

10. The display device as claimed in claim 1, further comprising an adhesive layer directly on the plate-like inorganic layer,
   wherein the plate-like inorganic layer is only partially on the second surface of the base to partially expose the second surface of the base, and
   wherein the adhesive layer is in contact with the second surface of the base.

11. The display device as claimed in claim 10, further comprising:
   an encapsulation layer on the light emitting device and including one or more inorganic layers and one or more organic layers that are alternately stacked; and
   a functional sheet on the adhesive layer, the functional sheet including one or more of a shading sheet, a cushion sheet, and a metal sheet.

12. The display device as claimed in claim 11, wherein:
   a display region, where an image is displayed, and a non-display region, where an image is not displayed and that surrounds the display region, are defined in the display device, and
   the plate-like inorganic layer is positioned in the display region and the non-display region.

13. A display device, comprising:
   a base;
   a light emitting device on a first surface of the base; and
   a plate-like inorganic layer on a second surface of the base, the plate-like inorganic layer including a first plate-like inorganic layer and a second plate-like inorganic layer on the first plate-like inorganic layer, wherein
   the first plate-like inorganic layer includes a first graphene oxide particle covalently-bonded to carbon atoms, hydrogen atoms, and nitrogen atoms, and
   the second plate-like inorganic layer includes inorganic particles different than the first plate-like inorganic layer.

14. The display device as claimed in claim 13, wherein the second plate-like inorganic layer includes a second graphene oxide particle covalently bonded to carbon atoms, hydrogen atoms, and oxygen atoms and not covalently-bonded to nitrogen atoms.

15. The display device as claimed in claim 14, wherein the first graphene oxide particle and the second graphene oxide particle have a substantially same size.

16. The display device as claimed in claim 13, wherein
   the carbon atoms, hydrogen atoms, and nitrogen atoms are covalently-bonded to the first graphene oxide particle, and
   the second plate-like inorganic layer includes a plate-like silicate particle.

* * * * *